US012772637B2

(12) United States Patent
Li

(10) Patent No.: US 12,772,637 B2

(45) Date of Patent: Oct. 20, 2026

(54) DISPLAY PANEL AND DISPLAY DEVICE WITH AUXILIARY LINE SEGMENTS

(71) Applicant: WUHAN TIANMA MICROELECTRONICS CO., LTD., Wuhan (CN)

(72) Inventor: Fei Li, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 475 days.

(21) Appl. No.: 18/466,853

(22) Filed: Sep. 14, 2023

(65) Prior Publication Data

US 2024/0006574 A1 Jan. 4, 2024

(30) Foreign Application Priority Data

Apr. 25, 2023 (CN) ......................... 202310493165.6

(51) Int. Cl.

| | |
|---|---|
| ***H10H 20/857*** | (2025.01) |
| ***G09G 3/32*** | (2016.01) |
| ***H10D 86/40*** | (2025.01) |
| ***H10D 86/60*** | (2025.01) |
| ***H10W 90/00*** | (2026.01) |

(52) U.S. Cl.

CPC ............ *H10H 20/857* (2025.01); *G09G 3/32* (2013.01); *H10D 86/441* (2025.01); *H10D 86/60* (2025.01); *H10W 90/00* (2026.01); *G09G 2320/0233* (2013.01); *G09G 2330/021* (2013.01)

(58) Field of Classification Search

None

See application file for complete search history.

(56) References Cited

U.S. PATENT DOCUMENTS

| | | | | |
|---|---|---|---|---|
| 2020/0176545 | A1* | 6/2020 | Choi | G09G 3/3275 |
| 2020/0411611 | A1* | 12/2020 | Liu | H10K 59/131 |
| 2021/0193778 | A1 | 6/2021 | Wang et al. | |
| 2021/0257438 | A1* | 8/2021 | Cho | H10K 59/88 |
| 2022/0278183 | A1* | 9/2022 | Wang | H10K 59/1213 |
| 2025/0316225 | A1* | 10/2025 | Guo | H10D 86/441 |

FOREIGN PATENT DOCUMENTS

| | | | |
|---|---|---|---|
| CN | 110992880 | A | 4/2020 |
| CN | 211265478 | U | 8/2020 |
| CN | 113345934 | A | 9/2021 |
| CN | 114937686 | A | 8/2022 |

* cited by examiner

*Primary Examiner* — Sue A Purvis

*Assistant Examiner* — Seyon Ali-Simah Punchbeddell

(74) *Attorney, Agent, or Firm* — KILPATRICK TOWNSEND & STOCKTON LLP

(57) ABSTRACT

A display panel and a display device are provided. In the display panel, a first electrode of a first transistor is electrically connected to a first signal line, a second electrode of the first transistor is electrically connected to a first electrode of a second transistor through a first connecting portion, a second electrode of the second transistor is electrically connected to a light-emitting element, and the first connecting portion is disposed on one side, away from a substrate, of an active layer, which facilitates reducing a layout space of sub-pixels, to facilitate adaptation to the demands for displaying in high resolution and high definition.

19 Claims, 44 Drawing Sheets

DISPLAY PANEL AND DISPLAY DEVICE WITH AUXILIARY LINE SEGMENTS

CROSS REFERENCE OF RELATED APPLICATION

The present application claims priority to Chinese Patent Application No. 202310493165.6, titled "DISPLAY PANEL AND DISPLAY DEVICE", filed on Apr. 25, 2023 with the China National Intellectual Property Administration, which is incorporated herein by reference in its entirety.

FIELD

The present application relates to the field of display technology, and in particular to a display panel and a display device.

BACKGROUND

With the continuous development of display technology, the demands for high-resolution and high-definition display panels are becoming more and more urgent, which requires an increased pixel density of the display panels. However, the layout space of pixels in the display panels is becoming smaller and smaller. Therefore, how to provide a new display panel design to reduce the layout space of pixels and to be adapted to the demands for displaying in high resolution and high definition has attracted the attention of those skilled in the art.

SUMMARY

In order to solve the above problem, a display panel and a display device are provided according to embodiments of the present disclosure, to provide a new display panel design to reduce the layout space of pixels, and to be adapted to the demands for displaying in high resolution and high definition.

In order to achieve the above object, the following solutions are provided according to the embodiments of the present disclosure.

A display panel includes:

a substrate;

an active layer, disposed on one side of the substrate; and multiple sub-pixels, multiple first scanning lines and multiple first signal lines, each of the multiple first scanning lines extending along a first direction, each of the multiple first signal lines extending along a second direction, and the first direction and the second direction intersecting with each other;

where each of the multiple sub-pixels includes a pixel circuit and a light emitting element, the pixel circuit comprises a first transistor and a second transistor, a gate of the first transistor is electrically connected to a corresponding first scanning line, a first electrode of the first transistor is electrically connected to a corresponding first signal line, a second electrode of the first transistor is electrically connected to a first electrode of the second transistor through a first connecting portion, and a second electrode of the second transistor is electrically connected to the light emitting element; and where the first connecting portion is disposed on one side of the active layer away from the substrate.

A display device includes the aforementioned display panel.

BRIEF DESCRIPTION OF THE DRAWINGS

In order to more clearly illustrate the embodiments of the present disclosure, the accompanying drawings used in the description of the embodiments will be briefly described hereinafter, and it is apparent that the accompanying drawings in the following description are only some of the embodiments of the present disclosures.

DETAILED DESCRIPTION OF THE EMBODIMENTS

The solutions in the embodiments of the present disclosure will be described clearly and completely hereinafter in conjunction with the accompanying drawings in the embodiments of the present disclosure. It is apparent that the described embodiments are only a part of the embodiments of the present disclosure and not all of the embodiments. Based on the embodiments of the present disclosure.

Various details are set forth in the following description to facilitate a full understanding of the present disclosure. However, the present disclosure may be implemented in other ways different from those described herein. Similar promotion without departing from the connotation of the present disclosure. Therefore, the present disclosure is not limited to the embodiments disclosed below.

The present disclosure is described in detail in conjunction with schematic diagrams. For ease of illustration, when the embodiments of the present disclosure are described in detail, a sectional view showing a device structure is partially enlarged without being shown according to a general scale. The schematic diagrams are only examples and are not intended to limit the protection scope of the present disclosure. In addition, three-dimensional spatial sizes of a length, a width and a depth should be included in an actual production.

Figure 1:
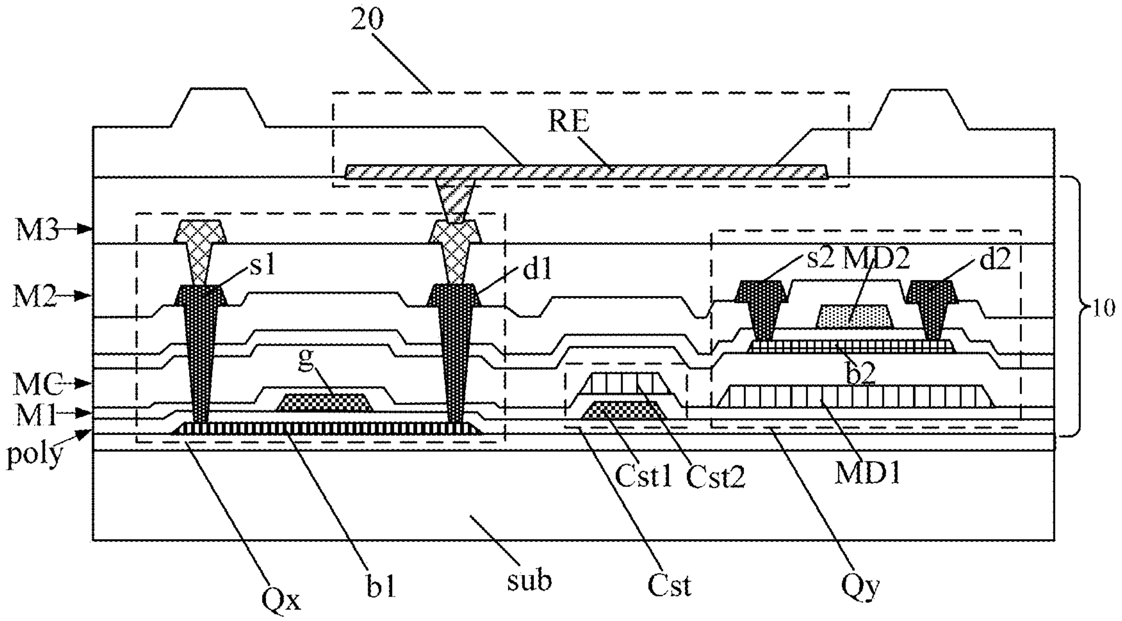
FIG. 1 is a schematic diagram showing a sectional structure of a display panel according to an embodiment of the present disclosure.

FIG. 1 illustrates a schematic diagram showing a sectional structure of a display panel according to an embodiment of the present disclosure. As shown in FIG. 1, the display panel includes:

a substrate sub;

an active layer poly, disposed on one side of the substrate sub; and multiple layers of metal layer, disposed on one side of the active layer poly away from the substrate sub, the multiple layers of metal layer may include a metal layer M1, a metal layer MC, a metal layer M2, a metal layer M3, and a metal layer RE disposed sequentially in a direction away from the substrate sub, where the different metal layers are separated from each other by an insulating layer.

Figure 2:
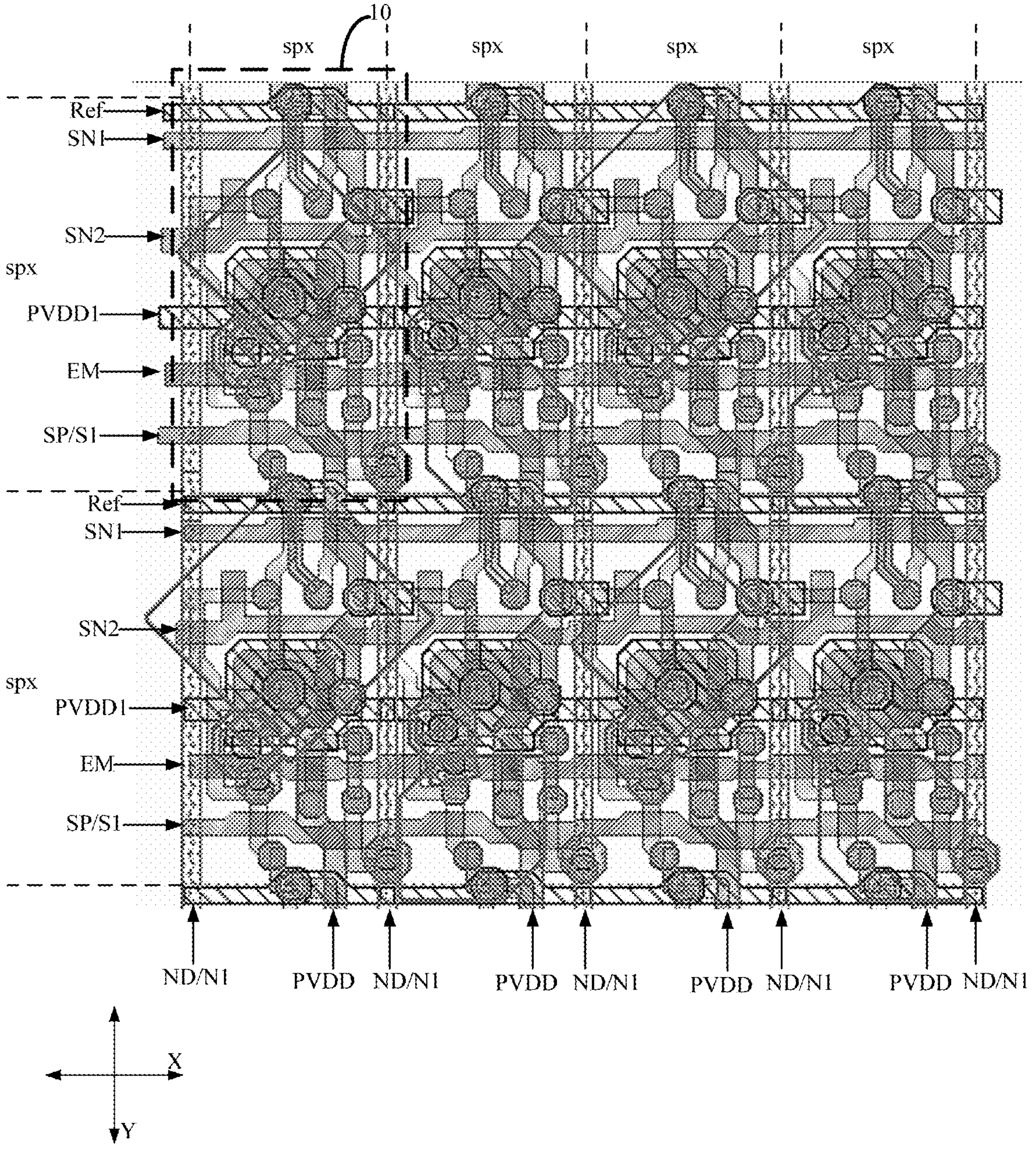
FIG. 2 is a schematic structural diagram showing a partial layout of a display panel according to an embodiment of the present disclosure.
Figure 3:
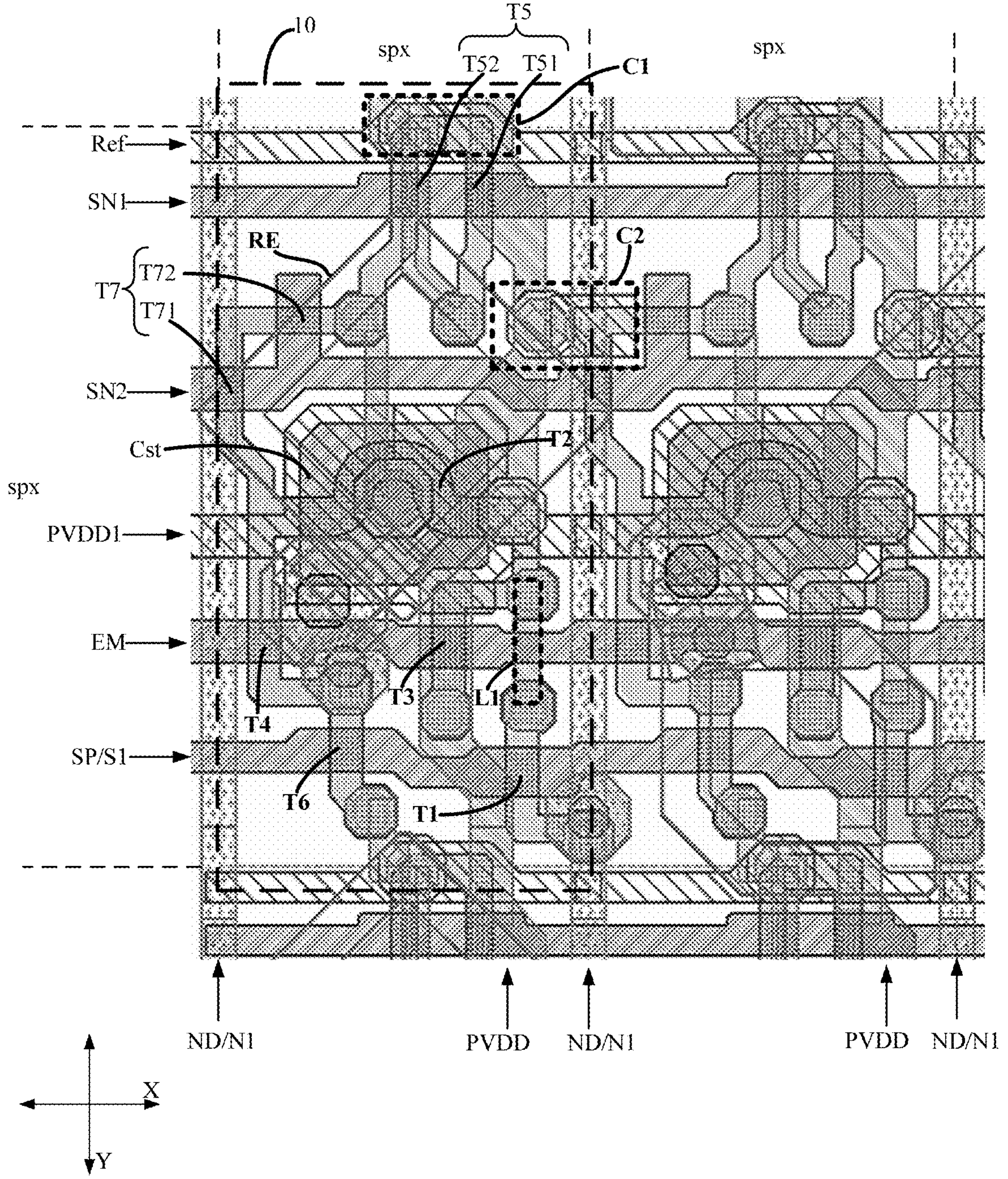
FIG. 3 is a partially enlarged schematic diagram of the display panel in FIG. 2.

FIG. 2 illustrates a schematic diagram showing a partial layout of a display panel according to an embodiment of the present disclosure, and FIG. 3 further illustrates a partially enlarged schematic diagram of the display panel in FIG. 2. As shown in FIGS. 2 and 3, the display panel includes multiple sub-pixels spx, multiple first scanning lines S1, and multiple first signal lines N1. Each of the first scanning lines S1 extends along a first direction X, each of the first signal lines N1 extends along a second direction Y, and the first direction X and the second direction Y intersect with each other.

As shown in FIG. 1, each of the sub-pixels spx includes a pixel circuit 10 and a light-emitting element 20, and the pixel circuit 10 is configured to drive the light-emitting element 20 to emit light.

As shown in FIG. 3, the pixel circuit 10 includes a first transistor T1 and a second transistor T2, a gate of the first transistor T1 is electrically connected to the first scanning line S1, a first electrode of the first transistor T1 is electrically connected to the first signal line N1, a second electrode of the first transistor T1 is electrically connected to a first electrode of the second transistor T2 through a first connecting portion L1, and a second electrode of the second transistor T2 is electrically connected to the light emitting element 20.

The first connecting portion L1 is disposed on one side of the active layer poly away from the substrate sub.

In the display panel according to the embodiments of the present disclosure, the first electrode of the first transistor is electrically connected to the first signal line, the second electrode of the first transistor is electrically connected to the first electrode of the second transistor through the first connecting portion, the second electrode of the second transistor is electrically connected to the light emitting element, and the first connecting portion is disposed on one side of the active layer away from the substrate, a signal of the first signal line is transmitted to the first electrode of the second transistor through the first electrode of the first transistor, a channel region of the first transistor, the second electrode of the first transistor, and the first connecting portion, that is, the second electrode of the first transistor and the first electrode of the second transistor can be electrically connected to each other through the first connecting portion which is disposed in a different layer from the active layer, which facilitates reducing the layout space of sub-pixels, to facilitate adaptation to the demands for displaying in high resolution and high definition.

It should be noted that the second electrode of the second transistor T2 being electrically connected to the light-emitting element 20 includes the second electrode of the second transistor T2 being directly electrically connected to the light-emitting element 20, or the second electrode of the second transistor T2 being indirectly electrically connected to the light-emitting element 20. The second electrode of the second transistor T2 being indirectly electrically connected to the light-emitting element 20 includes the second electrode of the second transistor T2 being electrically connected to the light-emitting element 20 through other transistors or switches.

It should be further noted that with reference to FIG. 2, which illustrates eight sub-pixels spx, eight pixel circuits 10 of the eight sub-pixels spx form a matrix arranged in two rows and four columns along a first direction X and a second direction Y In order to clearly distinguish different pixel circuit regions, in FIG. 2, a horizontal dashed line and a vertical dashed line are used to indicate a boundary on adjacent pixel circuit regions in the first direction X and the second direction Y It is to be understood that the boundary is only for ease of explanation and illustration, and is not a limitation to the present disclosure.

Figure 4A:
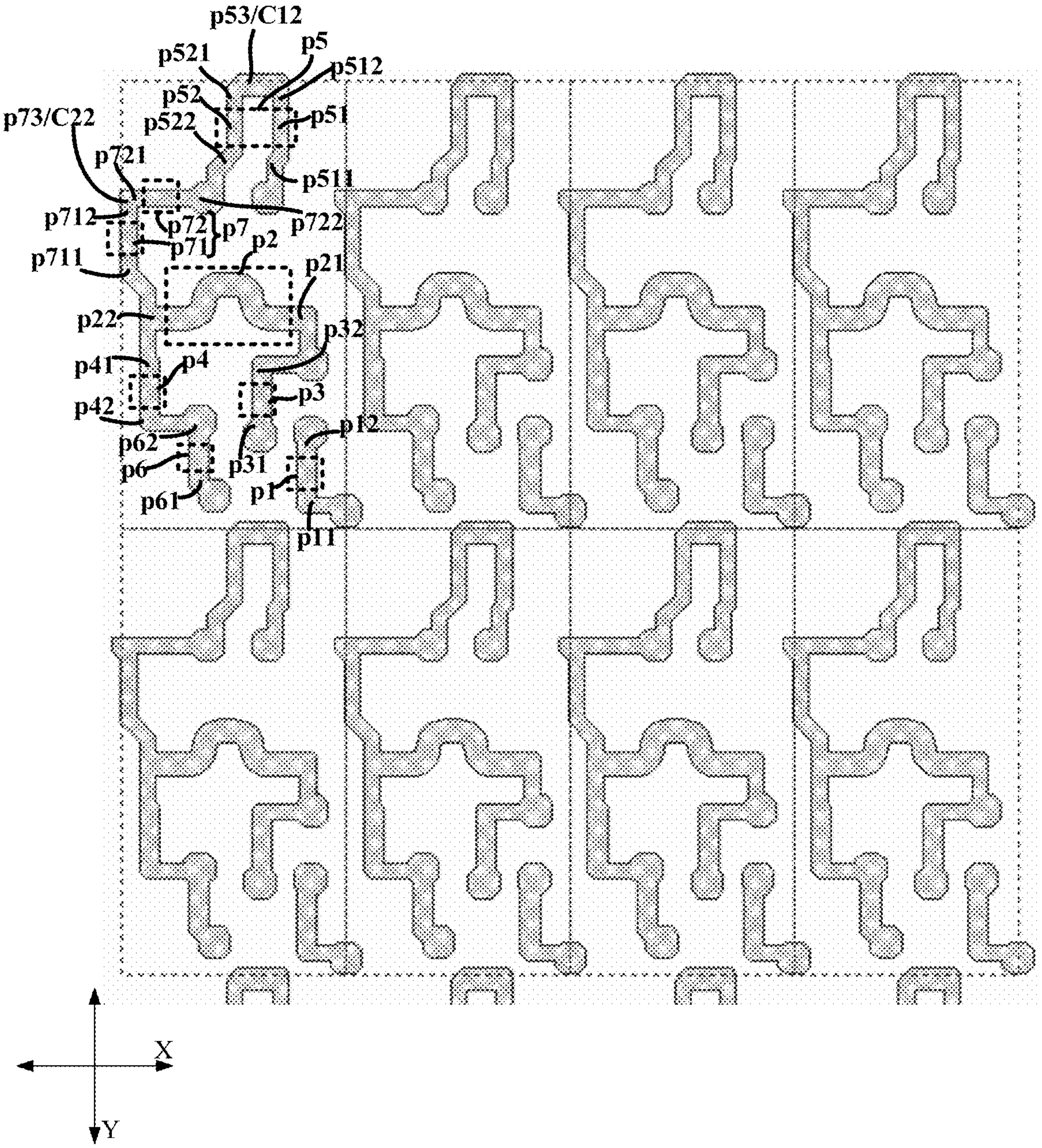
FIG. 4A is a schematic diagram showing the layout structure of an active layer poly in FIG. 2.
Figure 4B:
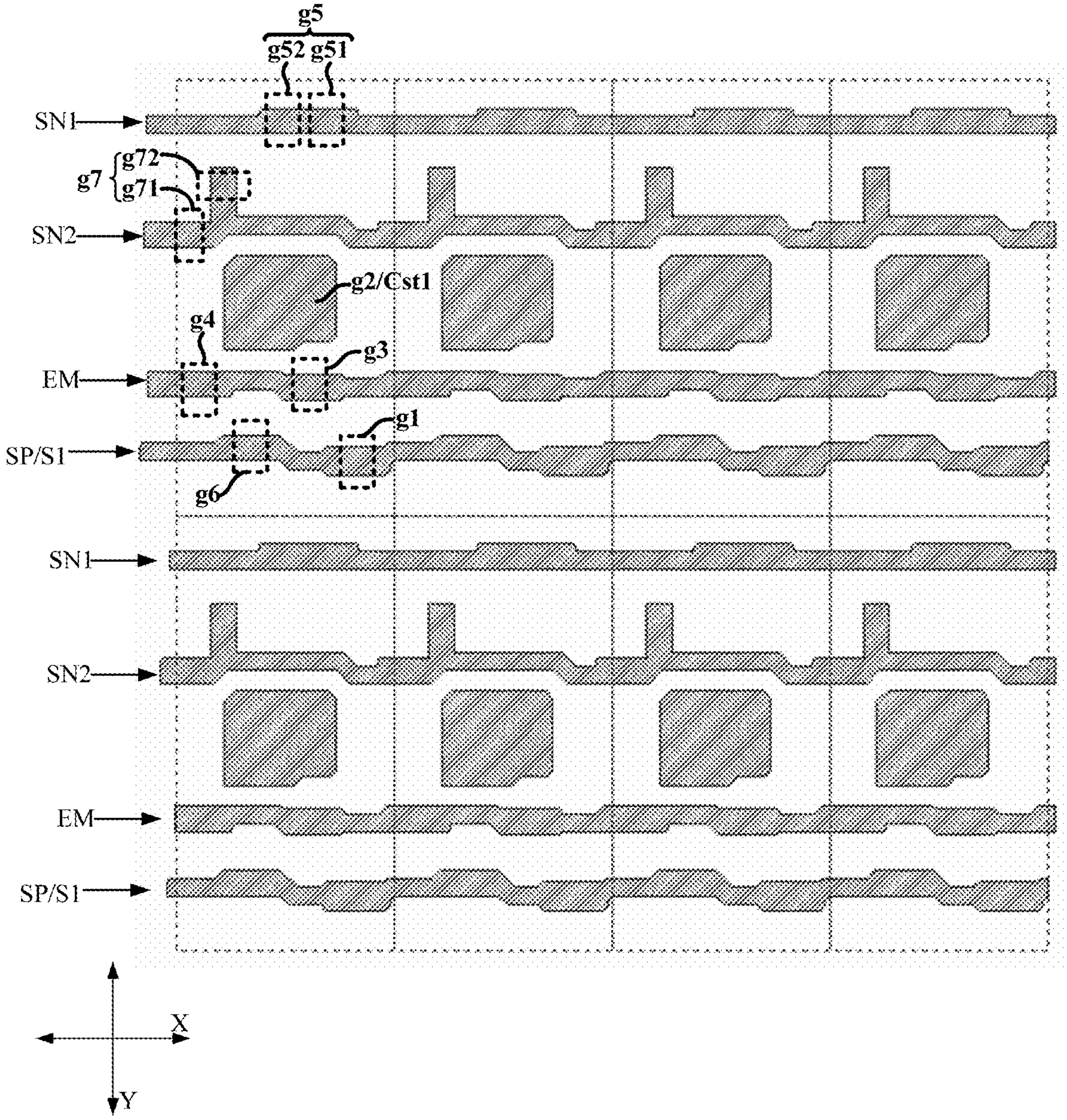
FIG. 4B is a schematic diagram showing the layout structure of a metal layer M1 in FIG. 2.
Figure 4C:
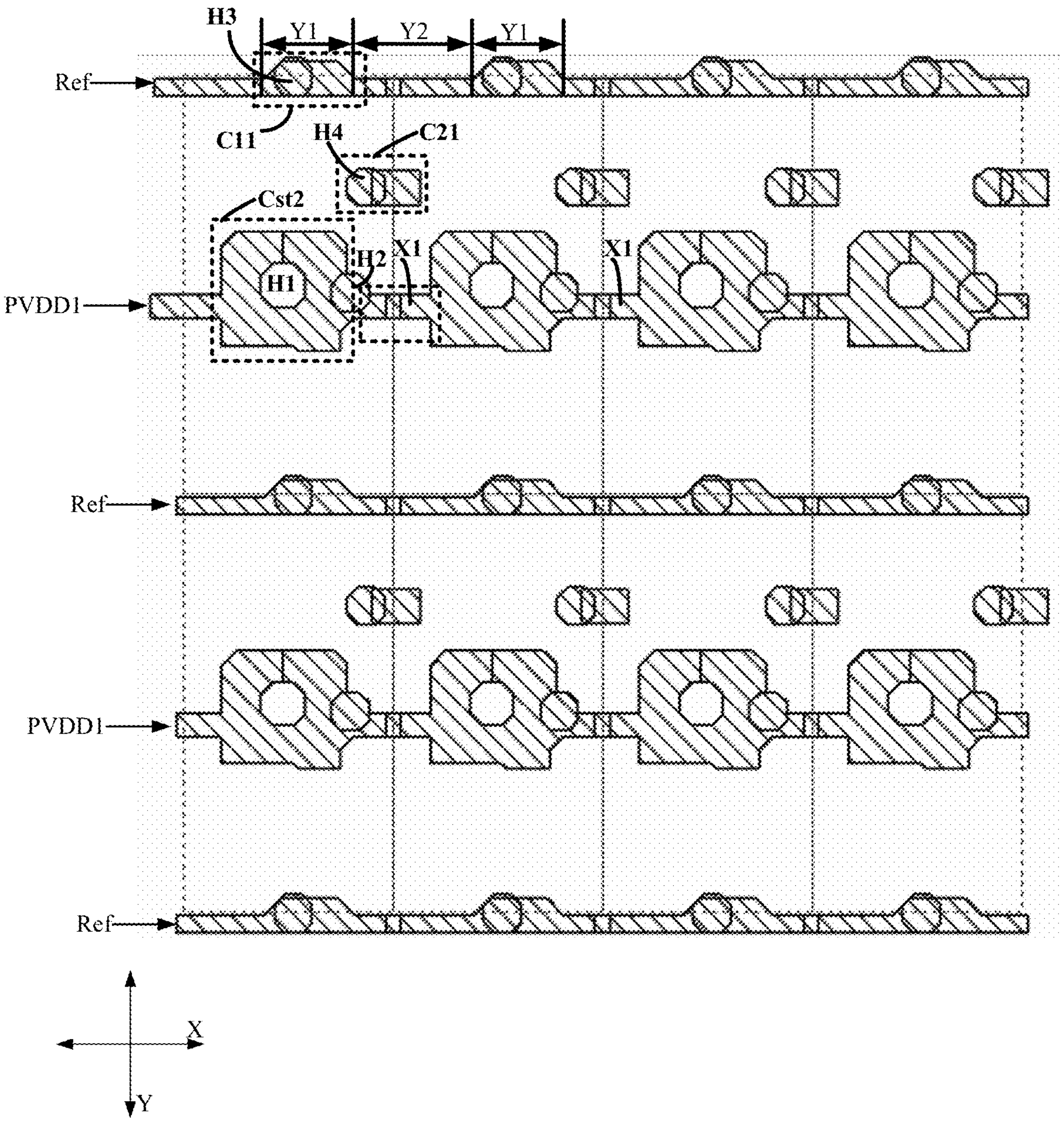
FIG. 4C is a schematic diagram showing the layout structure of a metal layer MC in FIG. 2.
Figure 4D:
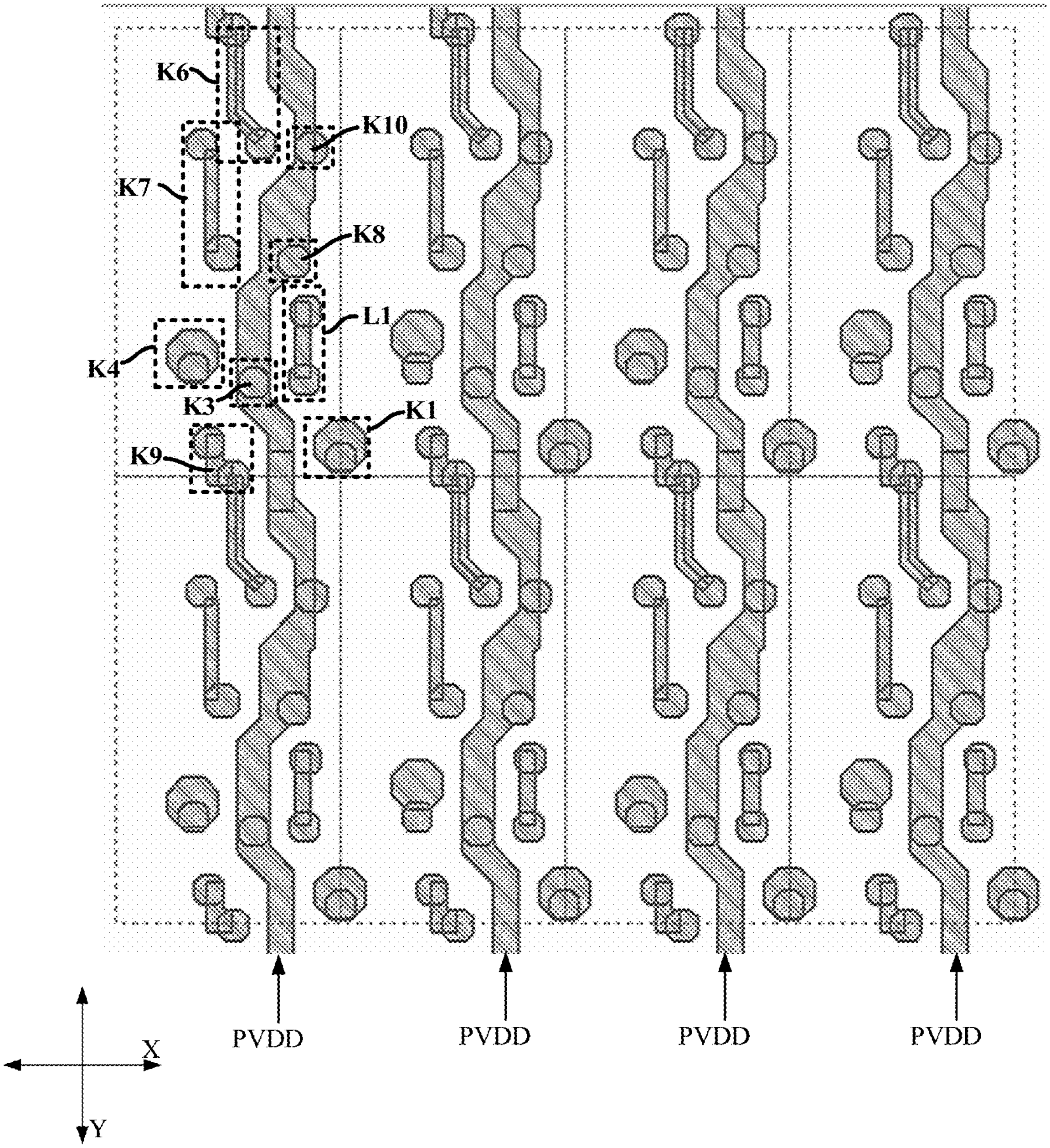
FIG. 4D is a schematic diagram showing the layout structure of a metal layer M2 in FIG. 2.
Figure 4E:
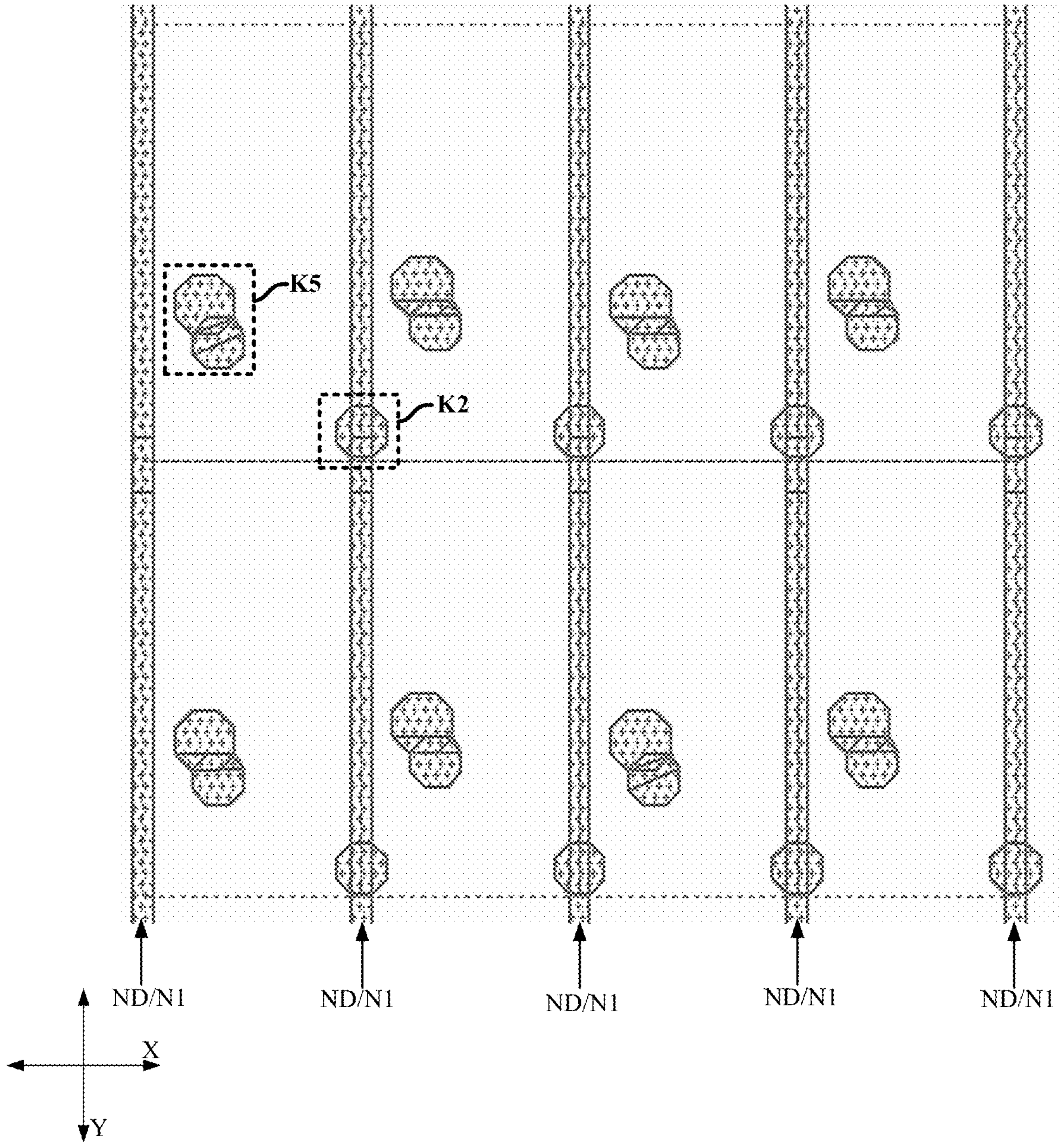
FIG. 4E is a schematic diagram showing the layout structure of a metal layer M3 in FIG. 2.
Figure 4F:
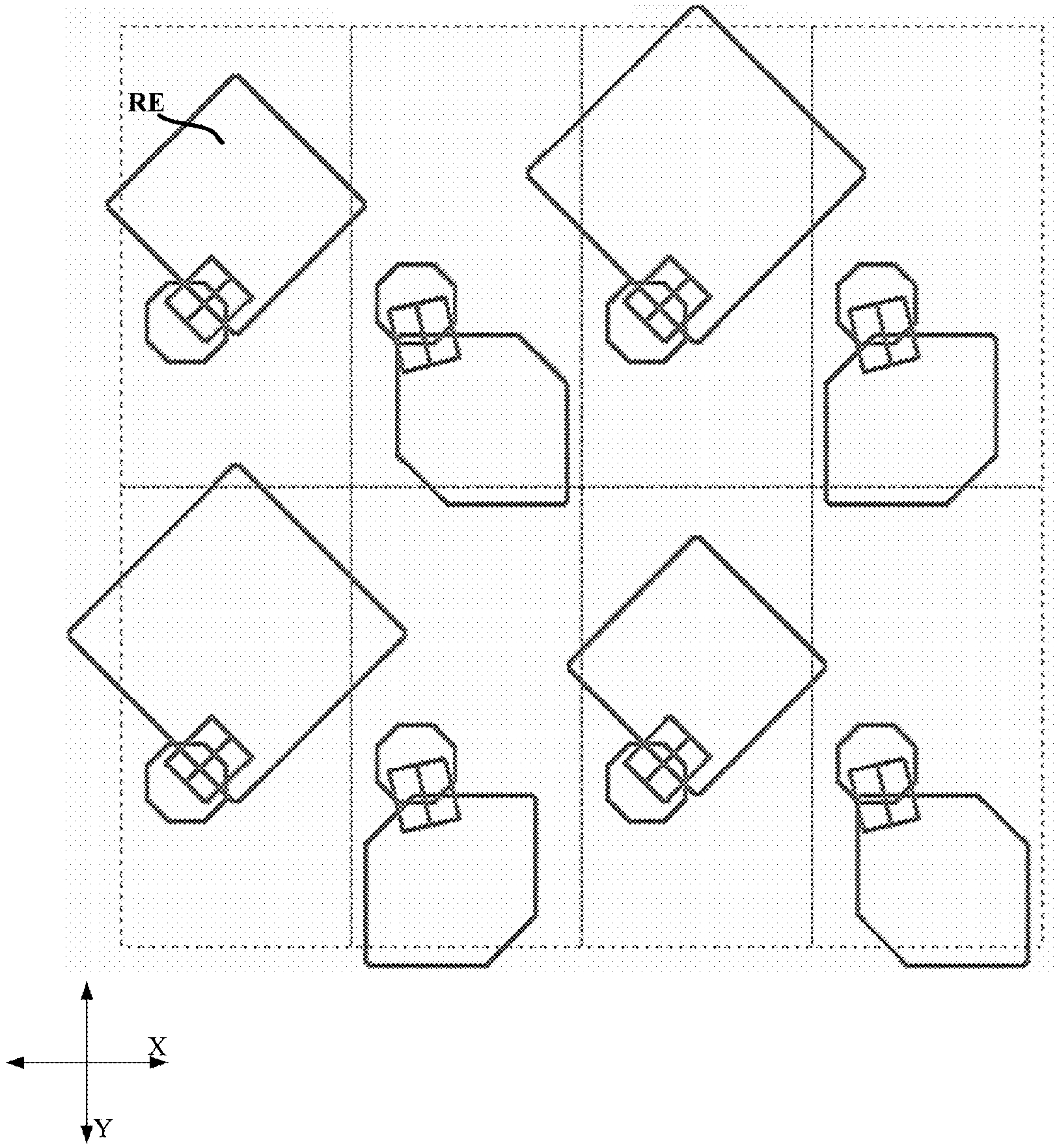
FIG. 4F is a schematic diagram showing the layout structure of a metal layer RE in FIG. 2.

FIG. 4A to FIG. 4F are schematic diagrams showing the layout structures of film layers in FIG. 2, respectively. FIG. 4A is a schematic diagram showing the layout structure of the active layer poly, FIG. 4B is a schematic diagram showing the layout structure of the metal layer M1, with the first scanning line S1 being disposed in the metal layer M1, FIG. 4C is a schematic diagram showing the layout structure of the metal layer MC, FIG. 4D is a schematic diagram showing the layout structure of the metal layer M2, with the first connecting portion L1 being disposed in the in metal layer M2, FIG. 4E is a schematic diagram showing the layout structure of the metal layer M3, with the first signal line N1 being disposed in the metal layer M3, and FIG. 4F is a schematic diagram showing the layout structure of the metal layer RE. Referring to FIG. 1, the active layer poly, the metal layer M1, the metal layer MC, the metal layer M2, the metal layer M3, and the metal layer RE are arranged in a direction away from the substrate sub.

As shown in FIGS. 3, 4A, and 4B, the active layer poly includes a channel region p1 of the first transistor T1. The channel region p1 of the first transistor T1 is at least partially overlapped with the first scanning line S1 in a direction perpendicular to a plane in which the substrate sub is located (in one embodiment, the channel region p1 of the first transistor T1 is a region, orthogonal to the first scanning line S1, of the active layer poly), and a region in which the first scanning line S1 is overlapped with the channel region p1 of the first transistor T1 is a gate g1 of the first transistor T1, and the gate g1 of the first transistor T1 is electrically connected to the first scanning line S1.

As shown in FIG. 3, FIG. 4A, FIG. 4D, and FIG. 4E, the first transistor T1 includes a channel region p1 disposed in the active layer poly, and a first electrode p11 and a second electrode p12 connected to the channel region p1, and the first electrode p11 of the first transistor T1 is electrically connected to the first signal line N1 through a connecting structure K1 disposed in the metal layer M2, and a connecting structure K2 disposed in the metal layer M3, so that the first transistor T1 is electrically connected to the first signal line N1.

As shown in FIGS. 3, 4A and 4D, the second electrode p12 of the first transistor T1 is electrically connected to a first electrode p21 of the second transistor T2 through the first connecting portion L1 disposed in the metal layer M2.

As shown in FIGS. 3, 4A and 4B, the active layer poly includes a channel region p2 of the second transistor T2, a gate g2 of the second transistor T2 is disposed in the metal layer M1, and the gate g2 of the second transistor T2 is at least partially overlapped with the channel region p2 of the second transistor T2 in the direction perpendicular to a plane in which the substrate sub is located.

As shown in FIGS. 3, 4A, and 4D, the second transistor T2 includes a channel region p2 disposed in the active layer poly, and a first electrode p21 and a second electrode p22 connected to the channel region p2. The first electrode p21 of the second transistor T2 is electrically connected to the second electrode p12 of the first transistor T1 through the first connecting portion L1 disposed in the metal layer M2, and the second electrode p22 of the second transistor T2 is electrically connected to the light emitting element 20.

It should be noted that in the present disclosure, for the sake of convenience of description, the portion, disposed in the active layer poly, of each transistor are divided into regions, such as the first electrode p11, the second electrode p12, the first electrode p21, the second electrode p22, or the like, but not as a limitation to the specific regions. Since the second electrode p12 of the first transistor T1 and the first electrode p21 of the second transistor T2 are not electrically connected through a transistor, but are electrically connected through the first connecting portion L1, the second electrode p12 of the first transistor T1 and the first electrode p21 of the second transistor T2 correspond to the same node and have the same potential. The reason why different designations and labeling are given is only for the purpose of better explaining and illustrating the embodiments of the present disclosure.

As can be seen, in the display panel according to the embodiment of the present disclosure, since the first electrode p11 of the first transistor T1 is electrically connected to the first signal line N1, the second electrode p12 of the first transistor T1 is electrically connected to the first electrode p21 of the second transistor T2 through the first connecting portion L1, the second electrode p22 of the second transistor T2 is electrically connected to the light-emitting element 20, and the first connecting portion L1 is disposed at one side of the active layer poly away from the substrate sub, so that signals of the first signal line N1 can be transmitted through the first connecting portion L1 disposed between the second electrode p12 of the first transistor T1 and the first electrode p21 of the second transistor T2 and disposed in a different layer from the active layer poly. For example, the first connecting portion L1 is disposed in a metal layer, and the metal layer does not form an unwanted transistor with the active layer poly, which facilitates reducing the layout space of the sub-pixels, to facilitate adaptation to the demands for displaying in high resolution and high definition.

It should be emphasized that in FIGS. 2, 3, and 4D, the first connecting portion L1 being disposed in the metal layer M2 is only illustrated as an example, but which metal layer at one side, away from the substrate sub, of the active layer poly the first connecting portion L1 is specifically disposed in is not limited in the present disclosure. For example, the first connecting portion L1 may also be disposed in the metal layer M1, the metal layer MC, or the metal layer M3. In a case that the display panel further includes other metal film layers, the first connecting portion L1 may be disposed in other metal layers, which are not exhaustive herein, as long as the first connecting portion L1 is not short-circuited with the other metal layers.

Figure 5:
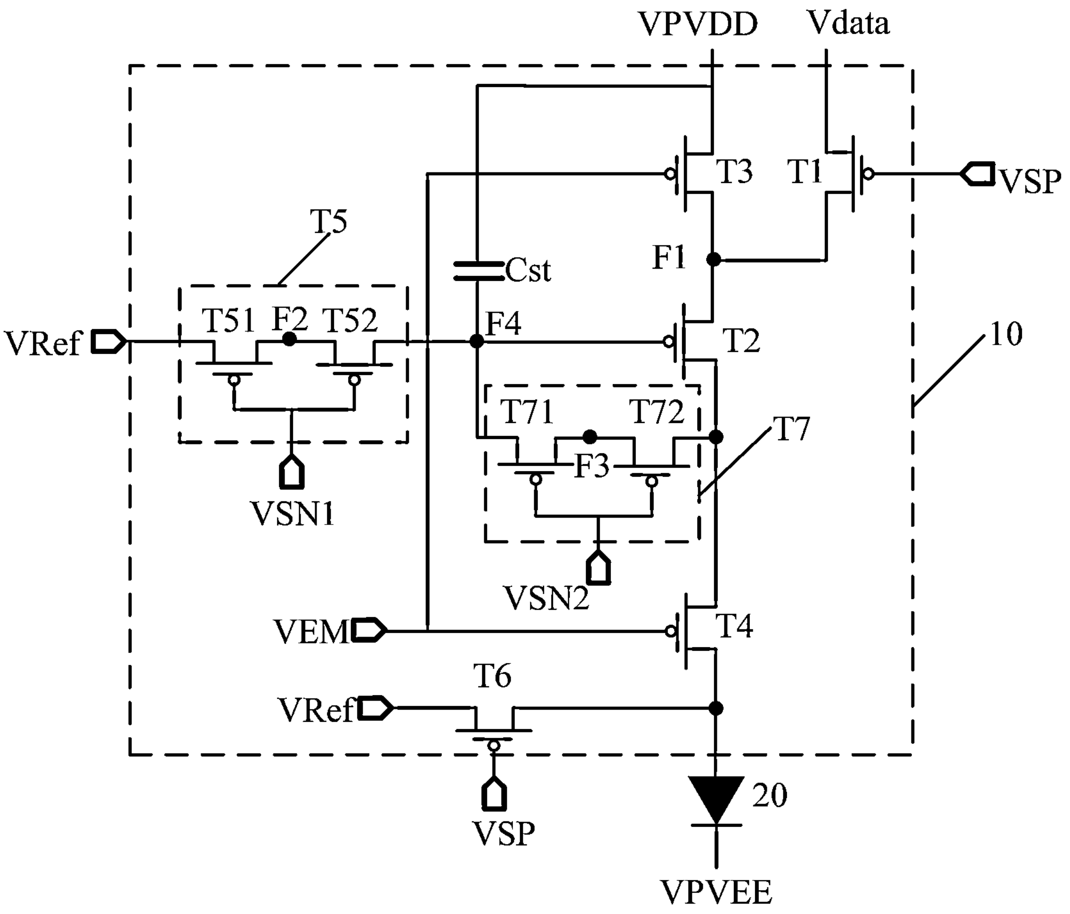
FIG. 5 is a schematic structural diagram of a pixel circuit according to an embodiment of the present disclosure.

For a clearer understanding of the present disclosure, FIG. 5 illustrates a schematic structural diagram of a pixel circuit 10 in a display panel according to an embodiment of the present disclosure. As shown in FIG. 5, the pixel circuit 10 includes a data writing transistor T1, a driving transistor T2, a first light-emitting control transistor T3, a second light-emitting control transistor T4, a gate initialization transistor T5, an anode initialization transistor T6, a compensation transistor T7, and a storage capacitor Cst. In order to drive the light-emitting element 20 to emit light, as shown in FIGS. 3 and 5, the pixel circuit 10 needs to receive a scanning signal VSP provided by a scanning line SP, a scanning signal VSN1 provided by a scanning line SN1, a scanning signal VSN2 provided by a scanning line SN2, a light-emitting control signal VEM provided by a light-emitting control line EM, a data signal Vdata provided by a data line ND, a reference signal VRef provided by a reference signal line Ref, and an anode supply voltage signal VPVDD provided by an anode supply voltage line PVDD. The specific connection of the transistors and the inputting positions of the signals are shown in FIG. 5, and will not be repeated here.

Each of the transistors in the pixel circuit 10 may be a Low Temperature Polycrystalline Silicon (LTPS) thin film transistor Qx. As shown in FIG. 1, Qx includes an active layer b1, a gate g, a source electrode s1, and a drain electrode d1. In one embodiment, each of the transistors may be an Indium Gallium Zinc Oxide (IGZO) thin film transistor Qy. As shown in FIG. 1, Qy includes an active layer b2, a double gate (including a bottom gate MD1 and a top gate MD2), a source electrode s2, and a drain electrode d2, the capacitor Cst includes a first plate Cst1 and a second plate Cst2, and the light-emitting element 20 includes an anode RE, an organic light-emitting layer (not shown), and a cathode (not shown).

It is to be understood that in actual application, the implementation of the pixel circuit 10 may be selected according to requirements and is not limited to a 7T1C pixel circuit shown in FIG. 5.

Exemplarily, each of the above thin film transistors may be provided as P-type transistors, or, In one embodiment, each of the above thin film transistors may be provided as N-type transistors, and the present disclosure is not limited thereto.

The operating process of the above 7T1C pixel circuit 10 is explained hereinafter, using as an example the situation that the Q1 to Q7 thin-film transistors in FIG. 5 are all P-type transistors and are conductive at a low-level signal.

Figure 6:
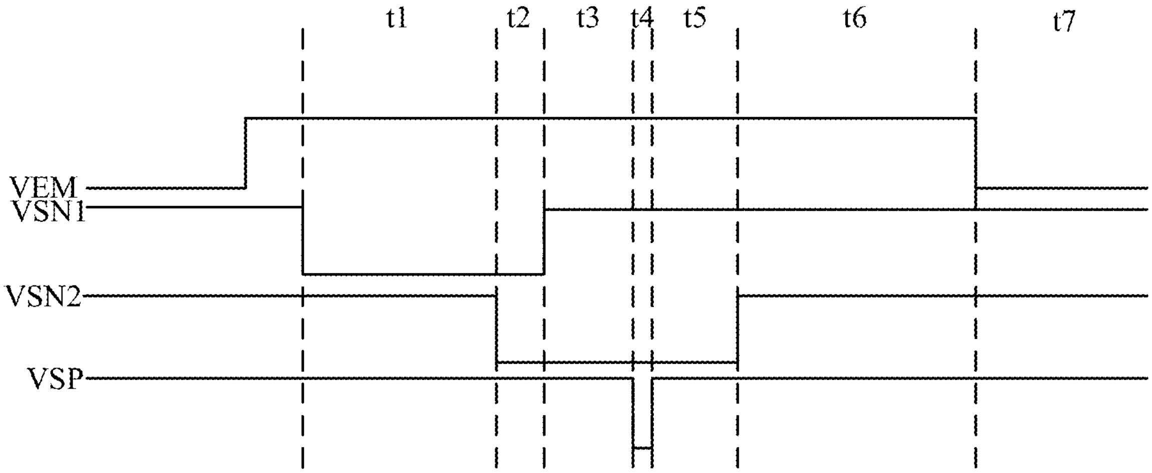
FIG. 6 is a schematic diagram of a timing sequence corresponding to a pixel circuit according to an embodiment of the present disclosure.

Referring to the timing diagram shown in FIG. 6, in a time period t1, the scanning signal VSN1 is at a low level, and the gate initialization transistor T5 is conductive, so that the reference signal VRef is transmitted to the gate of the driving transistor T2 through the conductive gate initialization transistor T5 to initialize the gate of the driving transistor T2.

In a time period t2, the scanning signals VSN1 and VSN2 each is at a low level, and the gate initialization transistor T5 and the compensation transistor T7 each is conductive. In this case, the reference signal VRef is transmitted to the gate of the driving transistor T2 through the conductive gate initialization transistor T5 to initialize the driving transistor T2, and may be transmitted to the second electrode of the driving transistor T2 through the conductive compensation transistor T7 to initialize the second electrode of the driving transistor T2. The first electrode of the compensation transistor T7 is electrically connected to a first node F1.

In a time period t3, the scanning signal VSN2 is still at a low level, the compensation transistor T7 is still conductive, and the driving transistor T2 is diode-connected through the conductive compensation transistor T7.

In a time period t4, the scanning signals VSN2 and VSP each is at a low level, the compensation transistor T7 is conductive, and the data writing transistor T1 is conductive, to form a path to the gate of the driving transistor T2 for the data signal Vdata, and the data signal Vdata is written to the gate of the driving transistor T2 (also referred to as the threshold grabbing of the driving transistor T3). In addition, in the t4 time period, the anode initialization transistor T6 is conductive in response to the low-level scanning signal VSP, and the reference signal VRef is transmitted to an anode of the light-emitting element 20 through the conductive anode initialization transistor T6 to initialize the anode of the light-emitting element 20.

In a time period t5, the scanning signal VSN2 is still at a low level, the compensation transistor T7 is still conductive, and the driving transistor T2 is diode-connected through the conductive compensation transistor T7.

In a time period t6, each scanning signal is at a high level.

In a time period t7, the light-emitting control signal VEM is at a low level, the first light-emitting control transistor T3 and the second light-emitting control transistor T4 each is conductive, and the driving transistor T2 drives the light-emitting element 20 to emit light.

As can be seen, in one embodiment, as shown in FIGS. 3, 4B, and 4E, the first scanning line S1 may be the scanning line SP for providing the scanning signal VSP, and the first signal line N1 may be the data line ND for providing the data signal Vdata. In this case, as shown in FIG. 5, the first transistor T1 may be the data writing transistor T1, and the second transistor T2 may be the driving transistor T2. The data signal Vdata on the data line ND is transmitted to the first electrode of the second transistor T2 (i.e., the driving transistor T2) through the first electrode and the second electrode of the first transistor T1 (i.e., the data writing transistor T1), and the first connecting portion L1.

Figure 7:
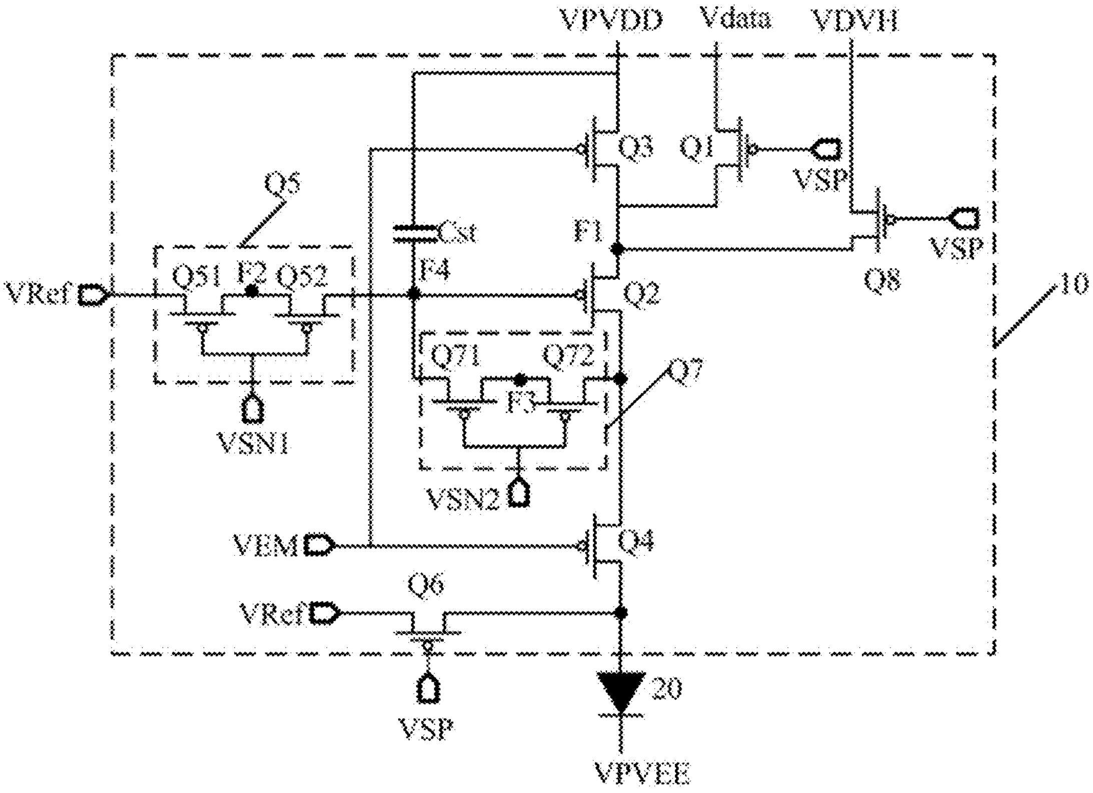
FIG. 7 is a schematic structural diagram of a pixel circuit according to another embodiment of the present disclosure.

FIG. 7 is a schematic structural diagram of a pixel circuit 10 according to another embodiment of the present disclosure. As shown in FIG. 7, the pixel circuit 10 includes a data writing transistor Q1, a driving transistor Q2, a first light-emitting control transistor Q3, a second light-emitting control transistor Q4, a gate initialization transistor Q5, an anode initialization transistor Q6, a compensation transistor Q7, a bias transistor Q8, and a storage capacitor Cst, and the electrical connection of the transistors Q1 to Q7 and the storage capacitor Cst in the pixel circuit shown in FIG. 7 corresponds to the electrical connection of the transistors T1 to T7 and the storage capacitor Cst in the pixel circuit shown in FIG. 5. The difference from the pixel circuit shown in FIG. 5 is that the pixel circuit 10 shown in FIG. 7 further includes a bias transistor Q8, a gate of the bias transistor Q8 receives a scanning signal VSP, a first electrode of the bias transistor Q8 receives an initialization voltage signal VDVH, and a second electrode of the bias transistor Q8 is electrically connected to the first electrode (i.e. the first node F1) of the driving transistor Q2.

In actual operation, when the scanning signal VSP is an enabling level, the bias transistor T8 is conductive in response to the scanning signal VSP to bias the first electrode or the second electrode of the driving transistor T2, and to improve the brightness of a first frame and to avoid the brightness of the first frame being too low.

As can be seen, in one embodiment, the first scanning line S1 may be the scanning line SP for providing the scanning signal VSP, and the first signal line N1 may be the initialization voltage line for providing the initialization voltage signal VDVH. In this case, as shown in FIG. 7, the first transistor T1 may be the bias transistor Q8, and the second transistor T2 may be the driving transistor Q2. The initialization voltage signal VDVH on the initialization voltage line is transmitted to the first electrode of the second transistor T2 (i.e., the driving transistor Q2) through the first electrode and the second electrode of the first transistor T1 (i.e., the bias transistor Q8) and the first connecting portion L1.

It is to be understood that, referring to FIG. 7, the first electrode of the second transistor T2 (i.e., the driving transistor Q2) is set as the first node F1, and then any other transistor electrically connected to the first node F1 and writing a signal to the driving transistor Q2 through the first node F1 may be the first transistor T1. For example, the first transistor T1 may be the bias transistor Q8. In this case, the first signal line N1 may be the initialization voltage line for providing the initialization voltage signal VDVH; the first transistor T1 may be the data writing transistor Q1. In this case, the first signal line N1 may be the data line ND for providing the data signal Vdata; the first transistor T1 may be the first light-emitting control transistor Q3, in this case, the first signal line N1 may be the anode supply voltage signal VPVDD for providing the anode supply voltage signal VPVDD. Of course, the first transistor T1 may be other transistors that write a signal to the driving transistor Q2 through the first node F1, and the first signal line N1 is accordingly a signal line for writing the signal.

It should be noted that, as shown in FIG. 1, in a case that the first signal line N1 is the data line ND, the initialization voltage line, or the anode supply voltage line, the first signal line N1 may be disposed in the metal layer M3, in the metal layer M2, or in other optional metal layers of the display panel, depending on the situations, as long as the first signal line N1 is not shorted to other signal lines.

The first transistor T1 being the data writing transistor T1, the first signal line N1 being the data line ND for providing the data signal Vdata, the second transistor T2 being the driving transistor T2, and the first scanning line S1 being the scanning line SP for providing the scanning signal VSP are described hereinafter as an example.

In an embodiment of the present disclosure, as shown in FIGS. 2 to 3 and 4A to 4F, the display panel further includes: multiple light-emitting control lines EM extending along the first direction X; and multiple first supply voltage lines PVDD extending along the second direction Y.

The pixel circuit 10 further includes a third transistor T3 and a fourth transistor T4, a first electrode p31 of the third transistor T3 is electrically connected to the first supply voltage line PVDD, a second electrode p32 of the third transistor T3 is electrically connected to the first electrode p21 of the second transistor T2, a first electrode p41 of the fourth transistor T4 is electrically connected to the second electrode p22 of the second transistor T2, and a second electrode p42 of the fourth transistor T4 is electrically connected to the light-emitting element 20, and a gate g3 of the third transistor T3 and a gate g4 of the fourth transistor T4 each is electrically connected to the light-emitting control line EM.

The first connecting portion L1 is at least partially overlapped with the light-emitting control line EM in the direction perpendicular to a plane in which the substrate sub is located.

As shown in FIGS. 3 and 4B, the light-emitting control line EM may be disposed in the metal layer M1.

As shown in FIGS. 3 and 4D, the first supply voltage line PVDD may be disposed in the metal layer M2, but the present disclosure does not limit to this. In one embodiment, the first supply voltage line PVDD may be disposed in the metal layer M3 or the metal layer MC, or, In one embodiment, the first supply voltage line PVDD may be disposed in at least two of the metal layer M2, the metal layer M3, and the metal layer MC, which will not be described herein.

Referring to the pixel circuit 10 as shown in FIG. 5, the third transistor T3 may be a first light-emitting control transistor T3, the fourth transistor T4 may be a second light-emitting control transistor T4, and the gate of the third transistor T3 and the gate of the fourth transistor T4 each is electrically connected to the light-emitting control line EM to receive the light-emitting control signal VEM.

As shown in FIGS. 3, 4A, and 4B, the active layer poly includes a channel region p3 of the third transistor T3, and in the direction perpendicular to a plane in which the substrate sub is located, the channel region p3 of the third transistor T3 is at least partially overlapped with the light-emitting control line EM, and a region in which the light-emitting control line EM is overlapped with the channel region p3 of the third transistor T3 is the gate g3 of the third transistor T3, so that the gate g3 of the third transistor T3 is electrically connected to the light-emitting control line EM.

As shown in FIGS. 3, 4A, and 4D, the third transistor T3 includes a channel region p3 disposed in the active layer poly, and a first electrode p31 and a second electrode p32 connected to the channel region p3. The first electrode p31 of the third transistor T3 is electrically connected to the first supply voltage line PVDD through a connecting structure K3 disposed in the metal layer M2.

As shown in FIGS. 3 and 4A, the second electrode p32 of the third transistor T3 is directly electrically connected to the first electrode p21 of the second transistor T2 in the active layer poly (i.e., not indirectly electrically connected through other structures in a different layer from the active layer poly).

As shown in FIGS. 3, 4A, and 4B, the active layer poly includes a channel region p4 of the fourth transistor T4, in a direction perpendicular to a plane in which the substrate sub is located, the channel region p4 of the fourth transistor T4 is at least partially overlapped with the light-emitting control line EM, and a region in which the light-emitting control line EM is overlapped with the channel region p4 of the fourth transistor T4 is the gate g4 of the fourth transistor T4, and the gate g4 of the fourth transistor T4 is electrically connected to the light-emitting control line EM.

As shown in FIGS. 3 and 4A, the fourth transistor T4 includes the channel region p4 disposed in the active layer poly, and the first electrode p41 and the second electrode p42 connected to the channel region p4. The first electrode p41 of the fourth transistor T4 is directly electrically connected to the second electrode p22 of the second transistor T2 in the active layer poly.

As shown in FIGS. 3, 4A, and 4D to 4F, the second electrode p42 of the fourth transistor T4 is electrically connected to the anode RE of the light-emitting element 20 through a connecting structure K4 disposed in the metal layer M2, and a connecting structure K5 disposed in the metal layer M3.

As shown in FIG. 3, the first connecting portion L1 is partially overlapped with the light-emitting control line EM in a direction perpendicular to a plane in which the substrate sub is located. In other words, on the basis that the second electrode p12 of the first transistor T1 and the first electrode p21 of the second transistor T2 are connected through the first connecting portion L1, the light-emitting control line EM may be arranged to be overlapped with the first connecting portion L1 in the direction perpendicular to a plane in which the substrate sub is located, to save the layout space of the sub-pixels and facilitating adaptation to the demands for displaying in high resolution and high definition.

In an embodiment of the present disclosure, the light-emitting control line EM is disposed in a first metal layer, the first connecting portion L1 is disposed in a second metal layer, and the second metal layer is disposed on one side, away from the substrate sub, of the first metal layer.

It should be understood that the light-emitting control line EM is to be electrically connected to the gate of the third transistor T3 and the gate of the fourth transistor T4, i.e., the light-emitting control line EM is to be overlapped with the channel region p3 of the third transistor T3 and the channel region p4 of the fourth transistor T4 in the direction perpendicular to a plane in which the substrate sub is located. Therefore, the light-emitting control line EM should be disposed nearer to the active layer poly than the first connecting portion L1. That is, the first connecting portion L1 is disposed further from the active layer poly than the light-emitting control line EM.

In one embodiment, referring to FIG. 1, the light-emitting control line EM is disposed in the first metal layer, which may be the metal layer M1, and the first connecting portion L1 is disposed in the second metal layer, which may be the metal layer M2, or the metal layer M3, or any other optional metal layers of the display panel, which will not be described herein.

an embodiment of the present disclosure, as shown in FIGS. 2 to 3 and 4A to 4F, the display panel further includes: multiple second scanning lines SN1 and multiple reference voltage lines Ref, where each of the second scanning lines SN1 extends along the first direction X, and each of the reference voltage lines Ref extends along the first direction X.

The pixel circuit 10 further includes a fifth transistor T5, a gate g5 of the fifth transistor T5 is electrically connected to the second scanning line SN1, a first electrode p511 of the fifth transistor T5 is electrically connected to the reference voltage line Ref, and a second electrode p522 of the fifth transistor T5 is electrically connected to a gate of the second transistor T2.

The pixel circuit 10 further includes a sixth transistor T6, a gate g6 of the sixth transistor T6 is electrically connected to the first scanning line S1, a first electrode p61 of the sixth transistor T6 is electrically connected to the reference voltage line Ref, and a second electrode p62 of the sixth transistor T6 is electrically connected to the light emitting element 20.

As shown in FIGS. 3 and 4B, the second scanning line SN1 may be disposed in the metal layer M1.

As shown in FIGS. 3 and 4C, the reference voltage line Ref may be disposed in the metal layer MC, but the present disclosure is not limited thereto, and the reference voltage line Ref may be disposed in the metal layer M2 or in the metal layer M3, or in other optional metal layers, which will not be described herein.

Referring to the pixel circuit 10 shown in FIG. 5, the fifth transistor T5 may be the gate initialization transistor T5, and the sixth transistor T6 may be the anode initialization transistor T6, and the first electrode of the fifth transistor T5 and the first electrode of the sixth transistor T6 each is electrically connected to the reference voltage line Ref to receive the reference voltage signal VRef.

As shown in FIGS. 3, 4A, and 4B, the active layer poly includes a channel region p5 of the fifth transistor T5, and in the direction perpendicular to the plane where the substrate sub is located, the channel region p5 of the fifth transistor T5 is at least partially overlapped with the second scanning line SN1, and a region where the second scanning line SN1 is overlapped with the channel region p5 of the fifth transistor T5 is a gate g5 of the fifth transistor T5, and the gate g5 of the fifth transistor T5 is electrically connected to the second scanning line SN1.

As shown in FIGS. 3, 4A, and 4D, the fifth transistor T5 includes the channel region p5 disposed in the active layer poly, and the first electrode p511 and the second electrode p522 connected to the channel region p5. The first electrode p511 of the fifth transistor T5 is electrically connected to the reference voltage line Ref extending along the first direction X through a connecting structure K6 disposed in the metal layer M2.

As shown in FIGS. 3, 4A, 4B, and 4D, the second electrode p522 of the fifth transistor T5 is electrically connected to the gate g2 of the second transistor T2 disposed in the metal layer M1 through a connecting structure K7 disposed in the metal layer M2.

It should be noted that, as can be seen in combination with the pixel circuit shown in FIG. 5, and the layout structure shown in FIGS. 3, 4B, and 4C, the gate g2 of the second transistor T2 disposed in the metal layer M1 serves simultaneously as the first plate Cst1 of the storage capacitor Cst, the second plate Cst2 of the storage capacitor Cst is disposed in the metal layer MC, and a via hole H1 is provided in the interior of the second plate Cst2 of the storage capacitor Cst, and the connecting structure K7 disposed in the metal layer M2 can be electrically connected to the gate g2 of the second transistor T2 disposed in the metal layer M1 through the via hole H1.

In addition, as shown in FIGS. 3, 4C, and 4D, in a row of pixel circuits 10 arranged in the first direction X, second plates Cst2 of the storage capacitors Cst are connected with each other through a connecting line segment X1 disposed in the metal layer MC, and the second plates Cst2 of the storage capacitors Cst are electrically connected to the first supply voltage line PVDD through an internal connection point H2 and a connecting structure K8 disposed in the metal layer M2, so that auxiliary supply voltage lines PVDD1 disposed in the metal layer MC are formed by the second plates Cst2 of the storage capacitors Cst arranged in a row in the first direction X and the connecting line segments X1 interconnected with the second plates Cst2, and a grid structure is formed by the auxiliary supply voltage lines PVDD1 and the first supply voltage lines PVDD disposed in the metal layer M2, which facilitates reducing the voltage drop (IR Drop) on the first supply voltage line PVDD to achieve the object of improving the display uniformity of the display panel and reducing power consumption.

As shown in FIGS. 3, 4A, and 4B, the active layer poly includes a channel region p6 of the sixth transistor T6, and in the direction perpendicular to the plane where the substrate sub is located, the channel region p6 of the sixth transistor T6 is at least partially overlapped with the first scanning line S1, and a region in which the first scanning line S1 is overlapped with the channel region p6 of the sixth transistor T6 is a gate g6 of the sixth transistor T6, and the gate g6 of the sixth transistor T6 is electrically connected to the first scanning line S1.

As shown in FIGS. 3, 4A, and 4D, the sixth transistor T6 includes the channel region p6 disposed in the active layer poly, and a first electrode p61 and a second electrode p12 connected to the channel region p6. The first electrode p61 of the sixth transistor T6 is electrically connected to the reference voltage line Ref extending along the first direction X through a connecting structure K9 disposed in the metal layer M2.

As shown in FIGS. 3, 4A, and 4D to 4F, the second electrode p62 of the sixth transistor T6 is electrically connected to the anode RE of the light emitting element 20 through the connecting structure K4 disposed in the metal layer M2 and the connecting structure K5 disposed in the metal layer M3.

Referring to the pixel circuit 10 shown in FIG. 5, the gate initialization transistor T5 may be a double-gate transistor, i.e., the fifth transistor T5 may be a double-gate transistor. In an embodiment of the present disclosure, as shown in FIG. 3, the fifth transistor T5 may include a first sub-transistor T51 and a second sub-transistor T52. A first electrode of the first sub-transistor T51 is the first electrode of the fifth transistor T5, a second electrode of the first sub-transistor T51 is electrically connected to a first electrode of the second sub-transistor T52, and a second electrode of the second sub-transistor T52 is the second electrode of the fifth transistor T5.

As shown in FIG. 4A, the active layer poly includes a first sub-channel region p51, a second sub-channel region p52, and a first sub-connecting region p53. The first sub-channel region p51 and the second sub-channel region p52 are connected through the first sub-connecting region p53.

As shown in FIGS. 3, 4A and 4B, the first sub-channel region p51 is a channel region of the first sub-transistor T51, and in the direction perpendicular to a plane where the substrate sub is located, the first sub-channel region p51 is at least partially overlapped with the second scanning line SN1, and a region in which the second scanning line SN1 is overlapped with the first sub-channel region p51 is the gate g51 of the first sub-transistor T51, i.e., in the direction perpendicular to a plane in which the substrate sub is located, the first sub-channel region p51 is at least partially overlapped with the gate g51 of the first sub-transistor T51.

As shown in FIGS. 3, 4A and 4B, the second sub-channel region p52 is a channel region of the second sub-transistor T52, and in the direction perpendicular to a plane in which the substrate sub is located, the second sub-channel region p52 is at least partially overlapped with the second scanning line SN1, and a region in which the second scanning line SN1 is overlapped with the second sub-channel region p52 is the gate g52 of the second sub-transistor T51, i.e., in the direction perpendicular to a plane in which the substrate sub is located, the second sub-channel region p52 is at least partially overlapped with the gate g52 of the second sub-transistor T52.

As shown in FIG. 4A, the first sub-transistor T51 includes the first sub-channel region p51, and the first electrode p511 and the second electrode 522 connected to the first sub-channel region p51, and the second sub-transistor T52 includes the second sub-channel region p52, and the first electrode p521 and the second electrode p522 connected to the second sub-channel region p52. The first electrode p511 of the first sub-transistor T51 is the first electrode p511 of the fifth transistor T5, the second electrode p522 of the second sub-transistor T52 is the second electrode p522 of the fifth transistor T5, and the first sub-channel region p51 is electrically connected to the second sub-channel region p52 through the first sub-connecting region p53, and the second electrode p512 of the first sub-transistor T51 is electrically connected to the first electrode p521 of the second sub-transistor T52 through the first sub-connecting region p53.

Referring to the pixel circuit 10 shown in FIG. 5, the gate initialization transistor T5 has a second node F2 at which the second electrode of the first sub-transistor T51 and the first electrode of the second sub-transistor T52 are connected with each other. Correspondingly, as shown in FIGS. 3 and 4A, in the fifth transistor T5, the second electrode p512 of the first sub-transistor T51 and the first electrode p521 of the second sub-transistor T52 are electrically connected through the first sub-connecting region p53, i.e., the first sub-connecting region p53 corresponds to the second node F2.

In one embodiment, as shown in FIGS. 3, 4A and 4C, the first sub-connecting region p53 is at least partially overlapped with the reference voltage line Ref in the direction perpendicular to a plane in which the substrate sub is located.

Figure 8:
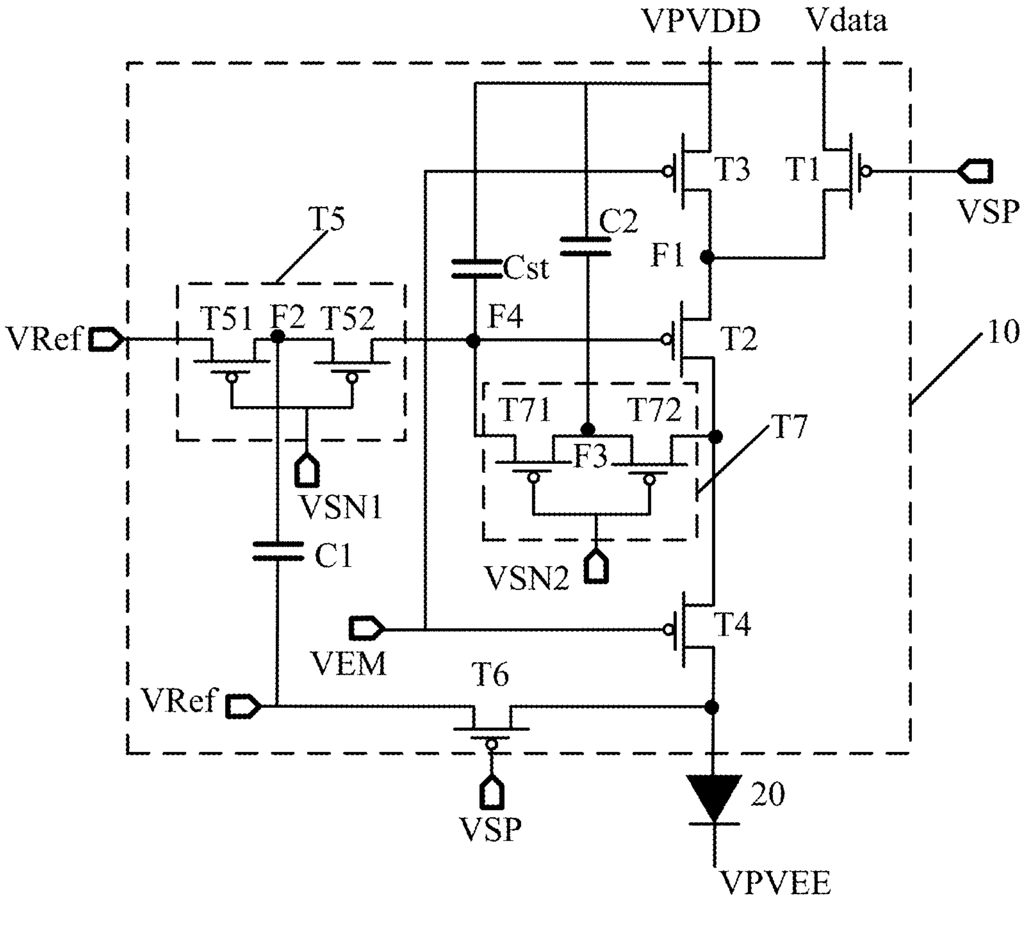
FIG. 8 is a schematic structural diagram of a pixel circuit according to yet another embodiment of the present disclosure.

That is, the pixel circuit 10 further includes a shielding capacitor C1. A schematic structural diagram of a corresponding pixel circuit 10 is shown in FIG. 8, and in conjunction with FIGS. 3, 4A, and 4C, a first plate C11 of the shielding capacitor C1 is a region in which the reference voltage line Ref is overlapped with the first sub-connecting region p53 in the direction perpendicular to the plane in which the substrate sub is located, and a second plate C12 of the shielding capacitor C1 reuses the first sub-connecting region p53. In this case, the first plate C11 of the shielding capacitor C1 receives the reference voltage signal VRef, which is a constant voltage signal.

It should be noted that the fifth transistor T5 is a transistor of a double-gate structure, which facilitates reducing the leakage current of the fifth transistor T5 to the gate of the second transistor T2, and to maintain the stability of a gate potential of the second transistor T2.

Further, in the direction perpendicular to a plane in which the substrate sub is located, the first sub-connecting region p53 (corresponding to the second node F2) is at least partially overlapped with the reference voltage line Ref to form the shielding capacitor C1, so that in the event of a change in the charge of the second node F2 caused by a change in the level on the second scanning line SN1, since the charge of the second node F2 is able to be stored in the shielding capacitor C1, the effect of the change in the charge of the second node F2 on the gate potential of the second transistor T2 can be reduced, to maintain the stability of the gate potential of the second transistor T2.

In an embodiment of the present disclosure, as shown in FIGS. 3 and 4C, the reference voltage line Ref includes a first extension section Y1 and a second extension section Y2 which extend along the first direction X. In the direction perpendicular to the first direction X, a width of the first extension section Y1 is greater than a width of the second extension section Y2.

In the direction perpendicular to a plane in which the substrate sub is located, the first extension section Y1 is at least partially overlapped with the first sub-connecting region p53 to form the shielding capacitor C1.

As can be seen, in the reference voltage line Ref, the width of the first extension section Y1 being greater than the width of the second extension section Y2 can increase the area of a region in which the reference voltage line Ref is overlapped with the first sub-connecting region p53, to increase the capacitance of the shielding capacitor C1, and further reducing the effect of the change of the charge of the second node F2 on the gate voltage of the second transistor T2.

In an embodiment of the present disclosure, as shown in FIGS. 2 to 3 and 4A to 4F, the display panel further includes: multiple third scanning lines SN2 extending along the first direction X.

The pixel circuit 10 further includes a seventh transistor T7, a gate g7 of the seventh transistor T7 is electrically connected to the third scanning line SN2, a first electrode p711 of the seventh transistor T7 is electrically connected to the second electrode p22 of the second transistor T2, and a second electrode p722 of the seventh transistor T7 is electrically connected to the gate g2 of the second transistor T2.

As shown in FIGS. 3 and 4B, the third scanning line SN2 may be disposed in the metal layer M1.

Referring to the pixel circuit shown in FIGS. 5 and 8, the seventh transistor T7 may be a compensation transistor T7.

As shown in FIGS. 3, 4A, and 4B, the active layer poly includes a channel region p7 of the seventh transistor T7, and in the direction perpendicular to the plane where the substrate sub is located, the channel region p7 of the seventh transistor T7 is at least partially overlapped with the third scanning line SN2, and a region where the third scanning line SN2 is overlapped with the channel region p7 of the seventh transistor T7 is a gate g7 of the seventh transistor T7, and the gate g7 of the seventh transistor T7 is electrically connected to the third scanning line SN2.

As shown in FIGS. 3 and 4A, the seventh transistor T7 includes the channel region p7 disposed in the active layer poly, and a first electrode p711 and a second electrode p722 connected to the channel region p7. The first electrode p711 of the seventh transistor T7 is directly connected to the second electrode p22 of the second transistor T2 in the active layer poly.

As shown in FIGS. 3, 4A, 4B, and 4D, the second electrode p722 of the seventh transistor T7 is electrically connected to the gate g2 of the second transistor T2 through the connecting structure K7 disposed in the metal layer M2

Referring to the pixel circuit shown in FIGS. 5 and 8, the compensation transistor T7 may be a double-gate transistor, i.e., the seventh transistor T7 may be a double-gate transistor. In an embodiment of the present disclosure, as shown in FIG. 3, the seventh transistor T7 may include a third sub-transistor T71 and a fourth sub-transistor T72. A first electrode of the third sub-transistor T71 is the first electrode of the seventh transistor T7, a second electrode of the third sub-transistor T71 is electrically connected to a first electrode of the fourth sub-transistor T72, and a second electrode of the fourth sub-transistor T72 is the second electrode of the seventh transistor T7.

As shown in FIG. 4A, the active layer poly includes a third sub-channel region p71, a fourth sub-channel region p72, and a second sub-connecting region p73. The third sub-channel region p71 and the fourth sub-channel region p72 are connected with each other through the second sub-connecting region p73.

As shown in FIGS. 3, 4A and 4B, the third sub-channel region p71 is a channel region of the third sub-transistor T71, and in the direction perpendicular to a plane in which the substrate sub is located, the third sub-channel region p71 is at least partially overlapped with the third scanning line SN2, and a region in which the third scanning line SN2 is overlapped with the third sub-channel region p71 is a gate g71 of the third sub-transistor T71, i.e., in the direction perpendicular to a plane in which the substrate sub is located, the third sub-channel region p71 is at least partially overlapped with the gate g71 of the third sub-transistor T71.

As shown in FIGS. 3, 4A and 4B, the fourth sub-channel region p72 is a channel region of the fourth sub-transistor T52, and in the direction perpendicular to a plane in which the substrate sub is located, the fourth sub-channel region p72 is at least partially overlapped with the third scanning line SN2, and a region in which the third scanning line SN2 is overlapped with the fourth sub-channel region p72 is a gate g72 of the fourth sub-transistor T72, i.e., in the direction perpendicular to a plane in which the substrate sub is located, the fourth sub-channel region p72 is at least partially overlapped with the gate g72 of the fourth sub-transistor T72.

As shown in FIG. 4A, the third sub-transistor T71 includes the third sub-channel region p71, and the first electrode p711 and the second electrode p722 connected to the third sub-channel region p71, and the fourth sub-transistor T72 includes the fourth sub-channel region p72, and the first electrode p711 and the second electrode p722 connected to the fourth sub-channel region p72. The first electrode p711 of the third sub-transistor T71 is the first electrode p711 of the seventh transistor T7, the second electrode p722 of the fourth sub-transistor T72 is the second electrode p722 of the seventh transistor T7, and the third sub-channel region p71 is electrically connected to the fourth sub-channel region p72 through the second sub-connecting region p73, and the second electrode p712 of the third sub-transistor T71 is electrically connected to the first electrode p721 of the fourth sub-transistor T72 through the second sub-connecting region p73.

Referring to the pixel circuit shown in FIGS. 5 and 8, the compensation transistor T7 has a third node F3 at which the third sub-transistor T71 and the fourth sub-transistor T72 are connected with each other. Correspondingly, as shown in FIGS. 3 and 4A, in the seventh transistor T7, the second electrode p712 of the third sub-transistor T71 is connected to the first electrode p721 of the fourth sub-transistor T72 through the second sub-connecting region p73, i.e., the second sub-connecting region p73 corresponds to the third node F3.

In one embodiment, as shown in FIGS. 3 and 4C, the pixel circuit 10 further includes a shielding layer C21.

As shown in FIGS. 3, 4A and 4C, the second sub-connecting region p73 is at least partially overlapped with the shielding layer C21 in the direction perpendicular to a plane in which the substrate sub is located.

That is, the third sub-connecting region p73 and the shielding layer C21 form a shielding capacitor C2. A schematic structural diagram of a corresponding pixel circuit 10 is shown in FIG. 8, and in conjunction with FIGS. 3, 4A, and 4C, a first plate C21 of the shielding capacitor C2 is the shielding layer C21 and is disposed in the metal layer MC, and a second plate C22 of the shielding capacitor C2 reuses the third sub-connecting region p73.

It should be noted that the seventh transistor T7 is a transistor of a double-gate structure, which facilitates reducing the leakage current from the seventh transistor T7 to the gate of the second transistor T2, and to maintain the stability of a gate potential of the second transistor T2.

Further, in the direction perpendicular to the plane where the substrate sub is located, the shielding layer C21 is at least partially overlapped with the second sub-connecting region p73 (corresponding to the third node F3) to form the shielding capacitor C2, so that in the event of a change in the charge of the third node F3 caused by a change in the level on the third scanning line SN2, since the charge of the third node F3 is able to be stored in the shielding capacitor C2, the effect of the change in the charge of the third node F3 on the gate potential of the second transistor T2 can be avoided, to maintain the stability of the gate potential of the second transistor T2.

It should be noted that, as shown in FIGS. 3, 4C, and 4D, the first plate C21 (the shielding layer C21 disposed in the metal layer MC) of the shielding capacitor C2 is electrically connected to the first supply voltage line PVDD extending along the second direction Y through an internal connection point H4 and a connecting structure K10 disposed in the metal layer M2, to receive a constant voltage signal VPVDD. In one embodiment, in the direction perpendicular to a plane in which the substrate sub is located, the connecting structure K10 is electrically connected to the first supply voltage line PVDD in the same layer.

Figure 9:
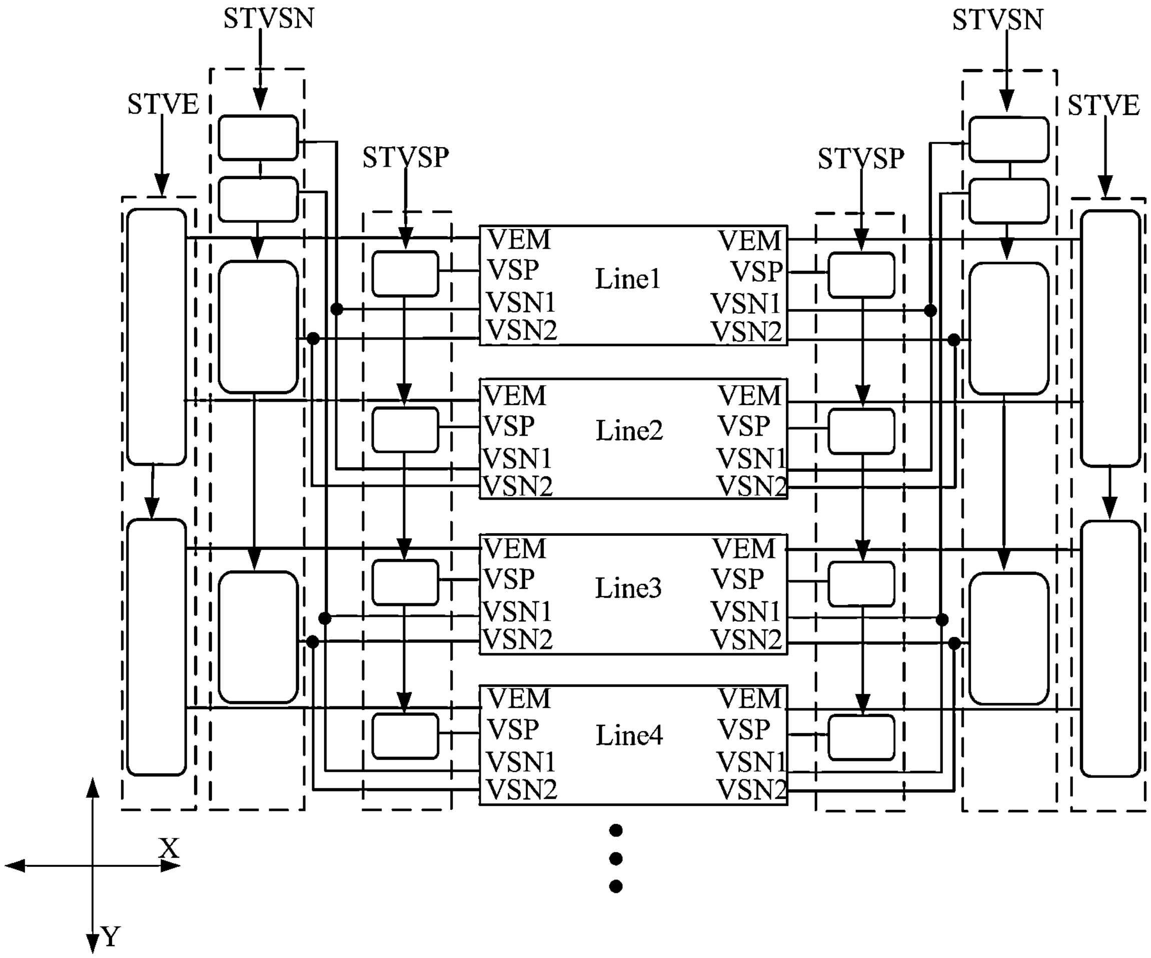
FIG. 9 is a partial schematic top view of a display panel according to an embodiment of the present disclosure.

FIG. 9 illustrates a schematic top view of a display panel according to an embodiment of the present disclosure. As shown in FIG. 9, the display panel further includes a first scanning circuit STVSP, a second scanning circuit STVSN, and a third scanning circuit STVE.

The first scanning circuit STVSP provides a scanning signal VSP for each row of pixel circuits 10 (e.g., Line1, Line2, Line3 in FIG. 9);

The second scanning circuit STVSN provides a scanning signal VSN1 for each row of pixel circuits 10 (e.g., Line1, Line2, Line3 in FIG. 9), and provides a scanning signal VSN2 for each row of pixel circuits 10 (e.g., Line1, Line2, Line3 in FIG. 9);

The third scanning circuit STVE provides a light-emitting control signal VEM for each row of pixel circuits 10 (e.g., Line1, Line2, Line3 in FIG. 9).

As shown in FIG. 9, the display panel may include two first scanning circuits STVSP, and the two first scanning circuits STVSP may be disposed on two sides, opposite to each other in the first direction X, of the display panel, to bilaterally drive the rows of pixel circuits 10.

Of course, In one embodiment, the display panel may be provided with only one first scanning circuit STVSP on one side of the display panel in the first direction X. In one embodiment, the two first scanning circuits STVSP may be provided on one side of the display panel in the first direction X, which may be set according to situations.

The first scanning circuits STVSP include multiple shift registers, and one shift register may be electrically connected to one row of pixel circuits 10 or to multiple rows of pixel circuits 10, which may be set according to situations.

As shown in FIG. 9, the display panel may include two second scanning circuits STVSN, and the two second scanning circuits STVSN may be disposed on two sides, opposite to each other in the first direction X, of the display panel, to bilaterally drive the rows of pixel circuits 10.

Of course, In one embodiment, the display panel may be provided with only one second scanning circuit STVSN on one side of the display panel in the first direction X. In one embodiment, the two second scanning circuits STVSN may be provided on one side of the display panel in the first direction X, which may be set according to situations.

The second scanning circuits STVSN include multiple shift registers, and one shift register may be electrically connected to one row of pixel circuits 10 or to multiple rows of pixel circuits 10, which may be set according to situations.

As shown in FIG. 9, the display panel may include two third scanning circuits STVE, and the two third scanning circuits STVE may be disposed on two sides, opposite to each other in the first direction X, of the display panel, to bilaterally drive the rows of pixel circuits 10.

Of course, In one embodiment, the display panel may be provided with only one third scanning circuit STVE on one side of the display panel in the first direction X. In one embodiment, the two third scanning circuits STVE may be provided on one side of the display panel in the first direction X, which may be set according to situations.

The third scanning circuits STVE include multiple shift registers, and one shift register may be electrically connected to one row of pixel circuits 10 or to multiple rows of pixel circuits 10, which may be set according to situations.

Figure 10:
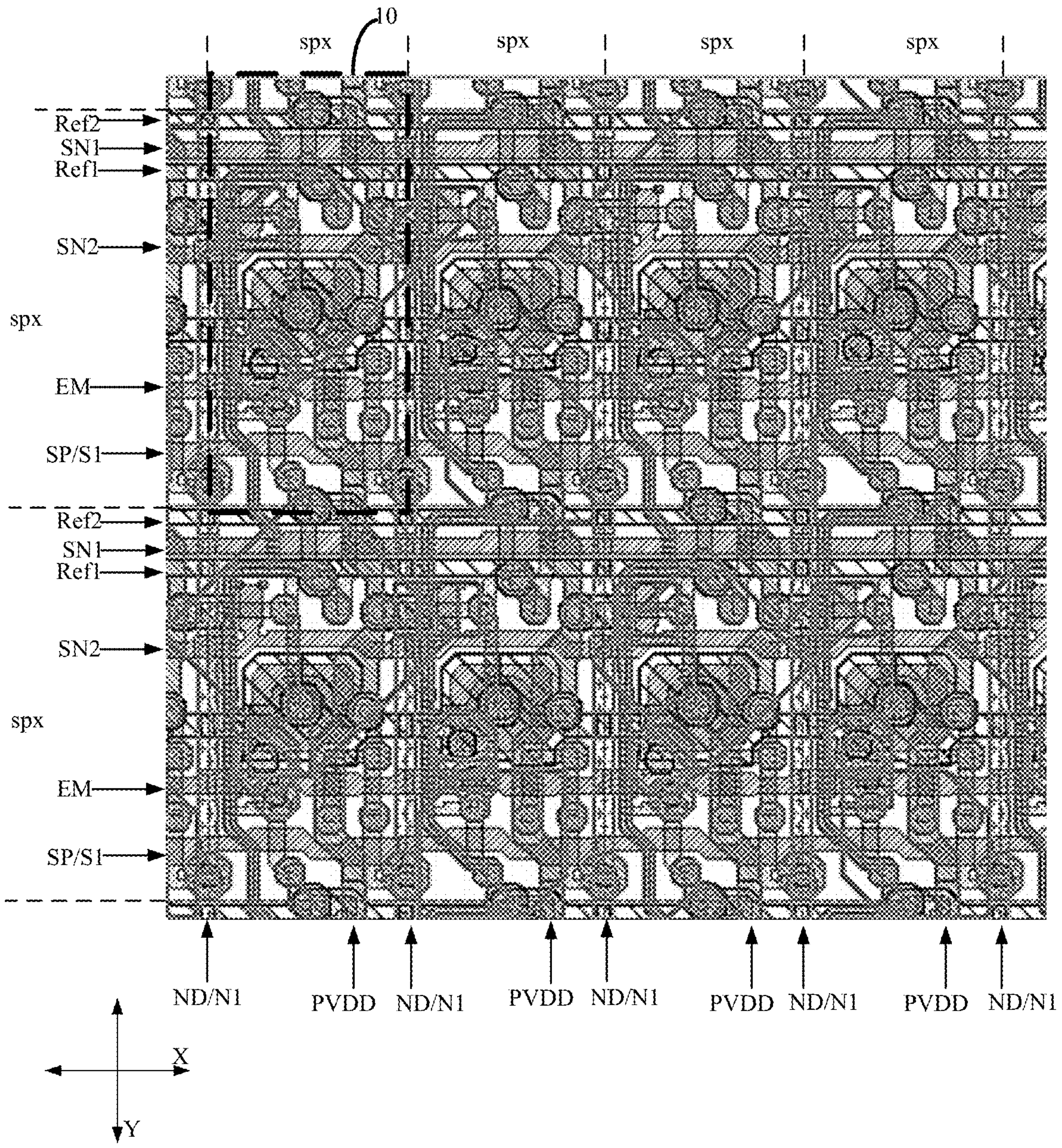
FIG. 10 is a schematic diagram showing a partial layout structure of a display panel according to another embodiment of the present disclosure.
Figure 11A:
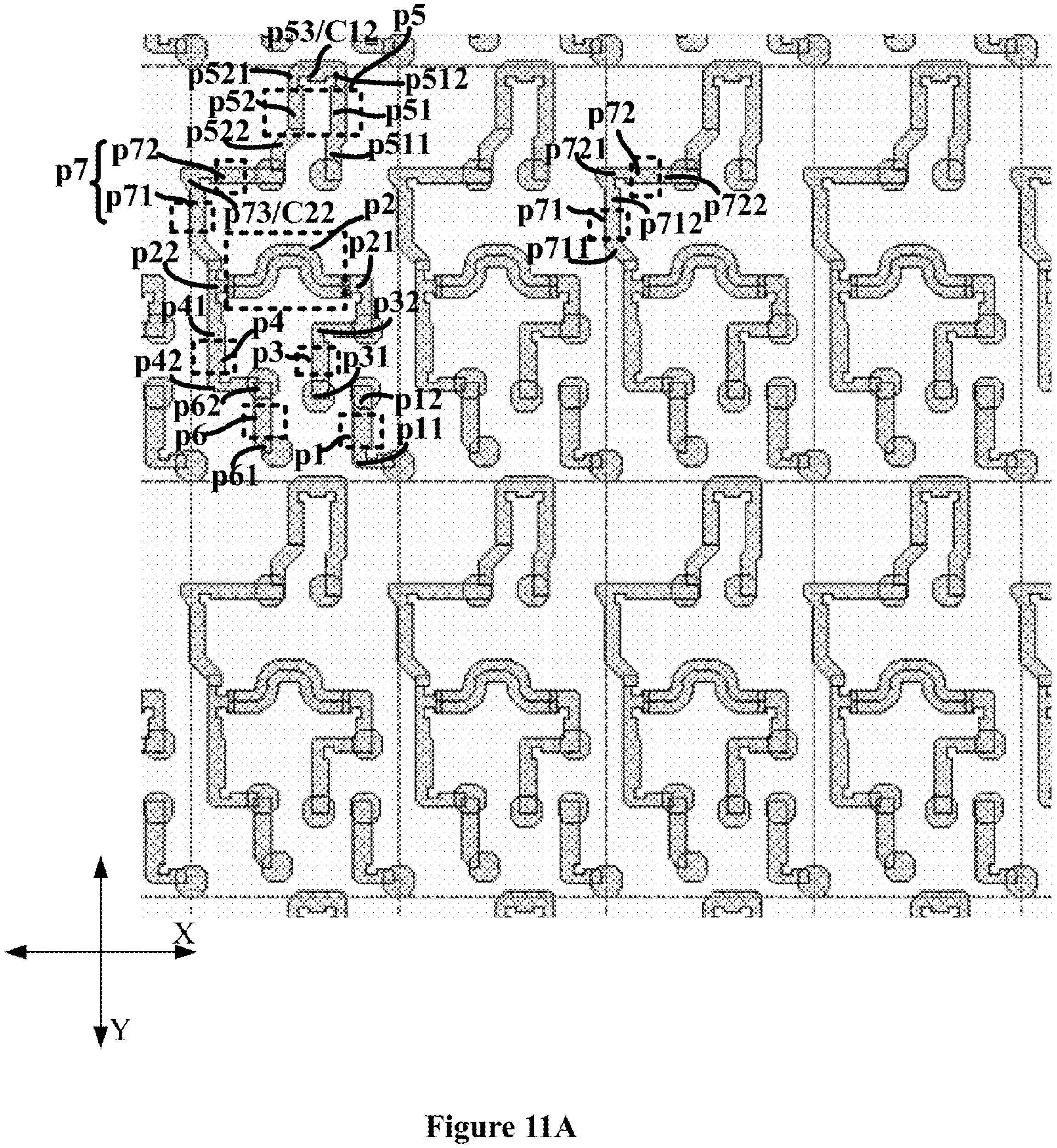
FIG. 11A is a schematic diagram showing the layout structure of an active layer poly in FIG. 10.
Figure 11B:
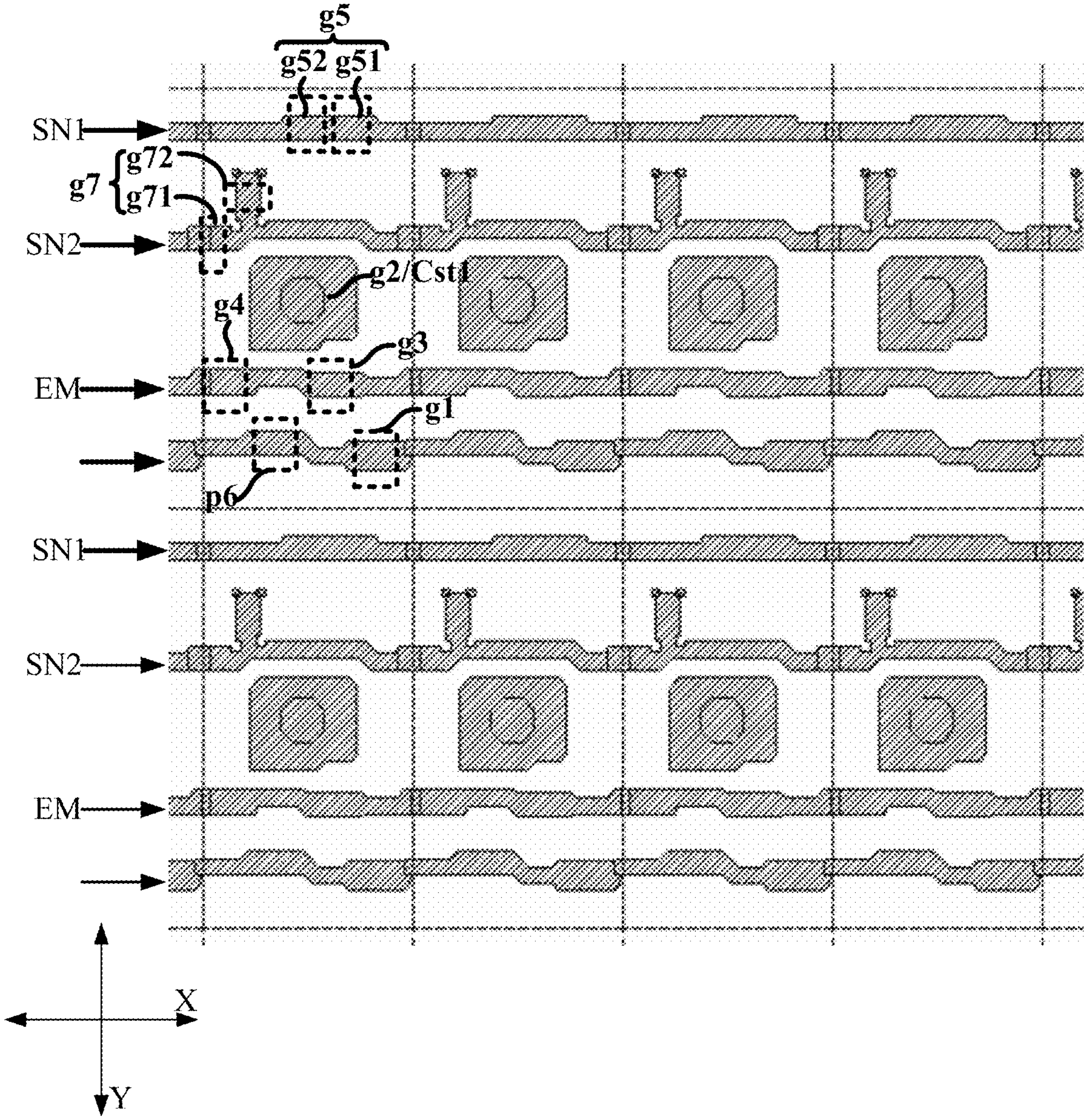
FIG. 11B is a schematic diagram showing the layout structure of a metal layer M1 in FIG. 10.
Figure 11C:
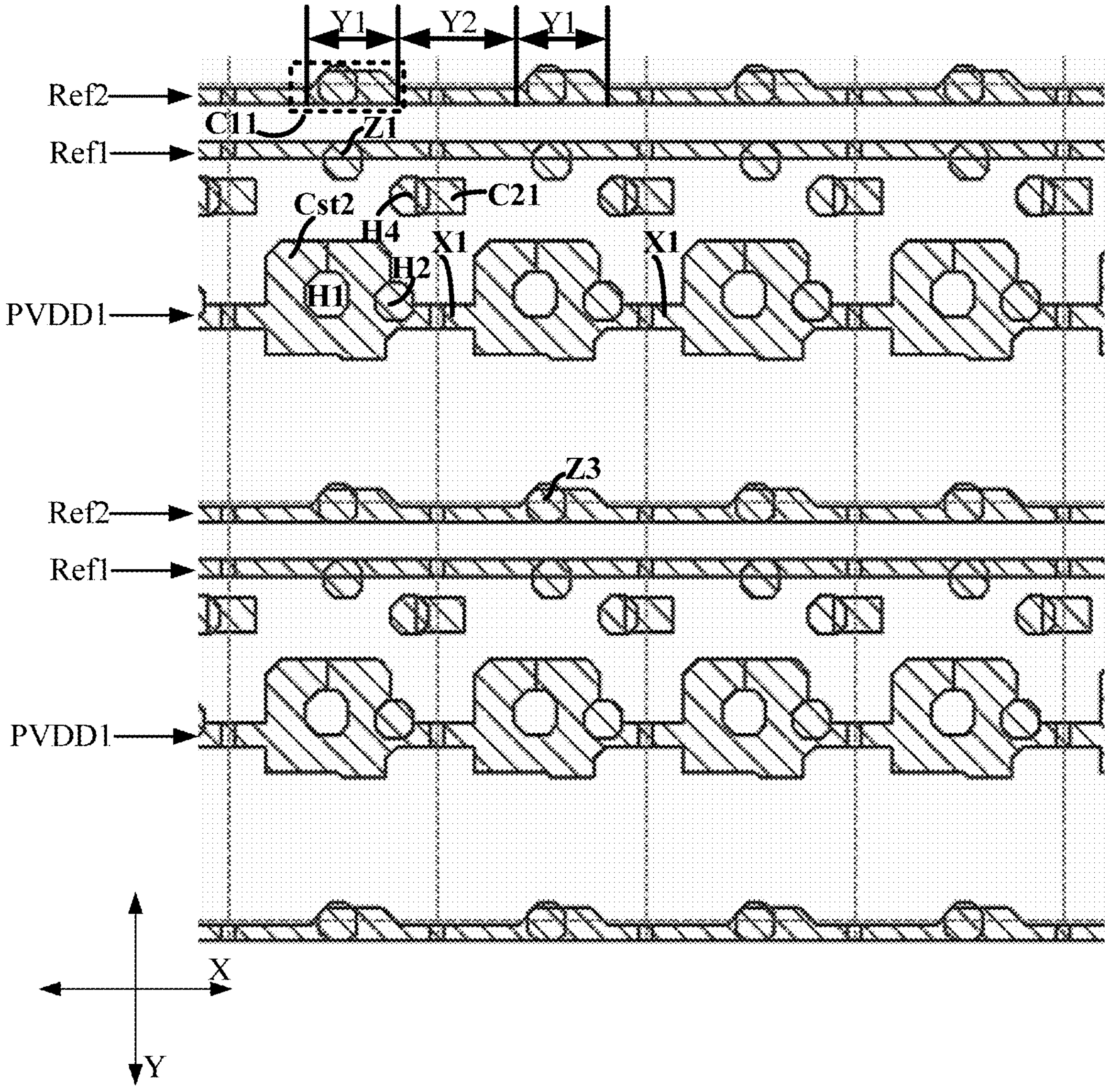
FIG. 11C is a schematic diagram showing the layout structure of a metal layer MC in FIG. 10.
Figure 11D:
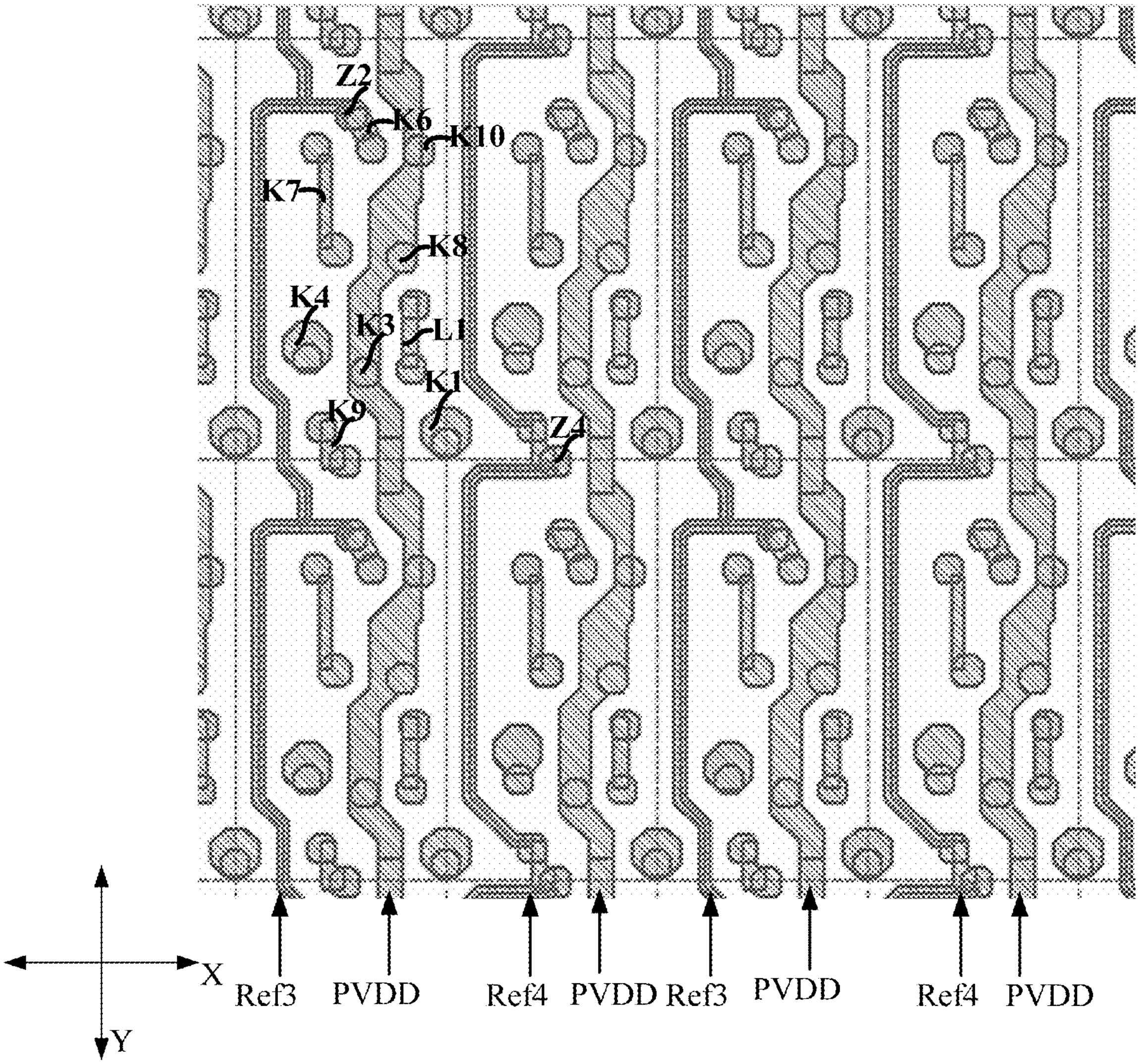
FIG. 11D is a schematic diagram showing the layout structure of a metal layer M2 in FIG. 10.
Figure 11E:
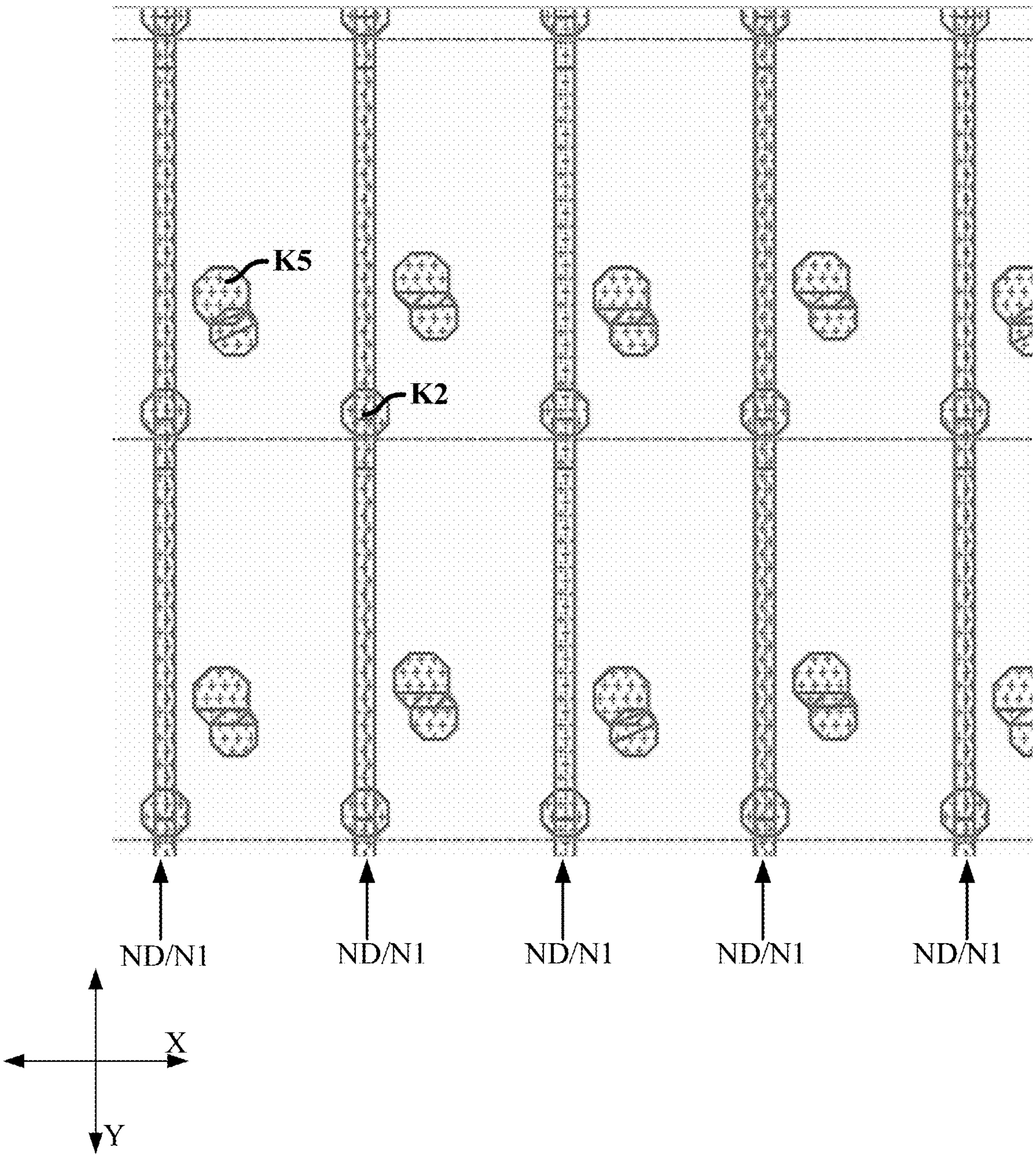
FIG. 11E is a schematic diagram showing the layout structure of a metal layer M3 in FIG. 10.
Figure 11F:
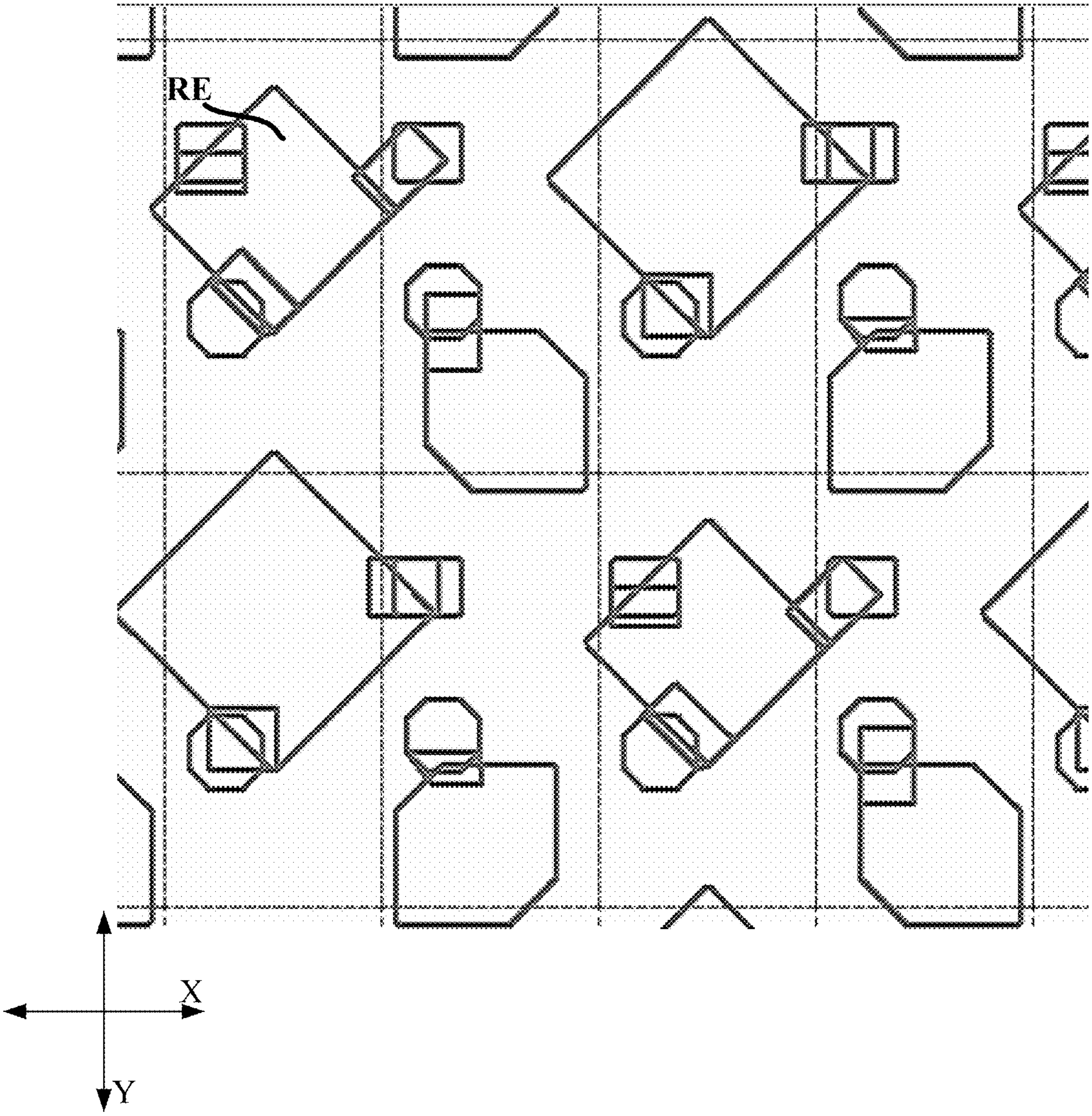
FIG. 11F is a schematic diagram showing the layout structure of a metal layer RE in FIG. 10.

FIG. 10 is a schematic diagram showing a partial layout of a display panel according to another embodiment of the present disclosure. FIGS. 11A to 11F further illustrate schematic diagrams showing the layout structures of film layers in FIG. 10, respectively. FIG. 11A is a schematic diagram showing the layout structure of the active layer poly, FIG. 11B is a schematic diagram showing the layout structure of the metal layer M1, FIG. 11C is a schematic diagram showing the layout structure of the metal layer MC, FIG. 11D is a schematic diagram showing the layout structure of the metal layer M2, FIG. 11E is a schematic diagram showing the layout structure of the metal layer M3, and FIG. 11F is a schematic diagram showing the layout structure of the metal layer RE. Referring to FIG. 1, the active layer poly, the metal layer M1, the metal layer MC, the metal layer M2, the metal layer M3, and the metal layer RE are arranged in a direction away from the substrate sub. For illustrating clearly, FIG. 12 further illustrates a schematic diagram showing the layout structure of a stack consisting of the active layer poly, the metal layer M1, the metal layer MC and the metal layer M2 in FIG. 10.

Figure 12:
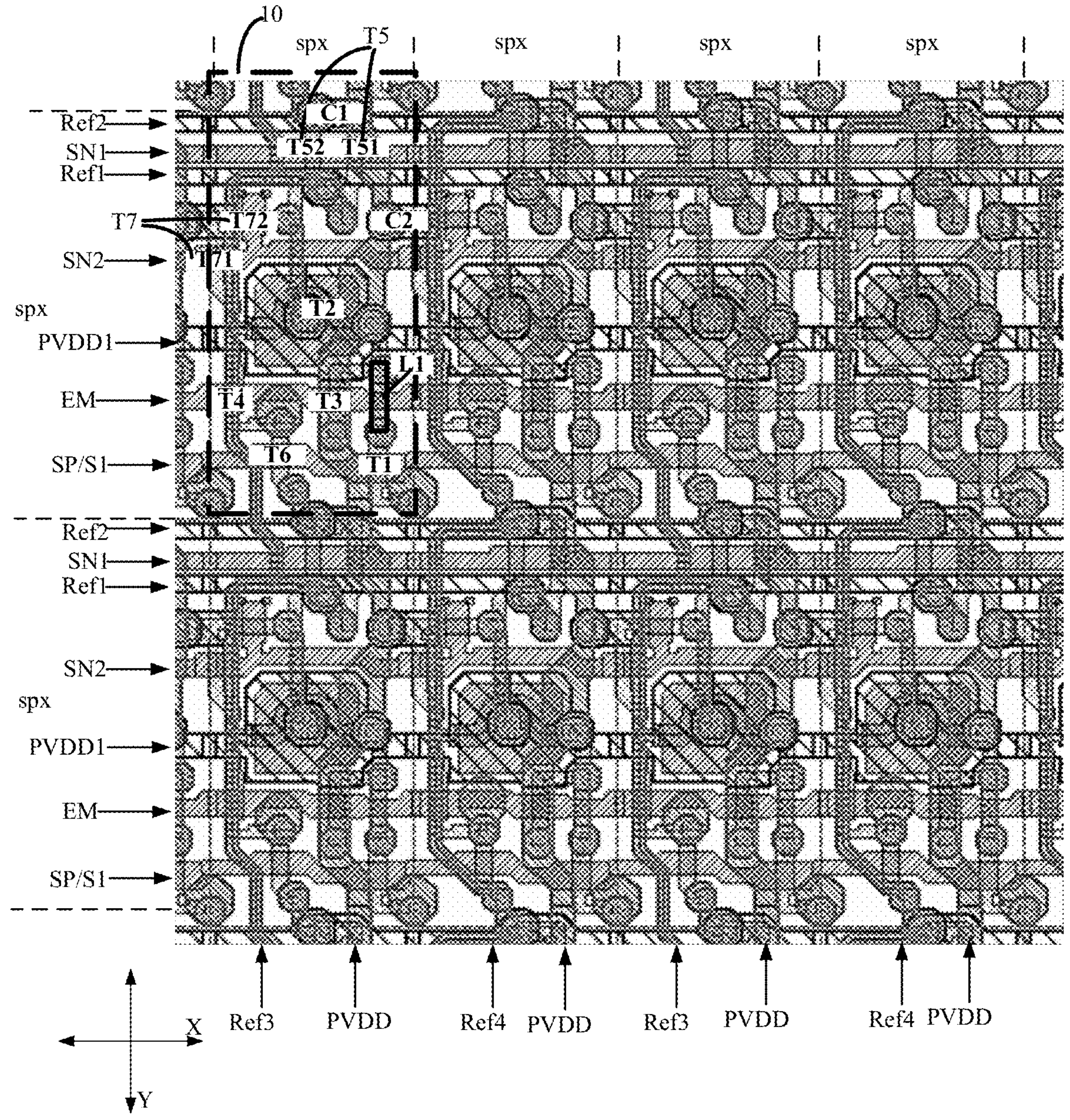
FIG. 12 is a schematic diagram showing the layout structure of a stack consisting of the active layer poly, the metal layer M1, the metal layer MC and the metal layer M2 in FIG. 10.

As shown in FIGS. 10 and 12, the display panel includes multiple sub-pixels spx, multiple first scanning lines S1, and multiple first signal lines N1. Each of the first scanning lines S1 extends along a first direction X, and each of the first signal lines N1 extends along a second direction Y, and the first direction X and the second direction Y intersects with each other.

As shown in FIG. 1, each of the sub-pixels spx includes a pixel circuit 10 and a light-emitting element 20, and the pixel circuit 10 is used to drive the light-emitting element 20 to emit light.

As shown in FIGS. 10 and 12, the pixel circuit 10 includes a first transistor T1 and a second transistor T2, a gate of the first transistor T1 is electrically connected to the first scanning line S1, a first electrode of the first transistor T1 is electrically connected to the first signal line N1, a second electrode of the first transistor T1 is electrically connected to a first electrode of the second transistor T2 through a first connecting portion L1, and a second electrode of the second transistor T2 is electrically connected to the light emitting element 20.

The first connecting portion L1 is disposed on one side, away from the substrate sub, of the active layer poly.

It should be noted that the second electrode of the second transistor T2 being electrically connected to the light emitting element 20 includes the second electrode of the second transistor T2 being directly electrically connected to the light emitting element 20, or, In one embodiment, the second electrode of the second transistor T2 being indirectly electrically connected to the light emitting element 20. The second electrode of the second transistor T2 being indirectly electrically connected to the light emitting element 20 includes the second electrode of the second transistor T2 being electrically connected to the light emitting element 20 through other transistors or switches.

As shown in FIGS. 12 and 11B, the first scanning line S1 may be disposed in the metal layer M1.

As shown in FIGS. 12 and 11E, the first signal line N1 may be disposed in the metal layer M3.

As shown in FIGS. 12 and 11D, the first connecting portion L1 may be disposed in the metal layer M2 on one side, away from the substrate sub, of the active layer poly.

As shown in FIGS. 12, 11A, and 11B, the active layer poly includes a channel region p1 of the first transistor T1. The channel region p1 of the first transistor T1 is at least partially overlapped with the first scanning line S1 in a direction perpendicular to a plane in which the substrate sub is located, and a region in which the first scanning line S1 is overlapped with the channel region p1 of the first transistor T1 is a gate g1 of the first transistor T1, and the gate g1 of the first transistor T1 is electrically connected to the first scanning line S1.

As shown in FIGS. 12, 11A, 11D, and 11E, the first transistor T1 includes a channel region p1 disposed in the active layer poly, and a first electrode p11 and a second electrode p12 connected to the channel region p1. The first electrode p11 of the first transistor T1 is electrically connected to the first signal line N1 through a connecting structure K1 disposed in the metal layer M2 and a connecting structure K2 disposed in the metal layer M3, so that the first transistor T1 is electrically connected to the first signal line N1.

As shown in FIGS. 12, 11A and 11D, the second electrode p12 of the first transistor T1 is electrically connected to a first electrode p21 of the second transistor T2 through the first connecting portion L1 disposed in the metal layer M2.

As shown in FIGS. 12, 11A and 11B, the active layer poly includes a channel region p2 of the second transistor T2, a gate g2 of the second transistor T2 is disposed in the metal layer M1, and in the direction perpendicular to a plane in which the substrate sub is located, the gate g2 of the second transistor T2 is at least partially overlapped with the channel region p2 of the second transistor T2.

As shown in FIGS. 12, 11A, and 11D, the second transistor T2 includes a channel region p2 disposed in the active layer poly, and a first electrode p21 and a second electrode p22 connected to the channel region p2. The first electrode p21 of the second transistor T2 is electrically connected to the second electrode p12 of the first transistor T1 through the first connecting portion L1 disposed in the metal layer M2, and the second electrode p22 of the second transistor T2 is electrically connected to the light emitting element 20.

As can be seen, in the display panel according to the embodiment of the present disclosure, since the first electrode p11 of the first transistor T1 is electrically connected to the first signal line N1, the second electrode p12 of the first transistor T1 is electrically connected to the first electrode p21 of the second transistor T2 through the first connecting portion L1, the second electrode p22 of the second transistor T2 is electrically connected to the light-emitting element 20, and the first connecting portion L1 is disposed at one side, away from the substrate sub, of the active layer poly, so that signals of the first signal line N1 can be transmitted through the first connecting portion L1 disposed between the second electrode p12 of the first transistor T1 and the first electrode p21 of the second transistor T2 and disposed in a different layer from the active layer poly. For example, the first connecting portion L1 is disposed in a metal layer, and the metal layer does not form an unwanted transistor with the active layer poly, which facilitates reducing the layout space of the sub-pixels, to facilitate adaptation to the demands for displaying in high resolution and high definition.

It should be emphasized that in FIGS. 10, 12, and 11D, the first connecting portion L1 being disposed in the metal layer M2 is only illustrated as an example, but which metal layer at one side, away from the substrate sub, of the active layer poly the first connecting portion L1 is specifically disposed in is not limited in the present disclosure. For example, the first connecting portion L1 may be disposed in the metal layer M1, the metal layer MC, or the metal layer M3, which are not exhaustive herein.

As can be seen from the foregoing, with reference to the pixel circuit 10 shown in FIG. 7, the second transistor T2 may be a driving transistor Q2, and the first scanning line S1 may be a scanning line SP for providing a scanning signal VSP; the first transistor T1 may be a bias transistor Q8. In this case, the first signal line N1 may be an initialization voltage line for providing an initialization voltage signal VDVH; and the first transistor T1 may be a data writing transistor Q1. In this case, the first signal line N1 may be a data line ND for providing a data signal Vdata; and the first transistor T1 may be a first light-emitting control transistor Q3. In this case, the first signal line N1 may be an anode supply voltage line for providing an anode supply voltage signal VPVDD; the first transistor T1 may be other transistors that write a signal to the driving transistor Q2 through the first node F1, and the first signal line N1 is accordingly a signal line for writing the signal.

It should be noted that, as shown in FIG. 1, in a case that the first signal line N1 is the data line ND, the initialization voltage line, or the anode supply voltage line, the first signal line N1 may be disposed in the metal layer M3, in the metal layer M2, or in other optional metal layers of the display panel, depending on the situations, as long as the first signal line N1 is not shorted to other signal lines.

The first transistor T1 being the data writing transistor T1, the first signal line N1 being the data line ND for providing the data signal Vdata, the second transistor T2 being the driving transistor T2, and the first scanning line S1 being the scanning line SP for providing the scanning signal VSP are described hereinafter as an example.

In an embodiment of the present disclosure, as shown in FIGS. 10, 11A to 11F, and 12, the display panel further includes: multiple light-emitting control lines EM extending along the first direction X; and multiple first supply voltage lines PVDD extending along the second direction Y.

The pixel circuit 10 further includes a third transistor T3 and a fourth transistor T4, a first electrode p31 of the third transistor T3 is electrically connected to the first supply voltage line PVDD, a second electrode p32 of the third transistor T3 is electrically connected to the first electrode p21 of the second transistor T2, a first electrode p41 of the fourth transistor T4 is electrically connected to the second electrode p22 of the second transistor T2, and a second electrode p42 of the fourth transistor T4 is electrically connected to the light-emitting element 20, and a gate g3 of the third transistor T3 and a gate g4 of the fourth transistor T4 each is electrically connected to the light-emitting control line EM.

The first connecting portion L1 is at least partially overlapped with the light-emitting control line EM in the direction perpendicular to a plane in which the substrate sub is located.

As shown in FIGS. 12 and 11B, the light-emitting control line EM may be disposed in the metal layer M1.

As shown in FIGS. 12 and 11D, the first supply voltage line PVDD may be disposed in the metal layer M2, but the present disclosure does not limit to this. In one embodiment, the first supply voltage line PVDD may be disposed in the metal layer M3 or the metal layer MC, or, In one embodiment, the first supply voltage line PVDD may be disposed in at least two of the metal layer M2, the metal layer M3, and the metal layer MC, which will not be described herein.

Referring to the pixel circuit 10 as shown in FIGS. 5 and 8, the third transistor T3 may be a first light-emitting control transistor T3, the fourth transistor T4 may be a second light-emitting control transistor T4, and the gate of the third transistor T3 and the gate of the fourth transistor T4 each is electrically connected to the light-emitting control line EM to receive the light-emitting control signal VEM.

As shown in FIGS. 12, 11A and 11B, the active layer poly includes a channel region p3 of the third transistor T3, and in the direction perpendicular to a plane in which the substrate sub is located, the channel region p3 of the third transistor T3 is at least partially overlapped with the light-emitting control line EM, and a region in which the light-emitting control line EM is overlapped with the channel region p3 of the third transistor T3 is the gate g3 of the third transistor T3, so that the gate g3 of the third transistor T3 is electrically connected to the light-emitting control line EM.

As shown in FIGS. 12, 11A and 11D, the third transistor T3 includes a channel region p3 disposed in the active layer poly, and a first electrode p31 and a second electrode p32 connected to the channel region p3. The first electrode p31 of the third transistor T3 is electrically connected to the first supply voltage line PVDD through a connecting structure K3 disposed in the metal layer M2.

As shown in FIGS. 12 and 11A, the second electrode p32 of the third transistor T3 is directly electrically connected to the first electrode p21 of the second transistor T2 in the active layer poly.

As shown in FIGS. 12, 11A and 11B, the active layer poly includes a channel region p4 of the fourth transistor T4, in a direction perpendicular to a plane in which the substrate sub is located, the channel region p4 of the fourth transistor T4 is at least partially overlapped with the light-emitting control line EM, and a region in which the light-emitting control line EM is overlapped with the channel region p4 of the fourth transistor T4 is the gate g4 of the fourth transistor T4, and the gate g4 of the fourth transistor T4 is electrically connected to the light-emitting control line EM.

As shown in FIGS. 12 and 4A, the fourth transistor T4 includes the channel region p4 disposed in the active layer poly, and the first electrode p41 and the second electrode p42 connected to the channel region p4. The first electrode p41 of the fourth transistor T4 is directly electrically connected to the second electrode p22 of the second transistor T2 in the active layer poly.

As shown in FIGS. 12, 11A, and 11D to 11F, the second electrode p42 of the fourth transistor T4 is electrically connected to the anode RE of the light-emitting element 20 through a connecting structure K4 disposed in the metal layer M2, and a connecting structure K5 disposed in the metal layer M3.

As shown in FIG. 12, the first connecting portion L1 is partially overlapped with the light-emitting control line EM in a direction perpendicular to a plane in which the substrate sub is located. In other words, on the basis that the second electrode p12 of the first transistor T1 and the first electrode p21 of the second transistor T2 are connected through the first connecting portion L1, the light-emitting control line EM may be arranged to be overlapped with the first connecting portion L1 in the direction perpendicular to a plane in which the substrate sub is located, to save the layout space of the sub-pixels and facilitating adaptation to the demands for displaying in high resolution and high definition.

In an embodiment of the present disclosure, the light-emitting control line EM is disposed in a first metal layer, the first connecting portion L1 is disposed in a second metal layer, and the second metal layer is disposed on one side, away from the substrate sub, of the first metal layer.

It should be understood that the light-emitting control line EM is to be electrically connected to the gate of the third transistor T3 and the gate of the fourth transistor T4, i.e., the light-emitting control line EM is to be overlapped with the channel region p3 of the third transistor T3 and the channel region p4 of the fourth transistor T4 in the direction perpendicular to a plane in which the substrate sub is located. Therefore, the light-emitting control line EM should be disposed nearer to the active layer poly than the first connecting portion L1. That is, the first connecting portion L1 is disposed further from the active layer poly than the light-emitting control line EM.

In one embodiment, referring to FIG. 1, the light-emitting control line EM is disposed in the first metal layer, which may be the metal layer M1, and the first connecting portion L1 is disposed in the second metal layer, which may be the metal layer M2, or the metal layer M3, or any other optional metal layers of the display panel, which will not be described herein.

In an embodiment of the present disclosure, as shown in FIGS. 10, 11A to 11F and 12, the display panel further includes: multiple second scanning lines SN1, multiple first reference voltage lines Ref1, and multiple second reference voltage lines Ref2, where the second scanning lines SN1, the first reference voltage lines Ref1, and the second reference voltage lines Ref2 each extends along the first direction X.

The pixel circuit 10 further includes a fifth transistor T5, a gate g5 of the fifth transistor T5 is electrically connected to the second scanning line SN1, a first electrode p511 of the fifth transistor T5 is electrically connected to the first reference voltage line Ref1, and a second electrode p522 of the fifth transistor T5 is electrically connected to a gate g2 of the second transistor T2.

The pixel circuit 10 further includes a sixth transistor T6, a gate g6 of the sixth transistor T6 is electrically connected to the first scanning line S1, a first electrode p61 of the sixth transistor T6 is electrically connected to the second reference voltage line Ref2, and a second electrode p62 of the sixth transistor T6 is electrically connected to the light emitting element 20.

As shown in FIGS. 12 and 11B, the second scanning line SN1 may be disposed in the metal layer M1.

As shown in FIGS. 12 and 11C, the first reference voltage line Ref1 and the second reference voltage line Ref2 each is disposed in the metal layer MC, but the present disclosure is not limited thereto, and the first reference voltage line Ref1 and the second reference voltage line Ref2 may be disposed in the metal layer M2 or in the metal layer M3, or in other optional metal layers, which will not be described herein.

As shown in FIGS. 12 and 11C, the first reference voltage lines Ref1 and the second reference voltage lines Ref2 may be disposed between two adjacent rows of pixel circuits 10 arranged in the first direction X, and the first reference voltage lines Ref1 and the second reference voltage lines Ref2 are arranged In one embodiment in the second direction Y.

Figure 13:
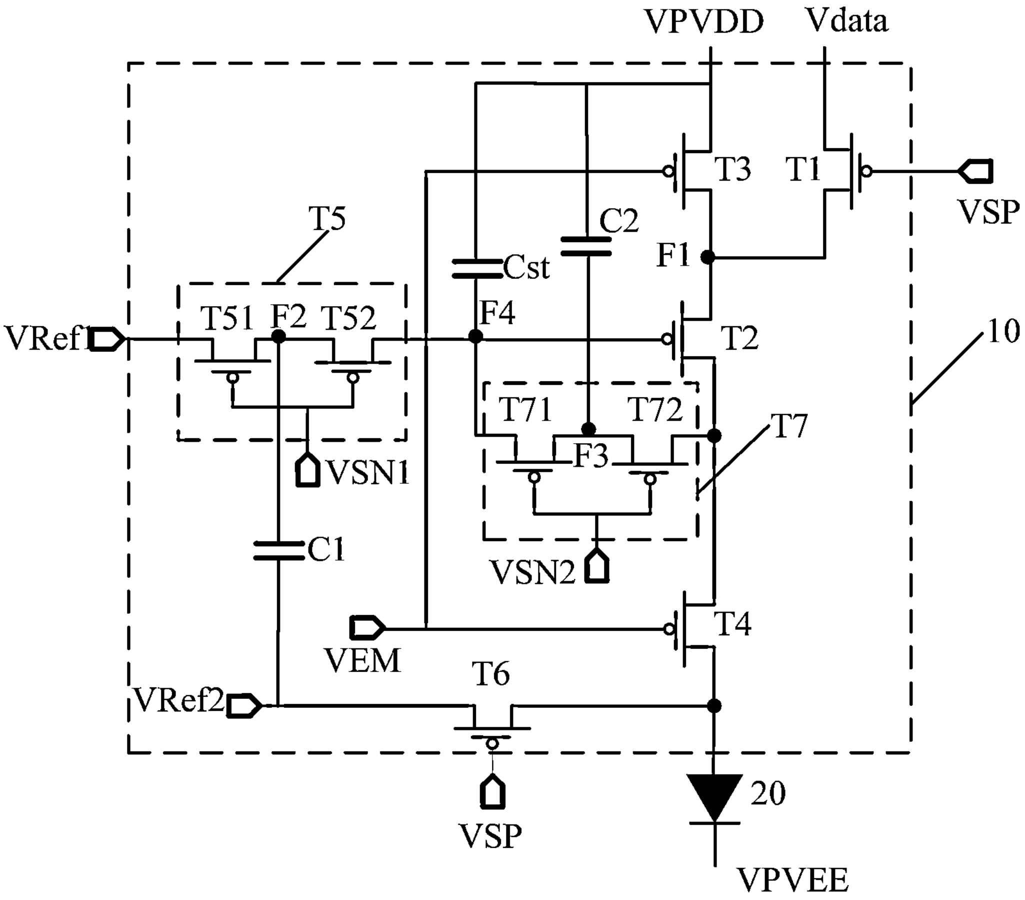
FIG. 13 is a schematic structural diagram of a pixel circuit according to yet another embodiment of the present disclosure.

FIG. 13 illustrates a schematic structural diagram of a pixel circuit 10 in a display panel according to yet another embodiment of the present disclosure. In comparison with the pixel circuits shown in FIGS. 13 and 8, it can be seen that, in the pixel circuit 10, a first electrode of a gate initialization transistor T5 is electrically connected to the first reference voltage line Ref1 to receive a first reference voltage signal VRef1, and a first electrode of an anode initialization transistor Q6 is electrically connected to the second reference voltage line Ref2 to receive a second reference voltage signal VRef2.

As shown in the pixel circuit 10 of FIG. 13, the fifth transistor T5 may be the gate initialization transistor T5, the first electrode of the fifth transistor T5 is electrically connected to the first reference voltage line Ref1 to receive the first reference voltage signal VRef1, and the sixth transistor T6 may be the anode initialization transistor Q6, the first electrode of the sixth transistor T6 is electrically connected to the second reference voltage line Ref2 to receive the second reference voltage signal VRef2.

As shown in FIGS. 12, 11A and 11B, the active layer poly includes a channel region p5 of the fifth transistor T5, and in the direction perpendicular to the plane where the substrate sub is located, the channel region p5 of the fifth transistor T5 is at least partially overlapped with the second scanning line SN1, and a region where the second scanning line SN1 is overlapped with the channel region p5 of the fifth transistor T5 is a gate g5 of the fifth transistor T5, and the gate g5 of the fifth transistor T5 is electrically connected to the second scanning line SN1.

As shown in FIGS. 12, 11A, and 11D, the fifth transistor T5 includes the channel region p5 disposed in the active layer poly, and the first electrode p511 and the second electrode p522 connected to the channel region p5. The first electrode p511 of the fifth transistor T5 is electrically connected to the first reference voltage line Ref1 extending along the first direction X through a connecting structure K6 disposed in the metal layer M2.

As shown in FIGS. 12, 11A, 11B, and 11D, the second electrode p522 of the fifth transistor T5 is electrically connected to the gate g2 of the second transistor T2 disposed in the metal layer M1 through a connecting structure K7 disposed in the metal layer M2.

It should be noted that, as can be seen in combination with the pixel circuit shown in FIG. 13, and the layout structure shown in FIGS. 12, 11B, and 11C, the gate g2 of the second transistor T2 disposed in the metal layer M1 serves simultaneously as the first plate Cst1 of the storage capacitor Cst, the second plate Cst2 of the storage capacitor Cst is disposed in the metal layer MC, and a via hole H1 is provided in the interior of the second plate Cst2 of the storage capacitor Cst, and the connecting structure K7 disposed in the metal layer M2 can be electrically connected to the gate g2 of the second transistor T2 disposed in the metal layer M1 through the via hole H1.

As shown in FIGS. 12, 11C, and 11D, in a row of pixel circuits 10 arranged in the first direction X, second plates Cst2 of the storage capacitors Cst are connected with each other through a connecting line segment X1 disposed in the metal layer MC, and the second plates Cst2 of the storage capacitors Cst are electrically connected to the first supply voltage line PVDD through an internal connection point H2 and a connecting structure K8 disposed in the metal layer M2, so that auxiliary supply voltage lines PVDD1 disposed in the metal layer MC are formed by the second plates Cst2 of the storage capacitors Cst arranged in a row in the first direction X and the connecting line segments X1 interconnected with the second plates Cst2, and a grid structure is formed by the auxiliary supply voltage lines PVDD1 and the first supply voltage lines PVDD disposed in the metal layer M2, which facilitates reducing the voltage drop (IR Drop) on the first supply voltage line PVDD to achieve the object of improving the display uniformity of the display panel and reducing power consumption.

As shown in FIGS. 12, 11A, and 11B, the active layer poly includes a channel region p6 of the sixth transistor T6, and in the direction perpendicular to the plane where the substrate sub is located, the channel region p6 of the sixth transistor T6 is at least partially overlapped with the first scanning line S1, and a region in which the first scanning line S1 is overlapped with the channel region p6 of the sixth transistor T6 is a gate g6 of the sixth transistor T6, and the gate g6 of the sixth transistor T6 is electrically connected to the first scanning line S1.

As shown in FIGS. 12, 11A, and 11D, the sixth transistor T6 includes the channel region p6 disposed in the active layer poly, and a first electrode p61 and a second electrode p12 connected to the channel region p6. The first electrode p61 of the sixth transistor T6 is electrically connected to the second reference voltage line Ref2 extending along the first direction X through a connecting structure K9 disposed in the metal layer M2.

As shown in FIGS. 12, 11A, and 11D to 11G, the second electrode p62 of the sixth transistor T6 is electrically connected to the anode RE of the light emitting element 20 through the connecting structure K4 disposed in the metal layer M2 and the connecting structure K5 disposed in the metal layer M3.

In an embodiment of the present disclosure, as shown in FIGS. 10, 12 and 11D, the display panel further includes: multiple third reference voltage lines Ref3 and multiple fourth reference voltage lines Ref4, where the multiple third reference voltage lines Ref3 and the fourth reference voltage lines Ref4 each extends along the second direction Y.

Each of the multiple third reference voltage lines Ref3 is electrically connected to the first reference voltage line Ref1 and each of the multiple fourth reference voltage lines Ref4 is electrically connected to the second reference voltage line Ref2.

As shown in FIGS. 12 and 11D, the third reference voltage lines Ref3 and the fourth reference voltage lines Ref4 may both be disposed in the metal layer M2, but the present disclosure is not limited thereto. In one embodiment, the third reference voltage lines Ref3 and the fourth reference voltage lines Ref4 may be disposed in the metal layer MC or in the metal layer M3, or in other optional metal layers, which will not be described herein.

As shown in FIGS. 12 and 11D, the third reference voltage lines Ref3 and the fourth reference voltage lines Ref4 are alternately arranged in the first direction X.

In one embodiment, as shown in FIGS. 12, 11C, and 11D, the first reference voltage lines Ref1 and the second reference voltage lines Ref2 disposed in the metal layer MC are alternately arranged in the second direction Y, the third reference voltage lines Ref3 and the fourth reference voltage lines Ref4 disposed in the metal layer M2 are alternately arranged in the first direction X, and, the first reference voltage line Ref1 disposed in the metal layer MC is electrically connected to the third reference voltage line Ref3 disposed in the metal layer M2 through a connecting structure Z1 and a connecting structure Z2. Similarly, the second reference voltage line Ref2 disposed in the metal layer MC is electrically connected to the fourth reference voltage line Ref4 disposed in the metal layer M2 through a connecting structure Z3 and a connecting structure Z4. That is, the first reference voltage line Ref1 and the third reference voltage line Ref3 are connected with a column being arranged therebetween, and the second reference voltage line Ref2 is connected to the fourth reference voltage line Ref4 with a column being arranged therebetween.

In this case, the first reference voltage line Ref1 extending along the first direction and the third reference voltage line Ref3 extending along the second direction form a grid structure, which facilitates reducing the voltage drop of the first reference voltage line Ref1 and the third reference voltage line Ref3, to achieve the objects of improving the display uniformity of the display panel and reducing power consumption.

Similarly, the second reference voltage line Ref2 extending along the first direction and the fourth reference voltage line Ref4 extending along the second direction form a grid structure, which facilitates reducing the voltage drop of the second reference voltage line Ref2 and the fourth reference voltage line Ref4, to achieve the objects of improving the display uniformity of the display panel and reducing the power consumption.

Referring to the pixel circuit 10 shown in FIG. 13, the gate initialization transistor T5 may be a double-gate transistor, i.e., the fifth transistor T5 may be a double-gate transistor. In an embodiment of the present disclosure, as shown in FIG. 12, the fifth transistor T5 may include a first sub-transistor T51 and a second sub-transistor T52. A first electrode of the first sub-transistor T51 is the first electrode of the fifth transistor T5, a second electrode of the first sub-transistor T51 is electrically connected to a first electrode of the second sub-transistor T52, and a second electrode of the second sub-transistor T52 is the second electrode of the fifth transistor T5.

As shown in FIG. 11A, the active layer poly includes a first sub-channel region p51, a second sub-channel region p52, and a first sub-connecting region p53. The first sub-channel region p51 and the second sub-channel region p52 are connected through the first sub-connecting region p53.

As shown in FIGS. 12, 11A and 11B, the first sub-channel region p51 is a channel region of the first sub-transistor T51, and in the direction perpendicular to a plane where the substrate sub is located, the first sub-channel region p51 is at least partially overlapped with the second scanning line SN1, and a region in which the second scanning line SN1 is overlapped with the first sub-channel region p51 is the gate g51 of the first sub-transistor T51, i.e., in the direction perpendicular to a plane in which the substrate sub is located, the first sub-channel region p51 is at least partially overlapped with the gate g51 of the first sub-transistor T51.

As shown in FIGS. 12, 11A and 11B, the second sub-channel region p52 is a channel region of the second sub-transistor T52, and in the direction perpendicular to a plane in which the substrate sub is located, the second sub-channel region p52 is at least partially overlapped with the second scanning line SN1, and a region in which the second scanning line SN1 is overlapped with the second sub-channel region p52 is the gate g52 of the second sub-transistor T51, i.e., in the direction perpendicular to a plane in which the substrate sub is located, the second sub-channel region p52 is at least partially overlapped with the gate g52 of the second sub-transistor T52.

As shown in FIG. 11A, the first sub-transistor T51 includes the first sub-channel region p51, and the first electrode p511 and the second electrode 522 connected to the first sub-channel region p51, and the second sub-transistor T52 includes the second sub-channel region p52, and the first electrode p521 and the second electrode p522 connected to the second sub-channel region p52. The first electrode p511 of the first sub-transistor T51 is the first electrode p511 of the fifth transistor T5, the second electrode p522 of the second sub-transistor T52 is the second electrode p522 of the fifth transistor T5, and the first sub-channel region p51 is electrically connected to the second sub-channel region p52 through the first sub-connecting region p53, and the second electrode p512 of the first sub-transistor T51 is electrically connected to the first electrode p521 of the second sub-transistor T52 through the first sub-connecting region p53.

Referring to the pixel circuit 10 shown in FIG. 13, the gate initialization transistor Q5 has a second node F2 at which the second electrode of the first sub-transistor T51 and the first electrode of the second sub-transistor T52 are connected with each other. Correspondingly, as shown in FIGS. 12 and 11A, in the fifth transistor T5, the second electrode p512 of the first sub-transistor T51 and the first electrode p521 of the second sub-transistor T52 are electrically connected through the first sub-connecting region p53, i.e., the first sub-connecting region p53 corresponds to the second node F2.

In one embodiment, as shown in FIGS. 12, 11A and 11C, the first sub-connecting region p53 is at least partially overlapped with the second reference voltage line Ref2 in the direction perpendicular to a plane in which the substrate sub is located.

That is, the pixel circuit 10 further includes a shielding capacitor C1. A schematic structural diagram of a corresponding pixel circuit 10 is shown in FIG. 13, and in conjunction with FIGS. 12, 11A, and 11C, a first plate C11 of the shielding capacitor C1 is a region in which the second reference voltage line Ref2 is overlapped with the first sub-connecting region p53 in a direction perpendicular to a plane in which the substrate sub is located, and a second plate C12 of the shielding capacitor C1 reuses the first sub-connecting region p53. In this case, the first plate C11 of the shielding capacitor C1 receives the second reference voltage signal VRef2, which is a constant voltage signal.

It should be noted that the fifth transistor T5 is a transistor of a double-gate structure, which facilitates reducing the leakage current of the fifth transistor T5 to the gate of the second transistor T2, and to maintain the stability of a gate potential of the second transistor T2.

Further, in the direction perpendicular to a plane in which the substrate sub is located, the first sub-connecting region p53 (corresponding to the second node F2) is at least partially overlapped with the second reference voltage line Ref2 to form the shielding capacitor C1, so that in the event of a change in the charge of the second node F2 caused by a change in the level on the second scanning line SN1, since the charge of the second node F2 is able to be stored in the shielding capacitor C1, the effect of the change in the charge of the second node F2 on the gate potential of the second transistor T2 can be reduced, to maintain the stability of the gate potential of the second transistor T2.

In an embodiment of the present disclosure, as shown in FIGS. 12 and 11C, the second reference voltage line Ref2 includes a first extension section Y1 and a second extension section Y2 which extend along the first direction X. In the direction perpendicular to the first direction X, a width of the first extension section Y1 is greater than a width of the second extension section Y2.

In the direction perpendicular to a plane in which the substrate sub is located, the first extension section Y1 is at least partially overlapped with the first sub-connecting region p53 to form the shielding capacitor C1.

As can be seen, in the second reference voltage line Ref2, the width of the first extension section Y1 being greater than the width of the second extension section Y2 can increase the area of a region in which the second reference voltage line Ref2 is overlapped with the first sub-connecting region p53, to increase the capacitance of the shielding capacitor C1, and further reducing the effect of the change of the charge of the second node F2 on the gate voltage of the second transistor T2.

In an embodiment of the present disclosure, as shown in FIGS. 10, 11A to 11F, and 12, the display panel further includes: multiple third scanning lines SN2 extending along the first direction X.

The pixel circuit 10 further includes a seventh transistor T7, a gate g7 of the seventh transistor T7 is electrically connected to the third scanning line SN2, a first electrode p711 of the seventh transistor T7 is electrically connected to the second electrode p22 of the second transistor T2, and a second electrode p722 of the seventh transistor T7 is electrically connected to the gate g2 of the second transistor T2.

As shown in FIGS. 12 and 11B, the third scanning line SN2 may be disposed in the metal layer M1.

Referring to the pixel circuit shown in FIG. 13, the seventh transistor T7 may be a compensation transistor Q7.

As shown in FIGS. 12, 11A, and 11B, the active layer poly includes a channel region p7 of the seventh transistor T7, and in the direction perpendicular to the plane where the substrate sub is located, the channel region p7 of the seventh transistor T7 is at least partially overlapped with the third scanning line SN2, and a region where the third scanning line SN2 is overlapped with the channel region p7 of the seventh transistor T7 is a gate g7 of the seventh transistor T7, and the gate g7 of the seventh transistor T7 is electrically connected to the third scanning line SN2.

As shown in FIGS. 12 and 11A, the seventh transistor T7 includes the channel region p7 disposed in the active layer poly, and a first electrode p711 and a second electrode p722 connected to the channel region p7. The first electrode p711 of the seventh transistor T7 is directly connected to the second electrode p22 of the second transistor T2 in the active layer poly.

As shown in FIGS. 12, 11A, 11B, and 11D, the second electrode p722 of the seventh transistor T7 is electrically connected to the gate g2 of the second transistor T2 through the connecting structure K7 disposed in the metal layer M2

Referring to the pixel circuit shown in FIG. 13, the compensation transistor T7 may be a double-gate transistor, i.e., the seventh transistor T7 may be a double-gate transistor. In an embodiment of the present disclosure, as shown in FIG. 12, the seventh transistor T7 includes a third sub-transistor T71 and a fourth sub-transistor T72. A first electrode of the third sub-transistor T71 is the first electrode of the seventh transistor T7, a second electrode of the third sub-transistor T71 is electrically connected to a first electrode of the fourth sub-transistor T72, and a second electrode of the fourth sub-transistor T72 is the second electrode of the seventh transistor T7.

As shown in FIG. 11A, the active layer poly includes a third sub-channel region p71, a fourth sub-channel region p72, and a second sub-connecting region p73. The third sub-channel region p71 and the fourth sub-channel region p72 are connected with each other through the second sub-connecting region p73.

As shown in FIGS. 12, 11A and 11B, the third sub-channel region p71 is a channel region of the third sub-transistor T71, and in the direction perpendicular to a plane in which the substrate sub is located, the third sub-channel region p71 is at least partially overlapped with the third scanning line SN2, and a region in which the third scanning line SN2 is overlapped with the third sub-channel region p71 is a gate g71 of the third sub-transistor T71, i.e., in the direction perpendicular to a plane in which the substrate sub is located, the third sub-channel region p71 is at least partially overlapped with the gate g71 of the third sub-transistor T71.

As shown in FIGS. 12, 11A and 11B, the fourth sub-channel region p72 is a channel region of the fourth sub-transistor T52, and in the direction perpendicular to a plane in which the substrate sub is located, the fourth sub-channel region p72 is at least partially overlapped with the third scanning line SN2, and a region in which the third scanning line SN2 is overlapped with the fourth sub-channel region p72 is a gate g72 of the fourth sub-transistor T72, i.e., in the direction perpendicular to a plane in which the substrate sub is located, the third sub-channel region p71 is at least partially overlapped with the gate g71 of the third sub-transistor T71.

As shown in FIG. 11A, the third sub-transistor T71 includes the third sub-channel region p71, and the first electrode p711 and the second electrode p722 connected to the third sub-channel region p71, and the fourth sub-transistor T72 includes the fourth sub-channel region p72, and the first electrode p711 and the second electrode p722 connected to the fourth sub-channel region p72. The first electrode p711 of the third sub-transistor T71 is the first electrode p711 of the seventh transistor T7, the second electrode p722 of the fourth sub-transistor T72 is the second electrode p722 of the seventh transistor T7, and the third sub-channel region p71 is electrically connected to the fourth sub-channel region p72 through the second sub-connecting region p73, and the second electrode p712 of the third sub-transistor T71 is electrically connected to the first electrode p721 of the fourth sub-transistor T72 through the second sub-connecting region p73.

Referring to the pixel circuit shown in FIG. 13, the compensation transistor T7 has a third node F3 at which the third sub-transistor T71 and the fourth sub-transistor T72 are connected with each other. Correspondingly, as shown in FIGS. 12 and 11A, in the seventh transistor T7, the second electrode p712 of the third sub-transistor T71 is connected to the first electrode p721 of the fourth sub-transistor T72 through the second sub-connecting region p73, i.e., the second sub-connecting region p73 corresponds to the third node F3.

In one embodiment, as shown in FIGS. 12 and 11B, the pixel circuit 10 further includes a shielding layer C21.

As shown in FIGS. 3, and 4A to 4C, the second sub-connecting region p73 is at least partially overlapped with the shielding layer C21 in the direction perpendicular to a plane in which the substrate sub is located.

That is, the third sub-connecting region p73 and the shielding layer C21 form a shielding capacitor C2. A schematic structural diagram of a corresponding pixel circuit 10 is shown in FIG. 13, and in conjunction with FIGS. 12, 11A, and 11C, a first plate C21 of the shielding capacitor C2 is the shielding layer C21 and is disposed in the metal layer MC, and a second plate C22 of the shielding capacitor C2 reuses the third sub-connecting region p73.

It should be noted that the seventh transistor T7 is a transistor of a double-gate structure, which facilitates reducing the leakage current from the seventh transistor T7 to the gate of the second transistor T2, and to maintain the stability of a gate potential of the second transistor T2.

Further, in the direction perpendicular to the plane where the substrate sub is located, the shielding layer C21 is at least partially overlapped with the second sub-connecting region p73 (corresponding to the third node F3) to form the shielding capacitor C2, so that in the event of a change in the charge of the third node F3 caused by a change in the level on the third scanning line SN2, since the charge of the third node F3 is able to be stored in the shielding capacitor C2, the effect of the change in the charge of the third node F3 on the gate potential of the second transistor T2 can be avoided, to maintain the stability of the gate potential of the second transistor T2.

Figure 14:
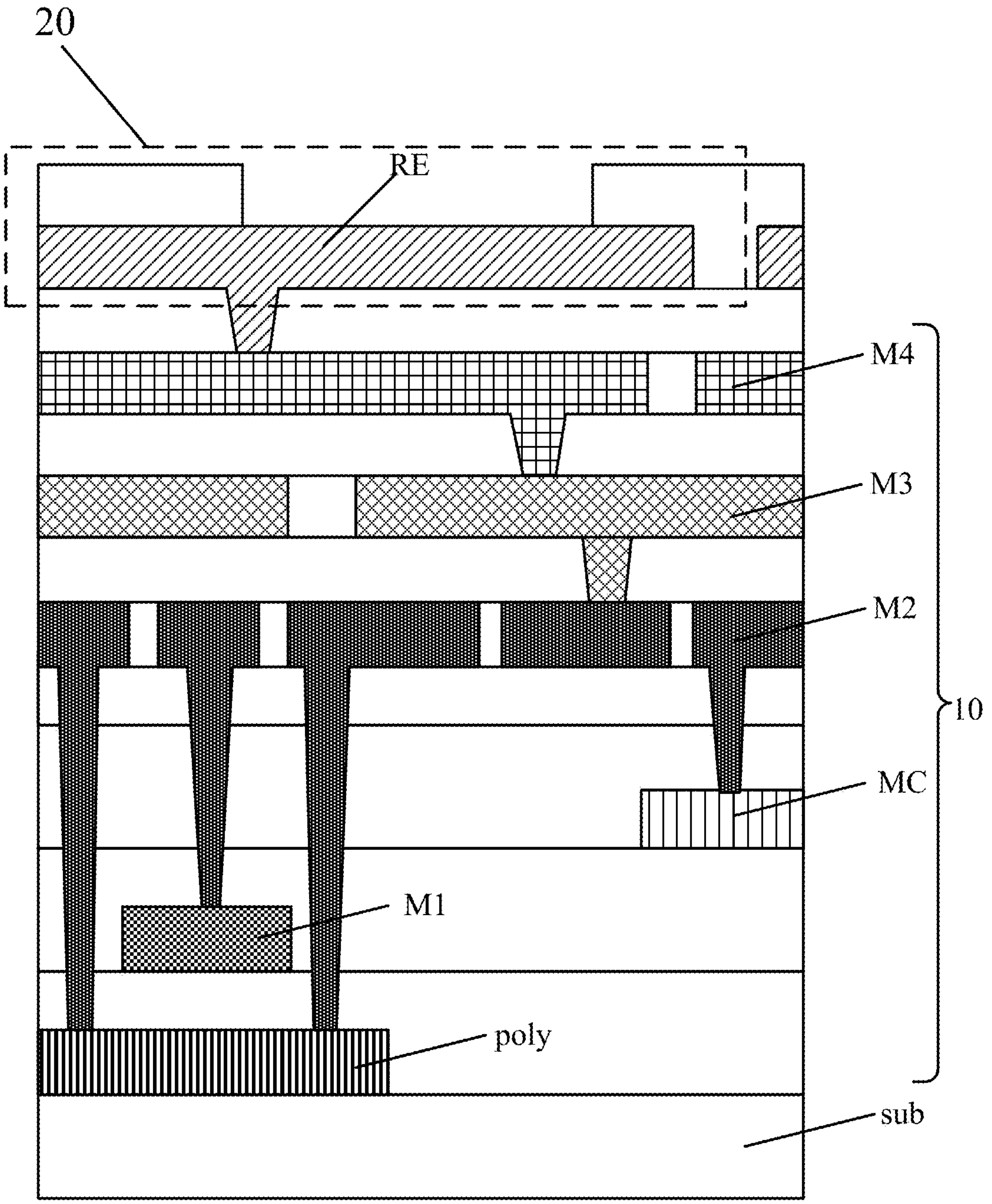
FIG. 14 is a schematic diagram showing a sectional structure of a display panel according to yet another embodiment of the present disclosure.

It should be noted that, as shown in FIGS. 12, 11C, and 11D, the first plate C21 (the shielding layer C21 disposed in the metal layer MC) of the shielding capacitor C2 is electrically connected to the first supply voltage line PVDD extending along the second direction Y through an internal connection point H4 and a connecting structure K10 disposed in the metal layer M2, to receive a constant voltage signal VPVDD. In one embodiment, in the direction perpendicular to a plane in which the substrate sub is located, the connecting structure K10 is electrically connected to the first supply voltage line PVDD in the same layer FIG. 14 is a schematic diagram showing a sectional structure of a display panel according to yet another embodiment of the present disclosure, as shown in FIG. 14, the display panel includes:

a substrate sub;

an active layer poly, disposed on one side of the substrate sub; and multiple layers of metal layer, disposed on one side, away from the substrate sub, of the active layer poly, the multiple layers of metal layer may include a metal layer M1, a metal layer MC, a metal layer M2, a metal layer M3, a metal layer M4, and a metal layer RE disposed sequentially in a direction away from the substrate sub, where the different metal layers are separated from each other by an insulating layer.

Figure 15:
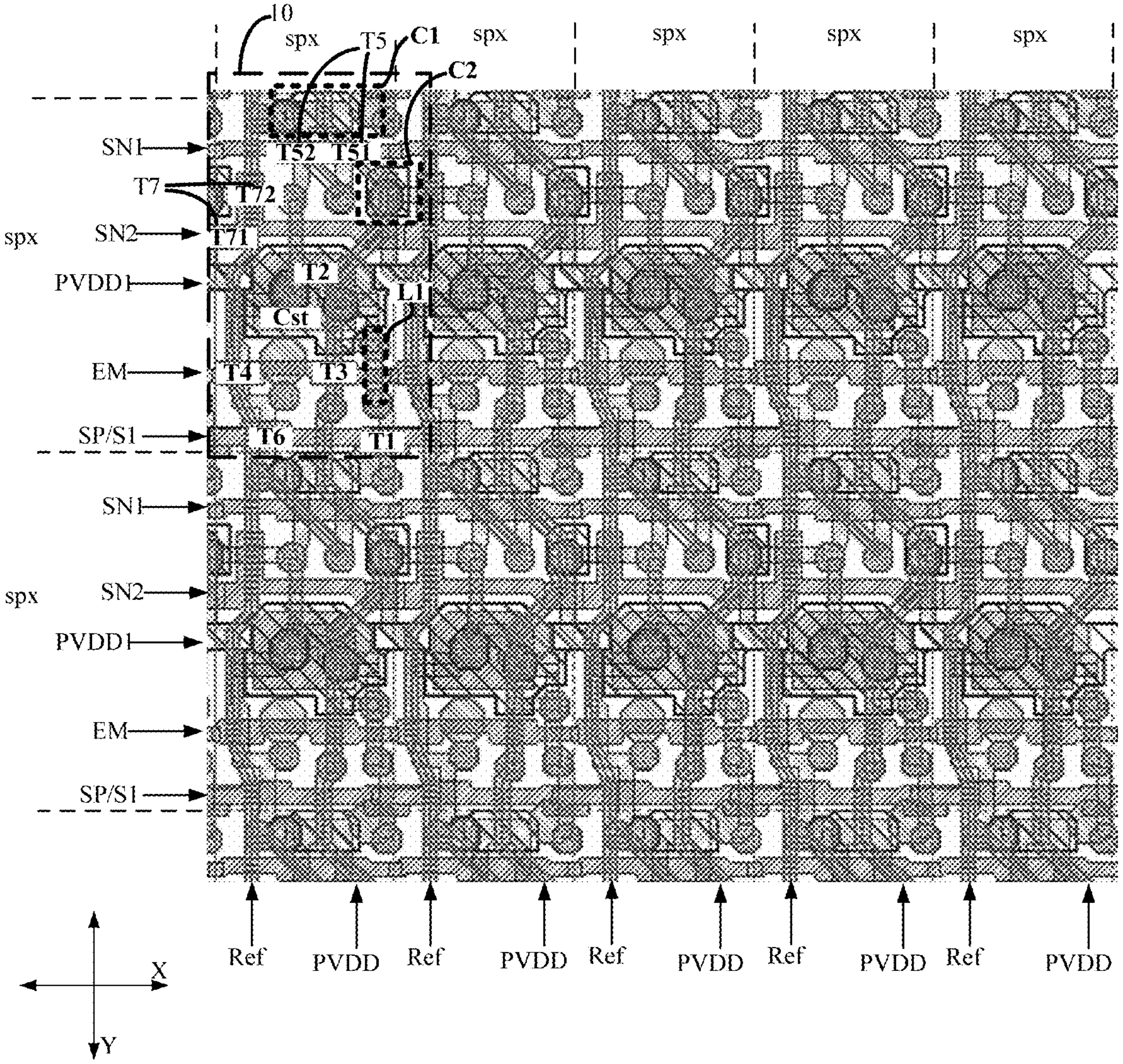
FIG. 15 is a schematic diagram showing a partial layout structure of a stack consisting of an active layer poly, a metal layer M1, a metal layer MC, and a metal layer M2 in a display panel according to yet another embodiment of the present disclosure.
Figure 16:
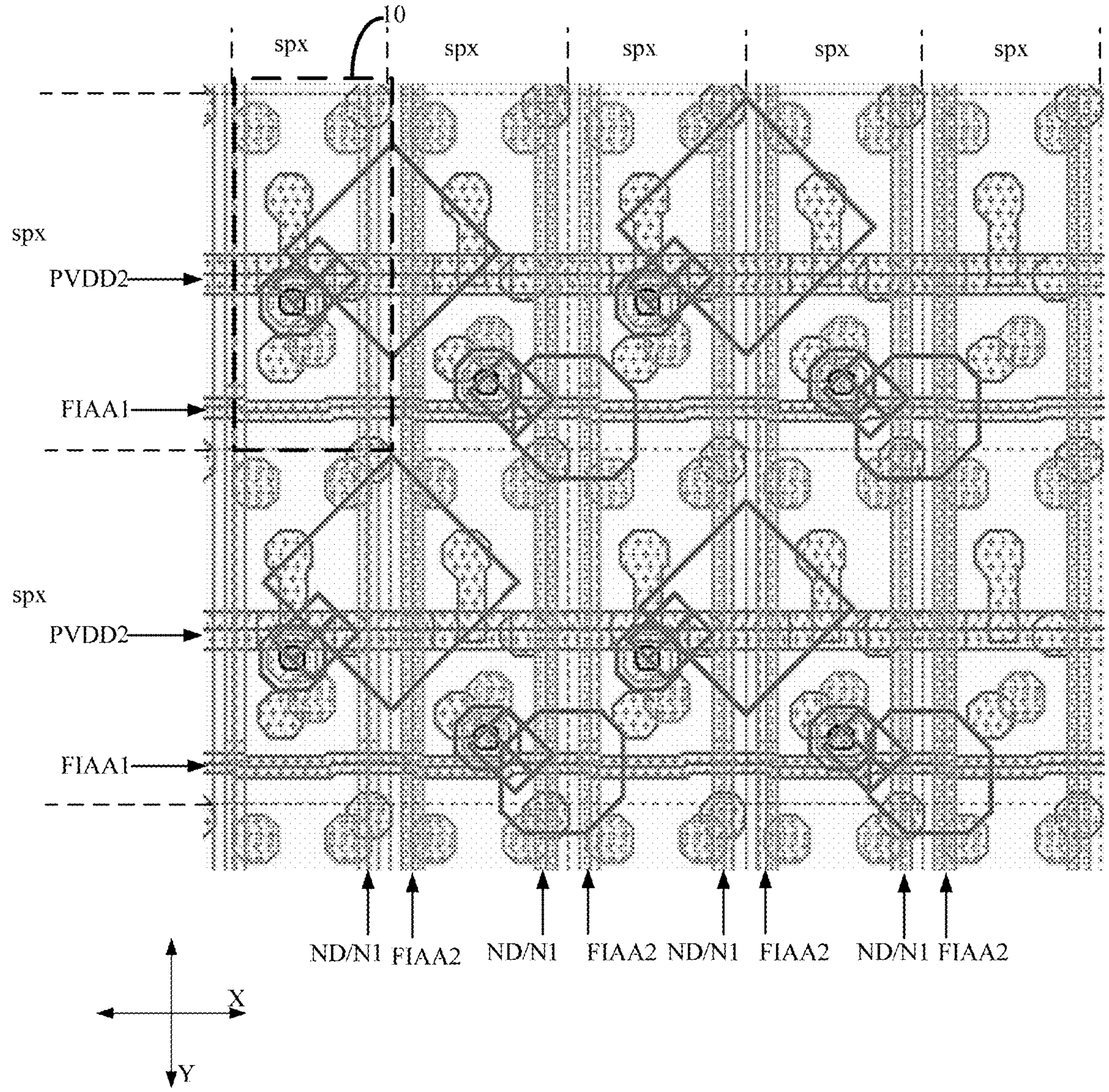
FIG. 16 is a schematic diagram showing a partial layout structure of a stack consisting of a metal layer M3, a metal layer M4 and a metal layer RE in a display panel according to yet another embodiment of the present disclosure.
Figure 17A:
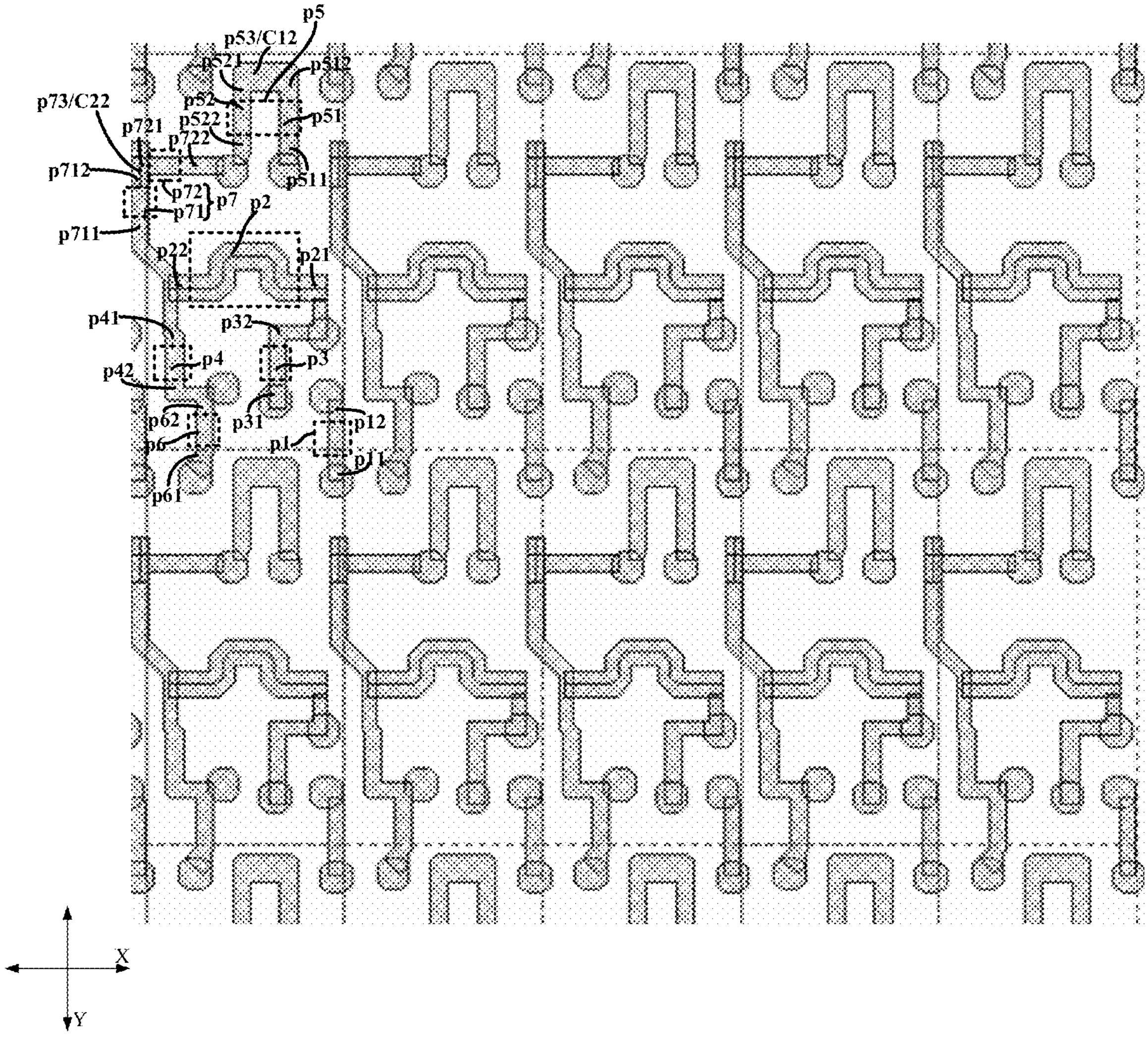
FIG. 17A is a schematic diagram showing the layout structure of the active layer poly in FIG. 15.
Figure 17B:
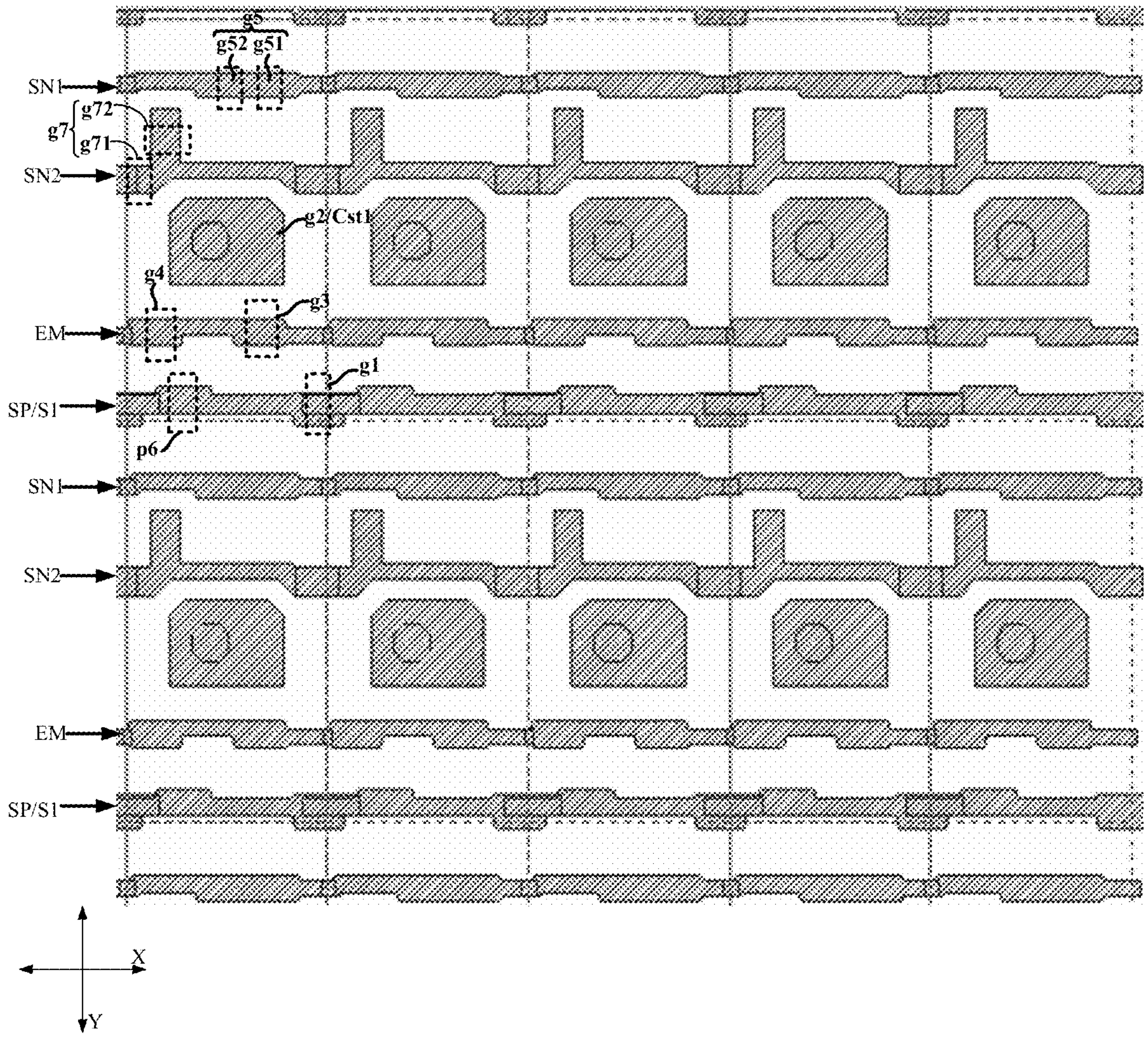
FIG. 17B is a schematic diagram showing the layout structure of the metal layer M1 in FIG. 15.
Figure 17C:
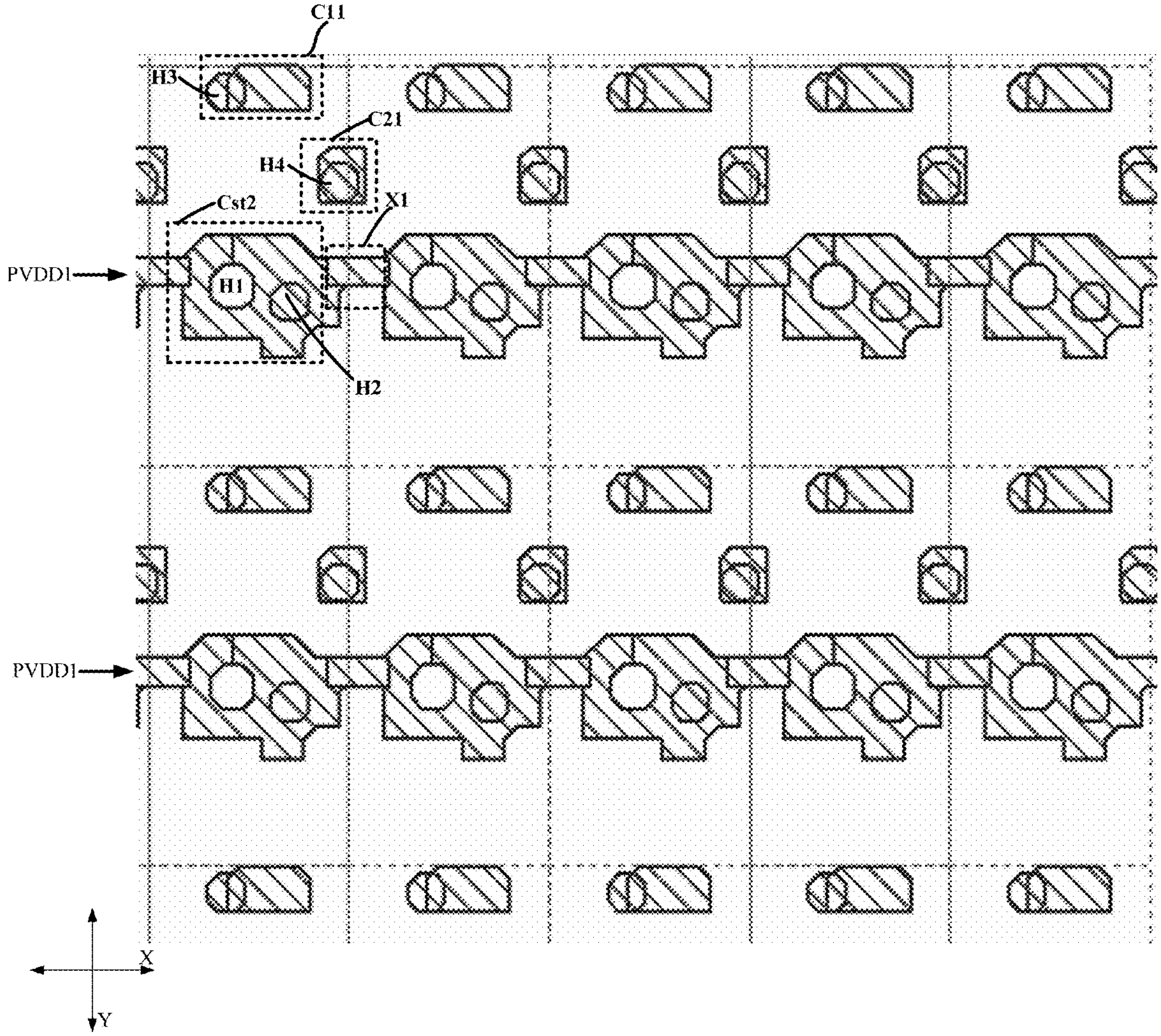
FIG. 17C is a schematic diagram showing the layout structure of the metal layer MC in FIG. 15.
Figure 17D:
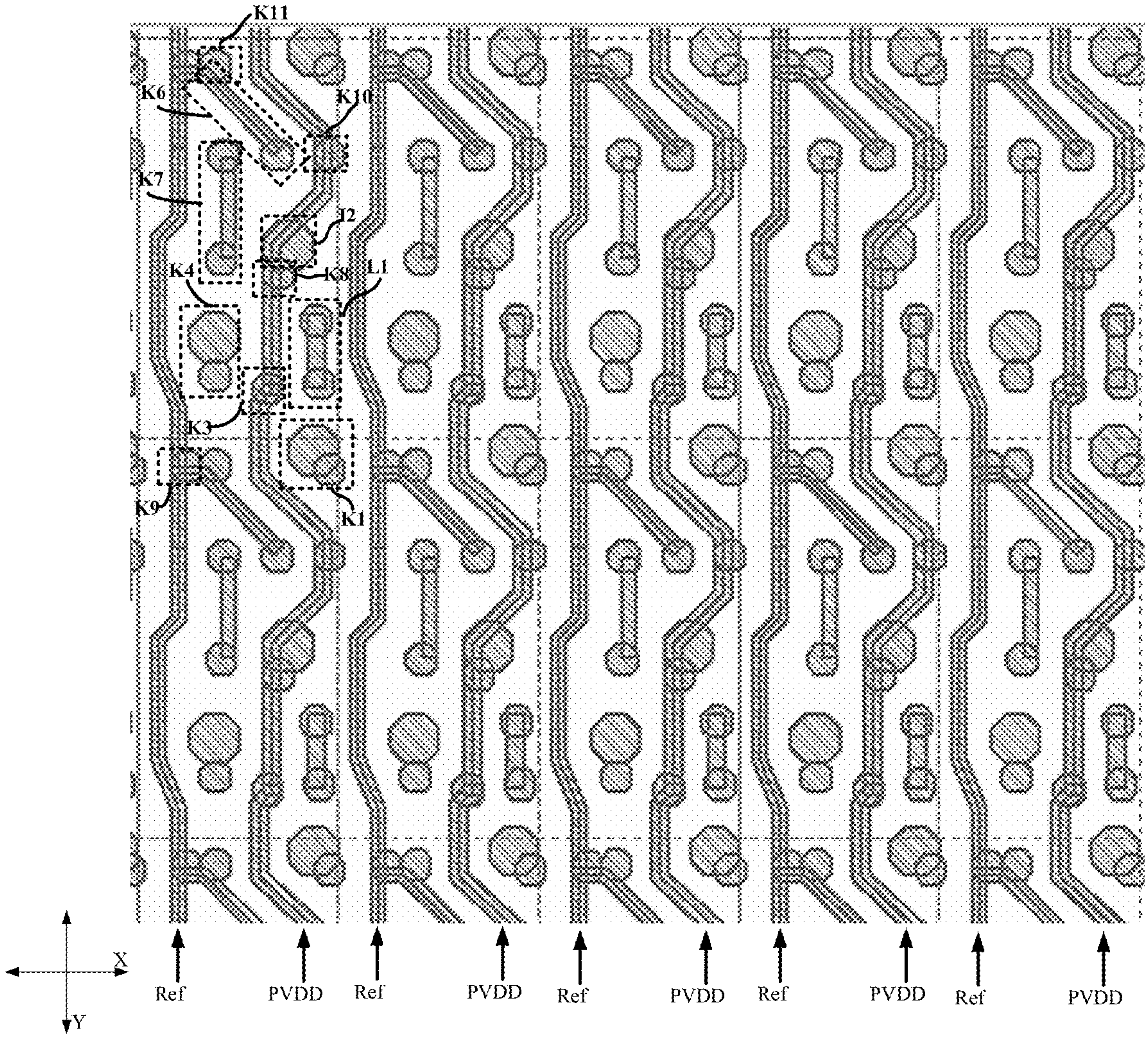
FIG. 17D is a schematic diagram showing the layout structure of the metal layer M2 in FIG. 15.
Figure 17E:
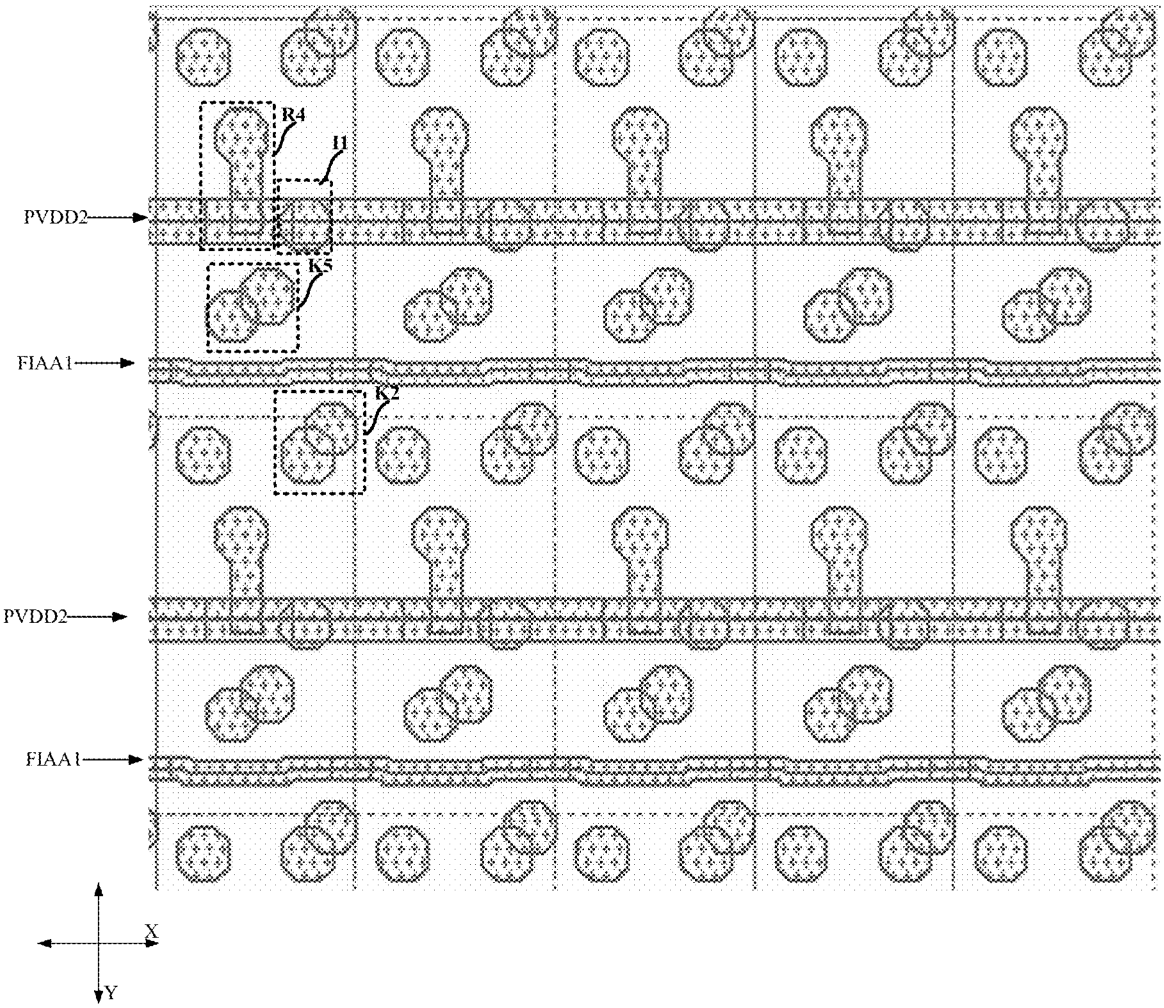
FIG. 17E is a schematic diagram showing the layout structure of the metal layer M3 in FIG. 16.
Figure 17F:
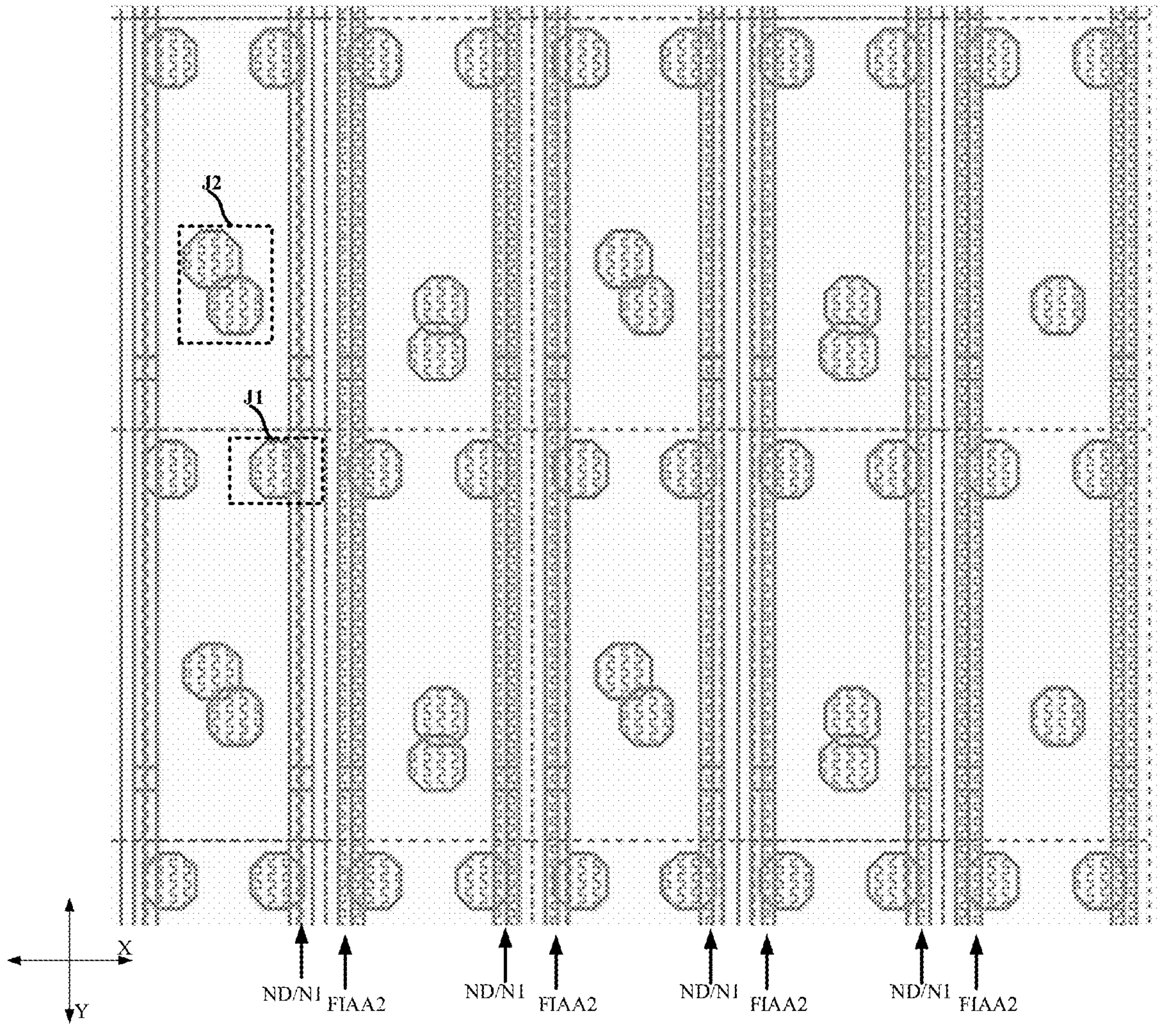
FIG. 17F is a schematic diagram showing the layout structure of the metal layer M4 in FIG. 16.
Figure 17G:
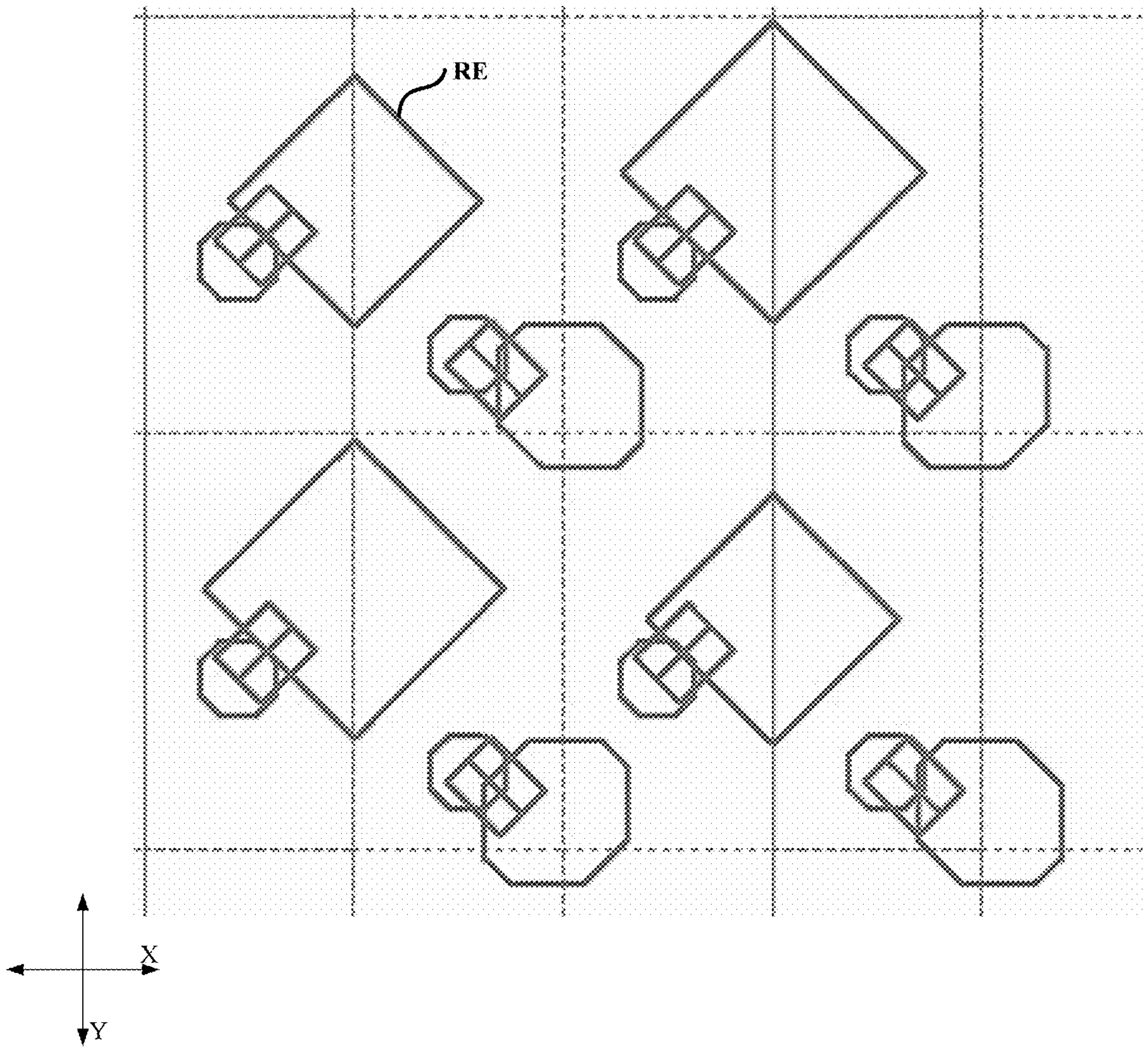
FIG. 17G is a schematic diagram showing the layout structure of the metal layer RE in FIG. 16.

FIG. 15 is a schematic diagram showing a partial layout structure of a stack consisting of an active layer poly, a metal layer M1, a metal layer MC and a metal layer M2 in a display panel according to yet another embodiment of the present disclosure, FIG. 16 is a schematic diagram showing a partial layout structure of a stack consisting of the metal layer M3, the metal layer M4 and the metal layer RE in the display panel, and FIGS. 17A to 17F are schematic diagrams showing partial layout structures of film layers in the display panel respectively. FIG. 17A is a schematic diagram showing the local layout structure of the active layer poly, FIG. 17B is a schematic diagram showing the local layout structure of the metal layer M1, FIG. 17C is a schematic diagram showing the local layout structure of the metal layer MC, FIG. 17D is a schematic diagram showing the local layout structure of the metal layer M2, FIG. 17E is a schematic diagram showing the local layout structure of the metal layer M3, FIG. 17F is a schematic diagram showing the local layout structure of the metal layer M4, and FIG. 17G is a schematic diagram showing the local layout structure of the metal layer RE.

As shown in FIGS. 15 and 16, the display panel includes multiple sub-pixels spx, multiple first scanning lines S1, and multiple first signal lines N1. Each of the first scanning lines S1 extends along a first direction X, and each of the first signal lines N1 extends along a second direction Y, and the first direction X and the second direction Y intersects with each other.

As shown in FIG. 14, each of the sub-pixels spx includes a pixel circuit 10 and a light-emitting element 20, and the pixel circuit 10 is used to drive the light-emitting element 20 to emit light.

As shown in FIGS. 15 and 16, the pixel circuit 10 includes a first transistor T1 and a second transistor T2, a gate of the first transistor T1 is electrically connected to the first scanning line S1, a first electrode of the first transistor T1 is electrically connected to the first signal line N1, a second electrode of the first transistor T1 is electrically connected to a first electrode of the second transistor T2 through a first connecting portion L1, and a second electrode of the second transistor T2 is electrically connected to the light emitting element 20.

The first connecting portion L1 is disposed on one side, away from the substrate sub, of the active layer poly.

It should be noted that the second electrode of the second transistor T2 being electrically connected to the light emitting element 20 includes the second electrode of the second transistor T2 being directly electrically connected to the light emitting element 20, or, In one embodiment, the second electrode of the second transistor T2 being indirectly electrically connected to the light emitting element 20. The second electrode of the second transistor T2 being indirectly electrically connected to the light emitting element 20 includes the second electrode of the second transistor T2 being electrically connected to the light emitting element 20 through other transistors or switches.

As shown in FIGS. 15 and 17B, the first scanning line S1 may be disposed in the metal layer M1.

As shown in FIGS. 16 and 17F, the first signal line N1 may be disposed in the metal layer M4.

As shown in FIGS. 14, 15 and 17D, the first connecting portion L1 may be disposed in the metal layer M2 on one side, away from the substrate sub, of the active layer poly.

As shown in FIGS. 15, 17A, and 17B, the active layer poly includes a channel region p1 of the first transistor T1. The channel region p1 of the first transistor T1 is at least partially overlapped with the first scanning line S1 in the direction perpendicular to a plane in which the substrate sub is located, and a region in which the first scanning line S1 is overlapped with the channel region p1 of the first transistor T1 is a gate g1 of the first transistor T1, and the gate g1 of the first transistor T1 is electrically connected to the first scanning line S1.

As shown in FIGS. 15, 16, 17A, and 17D-17F, the first transistor T1 includes a channel region p1 disposed in the active layer poly, and a first electrode p11 and a second electrode p12 connected to the channel region p1. The first electrode p11 of the first transistor T1 is electrically connected to the first signal line N1 through a connecting structure K1 disposed in the metal layer M2, a connecting structure K2 disposed in the metal layer M3, and a connecting structure J1 disposed in the metal layer M4 in sequence, so that the first transistor T1 is electrically connected to the first signal line N1.

As shown in FIGS. 15, 17A and 17D, the second electrode p12 of the first transistor T1 is electrically connected to a first electrode p21 of the second transistor T2 through the first connecting portion L1 disposed in the metal layer M2.

As shown in FIGS. 15, 17A and 17B, the active layer poly includes a channel region p2 of the second transistor T2, a gate g2 of the second transistor T2 is disposed in the metal layer M1, and in the direction perpendicular to a plane in which the substrate sub is located, the gate g2 of the second transistor T2 is at least partially overlapped with the channel region p2 of the second transistor T2.

As shown in FIGS. 15, 17A, and 17D, the second transistor T2 includes a channel region p2 disposed in the active layer poly, and a first electrode p21 and a second electrode p22 connected to the channel region p2. The first electrode p21 of the second transistor T2 is electrically connected to the second electrode p12 of the first transistor T1 through the first connecting portion L1 disposed in the metal layer M2, and the second electrode p22 of the second transistor T2 is electrically connected to the light emitting element 20.

As can be seen, in the display panel according to the embodiment of the present disclosure, since the first electrode p11 of the first transistor T1 is electrically connected to the first signal line N1, the second electrode p12 of the first transistor T1 is electrically connected to the first electrode p21 of the second transistor T2 through the first connecting portion L1, the second electrode p22 of the second transistor T2 is electrically connected to the light-emitting element 20, and the first connecting portion L1 is disposed at one side, away from the substrate sub, of the active layer poly, so that signals of the first signal line N1 can be transmitted through the first connecting portion L1 disposed between the second electrode p12 of the first transistor T1 and the first electrode p21 of the second transistor T2 and disposed in a different layer from the active layer poly. For example, the first connecting portion L1 is disposed in a metal layer, and the metal layer does not form an unwanted transistor with the active layer poly, which facilitates reducing the layout space of the sub-pixels, to facilitate adaptation to the demands for displaying in high resolution and high definition.

It should be emphasized that in FIGS. 15 and 17D, the first connecting portion L1 being disposed in the metal layer M2 is only illustrated as an example, but which metal layer at one side, away from the substrate sub, of the active layer poly the first connecting portion L1 is specifically disposed in is not limited in the present disclosure. For example, the first connecting portion L1 may be disposed in the metal layer M1, the metal layer MC, the metal layer M3, or the metal layer M4. In a case that the display panel further includes other metal film layers, the first connecting portion L1 may be disposed in other metal layers, as long as the first connecting portion L1 is not shorted to the other metal layers, which are not exhaustive herein.

As can be seen from the foregoing, with reference to the pixel circuit 10 shown in FIG. 7, the second transistor T2 may be a driving transistor Q2, and the first scanning line S1 may be a scanning line SP for providing a scanning signal VSP; the first transistor T1 may be a bias transistor Q8. In this case, the first signal line N1 may be an initialization voltage line for providing an initialization voltage signal VDVH; and the first transistor T1 may be a data writing transistor Q1. In this case, the first signal line N1 may be a data line ND for providing a data signal Vdata; and the first transistor T1 may be a first light-emitting control transistor Q3. In this case, the first signal line N1 may be an anode supply voltage line for providing an anode supply voltage signal VPVDD; the first transistor T1 may be other transistors that write a signal to the driving transistor Q2 through the first node F1, and the first signal line N1 is accordingly a signal line for writing the signal.

It should be noted that, as shown in FIG. 14, in a case that the first signal line N1 is the data line ND, the initialization voltage line, or the anode supply voltage line, the first signal line N1 may be disposed in the metal layer M4, in the metal layer M3, in the metal layer M2, or in other optional metal layers of the display panel, depending on the situations, as long as the first signal line N1 is not shorted to other signal lines.

The first transistor T1 being the data writing transistor T1, the first signal line N1 being the data line ND for providing the data signal Vdata, the second transistor T2 being the driving transistor T2, and the first scanning line S1 being the scanning line SP for providing the scanning signal VSP are described hereinafter as an example.

In an embodiment of the present disclosure, as shown in FIGS. 15, 16, and 17A to 17F, the display panel further includes: multiple light-emitting control lines EM extending along the first direction X; and multiple first supply voltage lines PVDD extending along the second direction Y.

The pixel circuit 10 further includes a third transistor T3 and a fourth transistor T4, a first electrode p31 of the third transistor T3 is electrically connected to the first supply voltage line PVDD, a second electrode p32 of the third transistor T3 is electrically connected to the first electrode p21 of the second transistor T2, a first electrode p41 of the fourth transistor T4 is electrically connected to the second electrode p22 of the second transistor T2, and a second electrode p42 of the fourth transistor T4 is electrically connected to the light-emitting element 20, and a gate g3 of the third transistor T3 and a gate g4 of the fourth transistor T4 each is electrically connected to the light-emitting control line EM.

The first connecting portion L1 is at least partially overlapped with the light-emitting control line EM in the direction perpendicular to a plane in which the substrate sub is located.

As shown in FIGS. 15 and 17B, the light-emitting control line EM may be disposed in the metal layer M1.

As shown in FIGS. 15 and 17D, the first supply voltage line PVDD may be disposed in the metal layer M2, but the present disclosure does not limit to this. In one embodiment, the first supply voltage line PVDD may be disposed in the metal layer MC, the metal layer M3 or the metal layer M4, or, In one embodiment, the first supply voltage line PVDD may be disposed in at least two of the metal layer M2, the metal layer M3, the metal layer M4, and the metal layer MC, which will not be described herein.

Referring to the pixel circuit 10 as shown in FIG. 5, the third transistor T3 may be a first light-emitting control transistor T3, the fourth transistor T4 may be a second light-emitting control transistor T4, and the gate of the third transistor T3 and the gate of the fourth transistor T4 each is electrically connected to the light-emitting control line EM to receive the light-emitting control signal VEM.

As shown in FIGS. 15, 17A and 17B, the active layer poly includes a channel region p3 of the third transistor T3, and in the direction perpendicular to a plane in which the substrate sub is located, the channel region p3 of the third transistor T3 is at least partially overlapped with the light-emitting control line EM, and a region in which the light-emitting control line EM is overlapped with the channel region p3 of the third transistor T3 is the gate g3 of the third transistor T3, so that the gate g3 of the third transistor T3 is electrically connected to the light-emitting control line EM.

As shown in FIGS. 15, 17A and 17D, the third transistor T3 includes a channel region p3 disposed in the active layer poly, and a first electrode p31 and a second electrode p32 connected to the channel region p3. The first electrode p31 of the third transistor T3 is electrically connected to the first supply voltage line PVDD through a connecting structure K3 disposed in the metal layer M2.

As shown in FIGS. 15 and 17A, the second electrode p32 of the third transistor T3 is directly electrically connected to the first electrode p21 of the second transistor T2 in the active layer poly.

As shown in FIGS. 15, 17A and 17B, the active layer poly includes a channel region p4 of the fourth transistor T4, in a direction perpendicular to a plane in which the substrate sub is located, the channel region p4 of the fourth transistor T4 is at least partially overlapped with the light-emitting control line EM, and a region in which the light-emitting control line EM is overlapped with the channel region p4 of the fourth transistor T4 is the gate g4 of the fourth transistor T4, and the gate g4 of the fourth transistor T4 is electrically connected to the light-emitting control line EM.

As shown in FIGS. 15 and 17A, the fourth transistor T4 includes the channel region p4 disposed in the active layer poly, and the first electrode p41 and the second electrode p42 connected to the channel region p4. The first electrode p41 of the fourth transistor T4 is directly electrically connected to the second electrode p22 of the second transistor T2 in the active layer poly.

As shown in FIGS. 15, 16, 17A, and 17D to 17F, the second electrode p42 of the fourth transistor T4 is electrically connected to the anode RE of the light-emitting element 20 through a connecting structure K4 disposed in the metal layer M2, a connecting structure K5 disposed in the metal layer M3, and a connecting structure J2 disposed in the metal layer M4 in sequence.

As shown in FIG. 15, the first connecting portion L1 is partially overlapped with the light-emitting control line EM in a direction perpendicular to a plane in which the substrate sub is located. In other words, on the basis that the second electrode p12 of the first transistor T1 and the first electrode p21 of the second transistor T2 are connected through the first connecting portion L1, the light-emitting control line EM may be arranged to be overlapped with the first connecting portion L1 in the direction perpendicular to a plane in which the substrate sub is located, to save the layout space of the sub-pixels and facilitating adaptation to the demands for displaying in high resolution and high definition.

In an embodiment of the present disclosure, the light-emitting control line EM is disposed in a first metal layer, the first connecting portion L1 is disposed in a second metal layer, and the second metal layer is disposed on one side, away from the substrate sub, of the first metal layer.

It should be understood that the light-emitting control line EM is to be electrically connected to the gate of the third transistor T3 and the gate of the fourth transistor T4, i.e., the light-emitting control line EM is to be overlapped with the channel region p3 of the third transistor T3 and the channel region p4 of the fourth transistor T4 in the direction perpendicular to a plane in which the substrate sub is located. Therefore, the light-emitting control line EM should be disposed nearer to the active layer poly than the first connecting portion L1. That is, the first connecting portion L1 should be disposed further from the active layer poly than the light-emitting control line EM.

In one embodiment, referring to FIG. 14, the light-emitting control line EM is disposed in the first metal layer, which may be the metal layer M1, and the first connecting portion L1 is disposed in the second metal layer, which may be the metal layer M2, the metal layer M3, the metal layer M4, or any other optional metal layers of the display panel, which will not be described herein.

In an embodiment of the present disclosure, as shown in FIGS. 15, 16, and 17A to 17F, the display panel further includes: multiple second scanning lines SN2 and multiple reference voltage lines Ref, where each of the multiple second scanning lines SN2 extends along the first direction X, and each of the multiple reference voltage lines Ref extends along the second direction Y.

The pixel circuit 10 further includes a fifth transistor T5, a gate g5 of the fifth transistor T5 is electrically connected to the second scanning line SN1, a first electrode p511 of the fifth transistor T5 is electrically connected to the reference voltage line Ref, and a second electrode p522 of the fifth transistor T5 is electrically connected to a gate of the second transistor T2.

The pixel circuit 10 further includes a sixth transistor T6, a gate g6 of the sixth transistor T6 is electrically connected to the first scanning line S1, a first electrode p61 of the sixth transistor T6 is electrically connected to the reference voltage line Ref, and a second electrode p62 of the sixth transistor T6 is electrically connected to the light emitting element 20.

As shown in FIGS. 15 and 17B, the second scanning line SN2 may be disposed in the metal layer M1.

As shown in FIGS. 15 and 17D, the difference from the display panel shown in FIG. 2 lie in that in the display panel according to the present embodiment, the reference voltage lines Ref extend along the second direction Y.

As shown in FIGS. 15 and 17D, the reference voltage line Ref may be disposed in the metal layer M2, but the present disclosure is not limited thereto, and the reference voltage line Ref may be disposed in the metal layer MC, in the metal layer M3, or in the metal layer M4, or in other optional metal layers, which will not be described herein.

As shown in the pixel circuit 10 of FIG. 5, the fifth transistor T5 may be the gate initialization transistor T5, and the sixth transistor T6 may be the anode initialization transistor T6, the first electrode of the fifth transistor T5 and the first electrode of the sixth transistor T6 each is electrically connected to the reference voltage line Ref to receive the reference voltage signal VRef.

As shown in FIGS. 15, 17A and 17B, the active layer poly includes a channel region p5 of the fifth transistor T5, and in the direction perpendicular to the plane where the substrate sub is located, the channel region p5 of the fifth transistor T5 is at least partially overlapped with the second scanning line SN1, and a region where the second scanning line SN1 is overlapped with the channel region p5 of the fifth transistor T5 is a gate g5 of the fifth transistor T5, and the gate g5 of the fifth transistor T5 is electrically connected to the second scanning line SN1.

As shown in FIGS. 15, 17A, and 17D, the fifth transistor T5 includes the channel region p5 disposed in the active layer poly, and the first electrode p511 and the second electrode p522 connected to the channel region p5. The first electrode p511 of the fifth transistor T5 is electrically connected to the reference voltage line Ref extending along the second direction Y through a connecting structure K6 disposed in the metal layer M2.

As shown in FIGS. 15, 17A, 17B, and 17D, the second electrode p522 of the fifth transistor T5 is electrically connected to the gate g2 of the second transistor T2 disposed in the metal layer M1 through a connecting structure K7 disposed in the metal layer M2.

It should be noted that, as can be seen in combination with the pixel circuit shown in FIG. 5, and the layout structure shown in FIGS. 15, 17B, and 17C, the gate g2 of the second transistor T2 disposed in the metal layer M1 serves simultaneously as the first plate Cst1 of the storage capacitor Cst, the second plate Cst2 of the storage capacitor Cst is disposed in the metal layer MC, and a via hole H1 is provided in the interior of the second plate Cst2 of the storage capacitor Cst, and the connecting structure K7 disposed in the metal layer M2 can be electrically connected to the gate g2 of the second transistor T2 disposed in the metal layer M1 through the via hole H1.

As shown in FIGS. 15, 17C, and 17D, in a row of pixel circuits 10 arranged in the first direction X, second plates Cst2 of the storage capacitors Cst are connected with each other through a connecting line segment X1 disposed in the metal layer MC, and the second plates Cst2 of the storage capacitors Cst are electrically connected to the first supply voltage line PVDD through an internal connection point H2 and a connecting structure K8 disposed in the metal layer M2, so that auxiliary supply voltage lines PVDD1 disposed in the metal layer MC are formed by the second plates Cst2 of the storage capacitors Cst arranged in a row in the first direction X and the connecting line segments X1 interconnected with the second plates Cst2, and a grid structure is formed by the auxiliary supply voltage lines PVDD1 and the first supply voltage lines PVDD disposed in the metal layer M2, which facilitates reducing the voltage drop (IR Drop) on the first supply voltage line PVDD to achieve the object of improving the display uniformity of the display panel and reducing power consumption.

As shown in FIGS. 15, 17A, and 17B, the active layer poly includes a channel region p6 of the sixth transistor T6, and in the direction perpendicular to the plane where the substrate sub is located, the channel region p6 of the sixth transistor T6 is at least partially overlapped with the first scanning line S1, and a region in which the first scanning line S1 is overlapped with the channel region p6 of the sixth transistor T6 is a gate g6 of the sixth transistor T6, and the gate g6 of the sixth transistor T6 is electrically connected to the first scanning line S1.

As shown in FIGS. 15, 17A, and 17D, the sixth transistor T6 includes the channel region p6 disposed in the active layer poly, and a first electrode p61 and a second electrode p12 connected to the channel region p6. The first electrode p61 of the sixth transistor T6 is electrically connected to the reference voltage line Ref extending along the second direction Y through a connecting structure K9 disposed in the metal layer M2.

As shown in FIGS. 15, 17A, and 17D to 17G, the second electrode p62 of the sixth transistor T6 is electrically connected to the anode RE of the light emitting element 20 through the connecting structure K4 disposed in the metal layer M2, the connecting structure K5 disposed in the metal layer M3, and a connecting structure J2 disposed in the metal layer M4.

Referring to the pixel circuit 10 shown in FIG. 5, the gate initialization transistor Q5 may be a double-gate transistor, i.e., the fifth transistor T5 may be a double-gate transistor. In an embodiment of the present disclosure, as shown in FIG. 15, the fifth transistor T5 may include a first sub-transistor T51 and a second sub-transistor T52. A first electrode of the first sub-transistor T51 is the first electrode of the fifth transistor T5, a second electrode of the first sub-transistor T51 is electrically connected to a first electrode of the second sub-transistor T52, and a second electrode of the second sub-transistor T52 is the second electrode of the fifth transistor T5.

As shown in FIG. 17A, the active layer poly includes a first sub-channel region p51, a second sub-channel region p52, and a first sub-connecting region p53. The first sub-channel region p51 and the second sub-channel region p52 are connected through the first sub-connecting region p53.

As shown in FIGS. 15, 17A and 17B, the first sub-channel region p51 is a channel region of the first sub-transistor T51, and in the direction perpendicular to a plane where the substrate sub is located, the first sub-channel region p51 is at least partially overlapped with the second scanning line SN1, and a region in which the second scanning line SN1 is overlapped with the first sub-channel region p51 is the gate g51 of the first sub-transistor T51, i.e., in the direction perpendicular to a plane in which the substrate sub is located, the first sub-channel region p51 is at least partially overlapped with the gate g51 of the first sub-transistor T51.

As shown in FIGS. 15, 17A and 17B, the second sub-channel region p52 is a channel region of the second sub-transistor T52, and in the direction perpendicular to a plane in which the substrate sub is located, the second sub-channel region p52 is at least partially overlapped with the second scanning line SN1, and a region in which the second scanning line SN1 is overlapped with the second sub-channel region p52 is the gate g52 of the second sub-transistor T51, i.e., in the direction perpendicular to a plane in which the substrate sub is located, the second sub-channel region p52 is at least partially overlapped with the gate g52 of the second sub-transistor T52.

As shown in FIG. 17A, the first sub-transistor T51 includes the first sub-channel region p51, and the first electrode p511 and the second electrode 522 connected to the first sub-channel region p51, and the second sub-transistor T52 includes the second sub-channel region p52, and the first electrode p521 and the second electrode p522 connected to the second sub-channel region p52. The first electrode p511 of the first sub-transistor T51 is the first electrode p511 of the fifth transistor T5, the second electrode p522 of the second sub-transistor T52 is the second electrode p522 of the fifth transistor T5, and the first sub-channel region p51 is electrically connected to the second sub-channel region p52 through the first sub-connecting region p53, and the second electrode p512 of the first sub-transistor T51 is electrically connected to the first electrode p521 of the second sub-transistor T52.

Referring to the pixel circuit 10 shown in FIG. 5, the gate initialization transistor T5 has a second node F2 at which the second electrode of the first sub-transistor T51 and the first electrode of the second sub-transistor T52 are connected with each other. Correspondingly, as shown in FIGS. 15 and 17A, in the fifth transistor T5, the second electrode p512 of the first sub-transistor T51 and the first electrode p521 of the second sub-transistor T52 are electrically connected through the first sub-connecting region p53, i.e., the first sub-connecting region p53 corresponds to the second node F2.

In one embodiment, as shown in FIGS. 15 and 17C, the pixel circuit 10 further includes a first shielding layer C11, and in a direction perpendicular to a plane in which the substrate sub is located, the first sub-connecting region p53 is at least partially overlapped with the first shielding layer C11, i.e., the first shielding layer C11 at least partially obscures the second node F2.

That is, the first sub-connecting region p53 and the first shielding layer C11 form the shielding capacitor C1, corresponding structure of the pixel circuit is shown in FIG. 8, and in conjunction with FIGS. 15, 17A, and 17C, the first plate C11 of the shielding capacitor C1 is the first shielding layer C11, which may be disposed in the metal layer MC, and the second plate C12 of the shielding capacitor C1 reuses the first sub-connecting region p53.

It should be noted that the fifth transistor T5 is a transistor of a double-gate structure, which facilitates reducing the leakage current of the fifth transistor T5 to the gate of the second transistor T2, and to maintain the stability of a gate voltage of the second transistor T2.

Further, in the direction perpendicular to a plane in which the substrate sub is located, the first shielding layer C11 is at least partially overlapped with the first sub-connecting region p53 (corresponding to the second node F2) to form the shielding capacitor C1, so that in the event of a change in the charge of the second node F2 caused by a change in the level on the second scanning line SN1, since the charge of the second node F2 is able to be stored in the shielding capacitor C1, the effect of the change in the charge of the second node F2 on the gate voltage of the second transistor T2 can be reduced, to maintain the stability of the gate voltage of the second transistor T2.

It is to be understood that the first plate C11 (i.e., the first shielding layer C11) of the shielding capacitor C1 should be connected to a constant voltage signal.

In an embodiment of the present disclosure, the first shielding layer C11 is electrically connected to the reference voltage line Ref, as shown in FIGS. 15, 17C and 17D.

In one embodiment, as shown in FIGS. 15, 17C and 17D, the first plate C11 (i.e., the first shielding layer C11) of the shielding capacitor C1 is disposed in the metal layer MC, and is electrically connected to the reference voltage line Ref extending along the second direction Y through a connection point H3 disposed in the metal layer MC and a connecting structure K11 disposed in the metal layer M2. In one embodiment, in a direction perpendicular to a plane in which the substrate sub is located, the connecting structure K10 is electrically connected to the reference voltage line Ref in the same layer.

Figure 18:
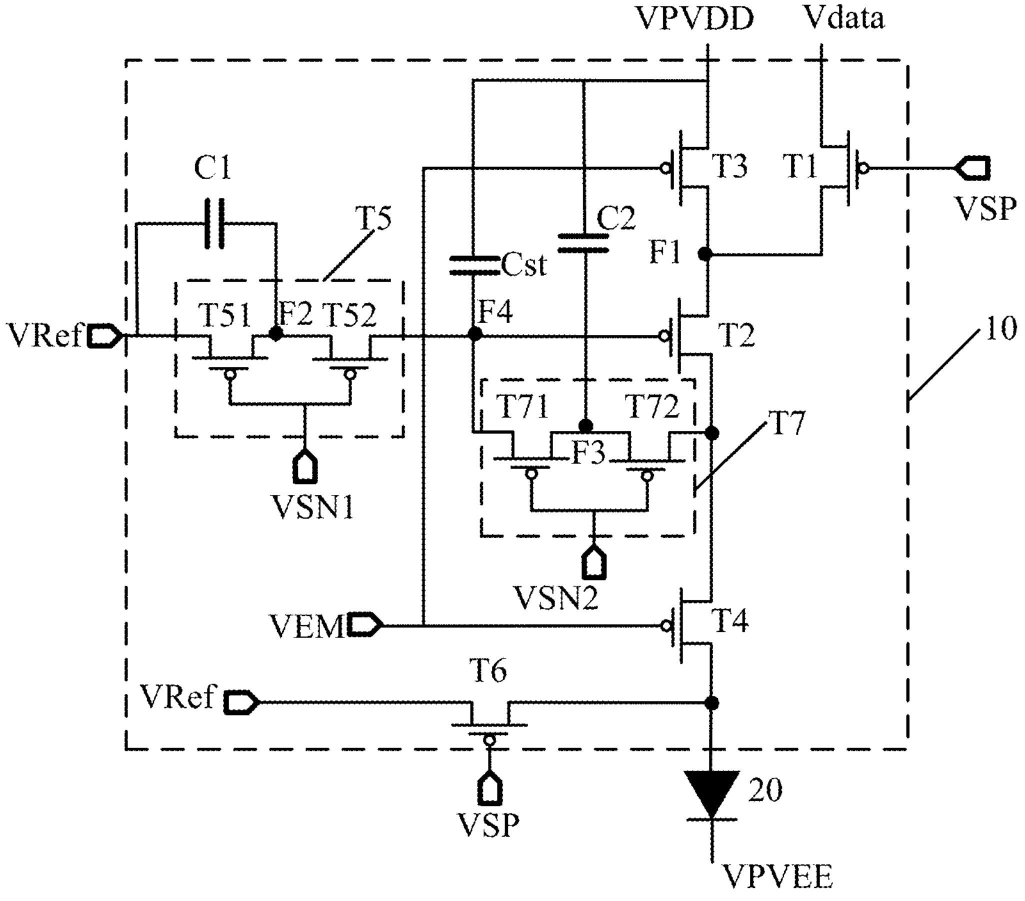
FIG. 18 is a schematic structural diagram of a pixel circuit according to yet another embodiment of the present disclosure.

In this case, corresponding structure of the pixel circuit is shown in FIG. 18, and as can be seen in conjunction with FIGS. 15, 17C and 17D, the first plate C11 (i.e., the first shielding layer C11) of the shielding capacitor C1 is connected to the reference voltage signal VRef provided by the reference voltage line Ref, and the reference voltage signal VRef is a constant voltage signal.

Figure 19:
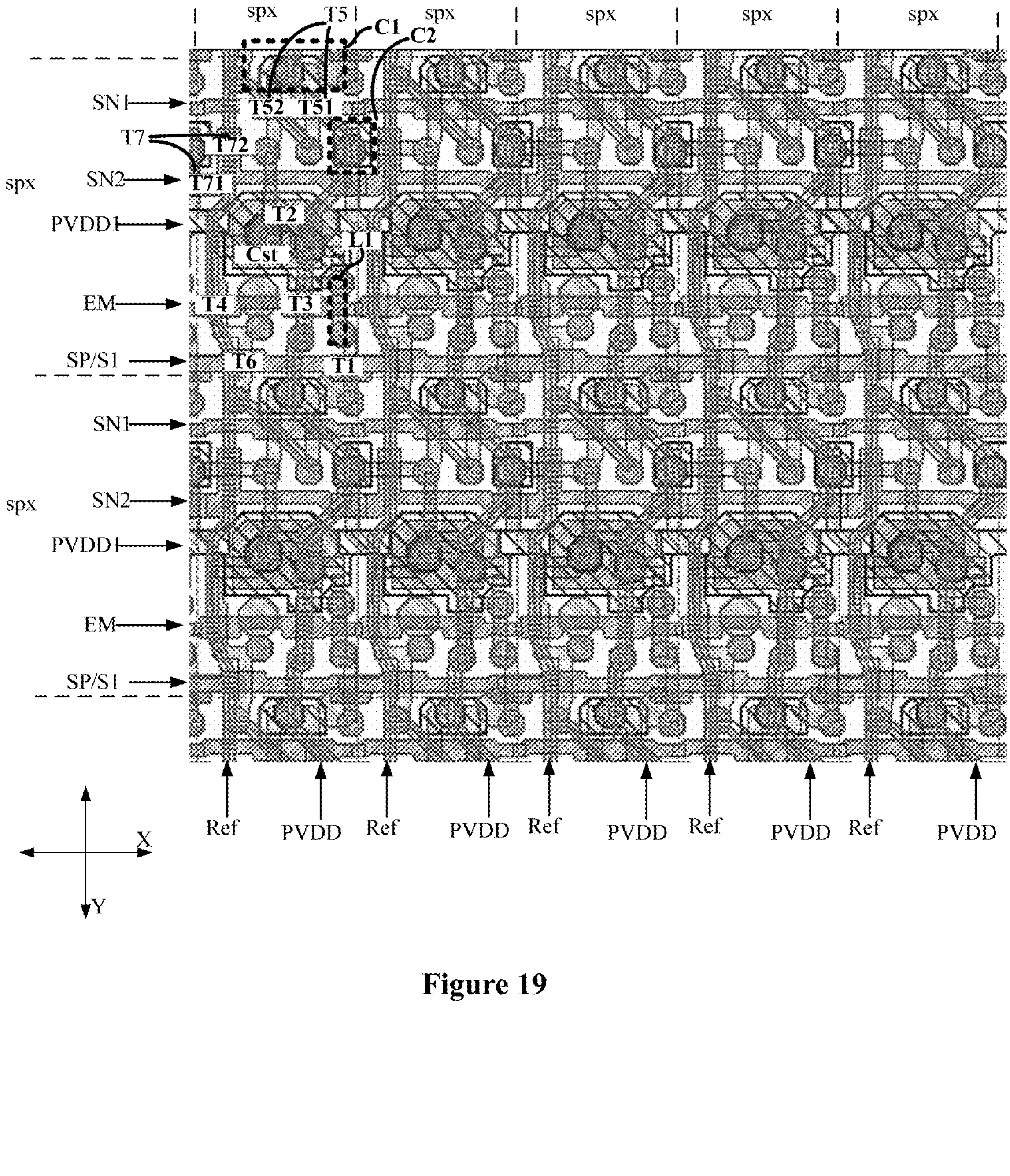
FIG. 19 is a schematic diagram showing a partial layout structure of a stack consisting of an active layer poly, a metal layer M1, a metal layer MC and a metal layer M2 according to yet another embodiment of the present disclosure.
Figure 20A:
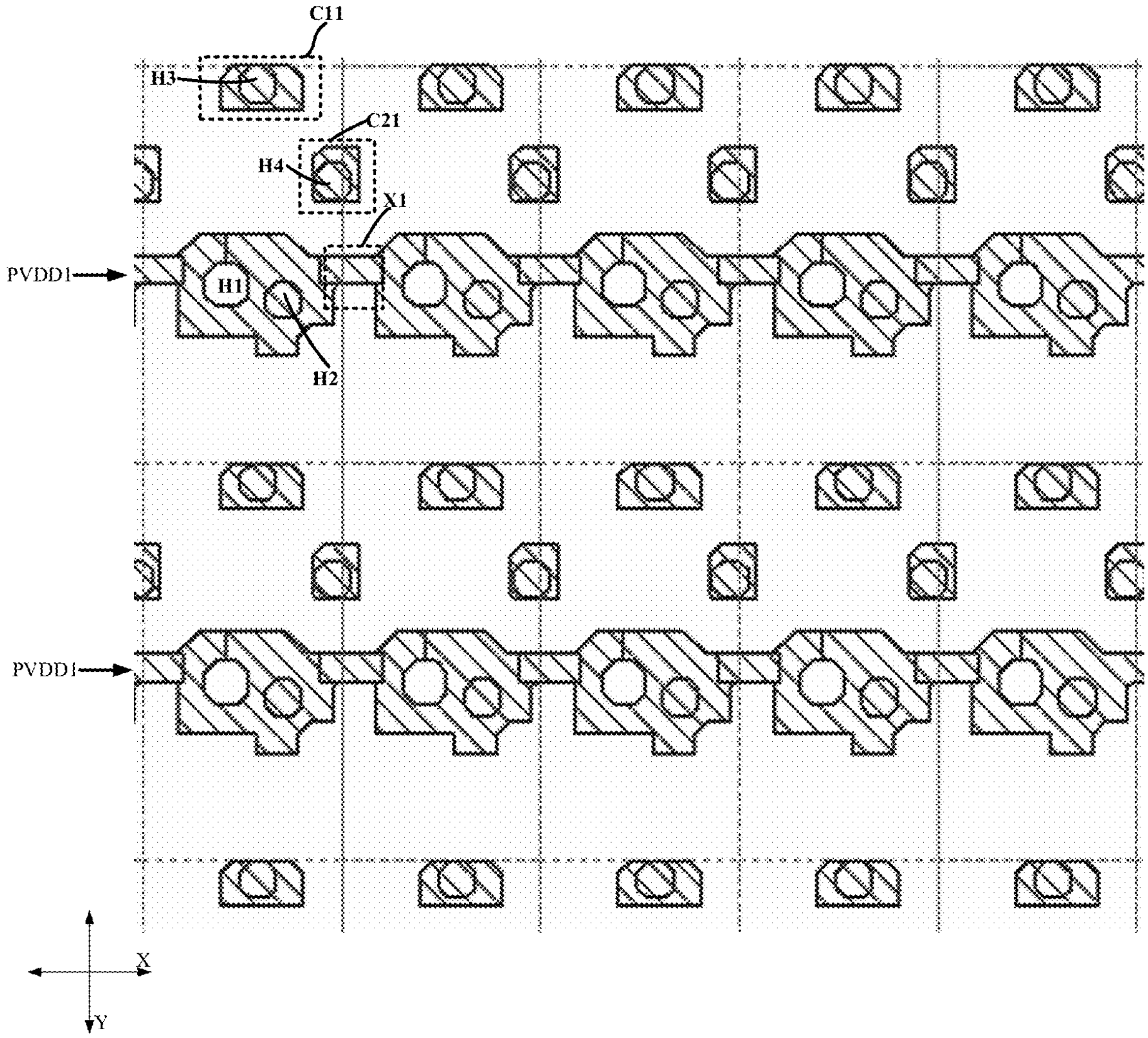
FIG. 20A is a schematic diagram showing the layout structure of the metal layer MC in FIG. 19.
Figure 20B:
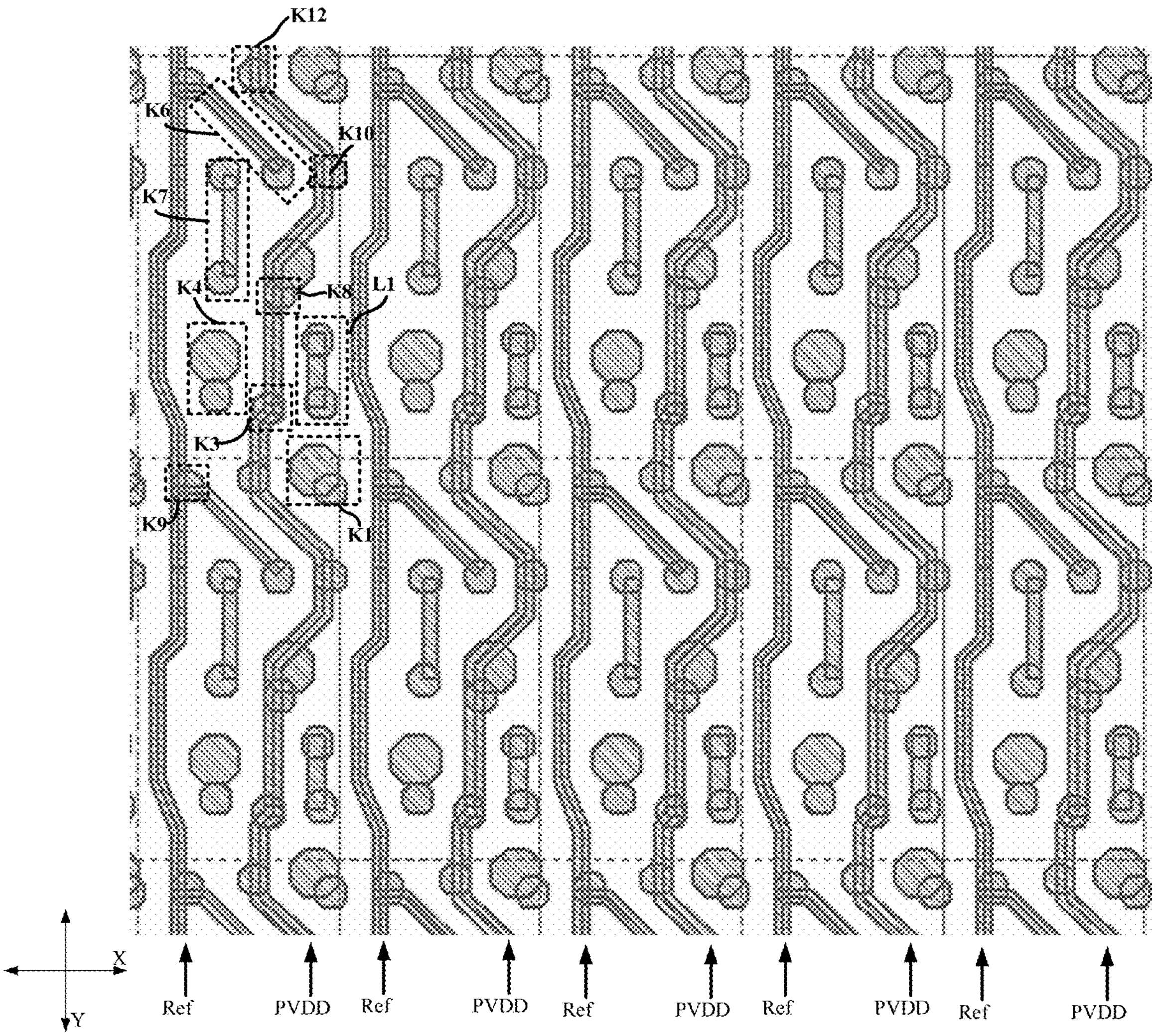
FIG. 20B is a schematic diagram showing the layout structure of the metal layer M2 in FIG. 19.

In another embodiment of the present disclosure, as shown in FIGS. 19, 20A and 20B, the display panel further includes: multiple first supply voltage lines PVDD extending along the second direction Y.

The first shielding layer C11 is electrically connected to the first supply voltage lines PVDD.

FIG. 19 is a schematic diagram showing a local layout structure of a stack consisting of a source layer poly, a metal layer M1, a metal layer MC, and a metal layer M2 in a display panel according to yet another embodiment of the present disclosure, FIG. 20A further illustrates a schematic diagram showing a local layout structure of the metal layer MC in the display panel, and FIG. 20B further illustrates a schematic diagram showing a local layout structure of the metal layer M2 in the display panel.

Unlike the display panel shown in FIG. 15, as shown in FIGS. 19, 20A, and 20B, in the display panel according to the embodiment, the first shielding layer C11 is not electrically connected to the reference voltage line Ref extending along the second direction Y, but is electrically connected to the first supply voltage line PVDD extending along the second direction Y In one embodiment, as shown in FIGS. 19, 20A, and 20B, the first plate C11 (i.e., the first shielding layer C11) of the shielding capacitor C1 is disposed in the metal layer MC, and is electrically connected to the first supply voltage line PVDD extending along the second direction Y through a connection point H3 disposed in the metal layer MC and a connecting structure K12 disposed in the metal layer M2. In one embodiment, in the direction perpendicular to a plane where the substrate sub is located, the connecting structure K10 is electrically connected to the first supply voltage line PVDD in the same layer.

Figure 21:
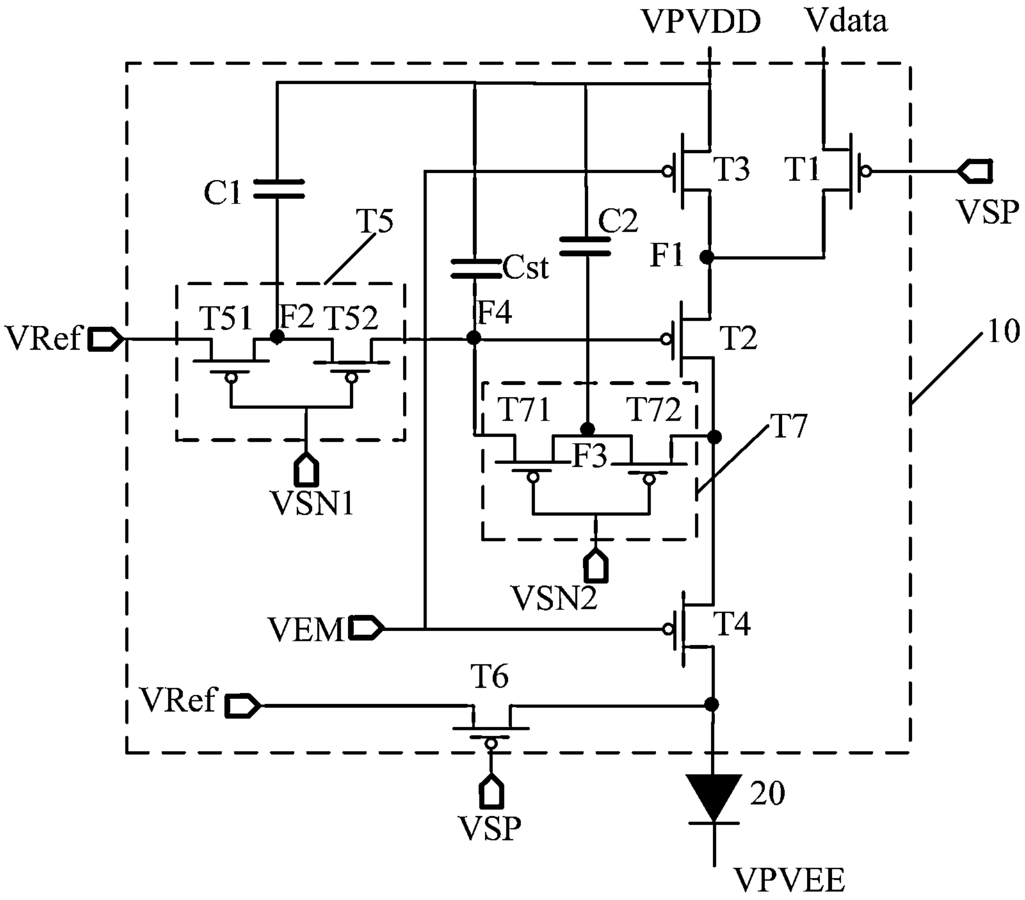
FIG. 21 is a schematic structural diagram of a pixel circuit according to yet another embodiment of the present disclosure.

In this case, corresponding structure of the pixel circuit is shown in FIG. 21, and as can be seen in conjunction with FIGS. 19, 20A, and 20B, the first plate C11 (i.e., the first shielding layer C11) of the shielding capacitor C1 is connected to the first supply voltage signal VPVDD provided by the first supply voltage line PVDD, and the first supply voltage signal VPVDD is a constant voltage signal.

It should be noted that in the display panels shown in FIG. 2 and FIG. 10, the reference voltage line (Ref/Ref1/Ref2) each extends along the first direction X. In the display panels shown in FIGS. 15, 16, and 19, the reference voltage line (Ref) extends along the second direction Y, i.e., corresponding to one row of pixel circuits 10 arranged along the first direction X, it is required to only correspondingly provide the first scanning line S1 extending along the first direction X, the second scanning line SN1, the light-emitting control line EM, and the subsequently mentioned third scanning line SN2, to shorten the space of the pixel circuits 10 in the second direction Y, which facilitates reducing the layout space of the sub-pixels, to facilitate adaptation to the requirement for displaying in high-resolution and high-definition.

In one embodiment, the sub-pixels in the display panel shown in FIGS. 2 and 10 may be FHD (Full High Definition) low frequency pixels, and the sub-pixels in the display panel shown in FIGS. 15, 16, and 19 may be WQHD (Wide Quad High Definition) low frequency pixels.

In an embodiment of the present disclosure, as shown in FIGS. 15, 16, and 17A to 17G, the display panel further includes: multiple third scanning lines SN2 extending along the first direction X.

The pixel circuit 10 further includes a seventh transistor T7, a gate g7 of the seventh transistor T7 is electrically connected to the third scanning line SN2, a first electrode p711 of the seventh transistor T7 is electrically connected to the second electrode p22 of the second transistor T2, and a second electrode p722 of the seventh transistor T7 is electrically connected to the gate g2 of the second transistor T2.

As shown in FIGS. 15 and 17B, the third scanning line SN2 may be disposed in the metal layer M1.

Referring to the pixel circuit shown in FIGS. 18 and 21, the seventh transistor T7 may be a compensation transistor T7.

As shown in FIGS. 15, 17A, and 17B, the active layer poly includes a channel region p7 of the seventh transistor T7, and in the direction perpendicular to a plane where the substrate sub is located, the channel region p7 of the seventh transistor T7 is at least partially overlapped with the third scanning line SN2, and a region where the third scanning line SN2 is overlapped with the channel region p7 of the seventh transistor T7 is a gate g7 of the seventh transistor T7, and the gate g7 of the seventh transistor T7 is electrically connected to the third scanning line SN2.

As shown in FIGS. 15 and 17A, the seventh transistor T7 includes the channel region p7 disposed in the active layer poly, and a first electrode p711 and a second electrode p722 connected to the channel region p7. The first electrode p711 of the seventh transistor T7 is directly connected to the second electrode p22 of the second transistor T2 in the active layer poly.

As shown in FIGS. 15, 17A, 17B, and 17D, the second electrode p722 of the seventh transistor T7 is electrically connected to the gate g2 of the second transistor T2 through the connecting structure K7 disposed in the metal layer M2

Referring to the pixel circuit shown in FIGS. 18 and 21, the compensation transistor T7 may be a double-gate transistor, i.e., the seventh transistor T7 may be a double-gate transistor. In an embodiment of the present disclosure, as shown in FIG. 15, the seventh transistor T7 may include a third sub-transistor T71 and a fourth sub-transistor T72. A first electrode of the third sub-transistor T71 is the first electrode of the seventh transistor T7, a second electrode of the third sub-transistor T71 is electrically connected to a first electrode of the fourth sub-transistor T72, and a second electrode of the fourth sub-transistor T72 is the second electrode of the seventh transistor T7.

As shown in FIG. 17A, the active layer poly includes a third sub-channel region p71, a fourth sub-channel region p72, and a second sub-connecting region p73. The third sub-channel region p71 and the fourth sub-channel region p72 are connected with each other through the second sub-connecting region p73.

As shown in FIGS. 15, 17A and 17B, the third sub-channel region p71 is a channel region of the third sub-transistor T71, and in the direction perpendicular to a plane in which the substrate sub is located, the third sub-channel region p71 is at least partially overlapped with the third scanning line SN2, and a region in which the third scanning line SN2 is overlapped with the third sub-channel region p71 is a gate g71 of the third sub-transistor T71, i.e., in the direction perpendicular to a plane in which the substrate sub is located, the third sub-channel region p71 is at least partially overlapped with the gate g71 of the third sub-transistor T71.

As shown in FIGS. 15, 17A and 17B, the fourth sub-channel region p72 is a channel region of the fourth sub-transistor T52, and in the direction perpendicular to a plane in which the substrate sub is located, the fourth sub-channel region p72 is at least partially overlapped with the third scanning line SN2, and a region in which the third scanning line SN2 is overlapped with the fourth sub-channel region p72 is a gate g72 of the fourth sub-transistor T72, i.e., in the direction perpendicular to a plane in which the substrate sub is located, the fourth sub-channel region p72 is at least partially overlapped with the gate g72 of the fourth sub-transistor T72.

As shown in FIG. 17A, the third sub-transistor T71 includes the third sub-channel region p71, and the first electrode p711 and the second electrode p722 connected to the third sub-channel region p71, and the fourth sub-transistor T72 includes the fourth sub-channel region p72, and the first electrode p711 and the second electrode p722 connected to the fourth sub-channel region p72. The first electrode p711 of the third sub-transistor T71 is the first electrode p711 of the seventh transistor T7, the second electrode p722 of the fourth sub-transistor T72 is the second electrode p722 of the seventh transistor T7, and the third sub-channel region p71 is electrically connected to the fourth sub-channel region p72 through the first sub-connecting region p73, and the second electrode p712 of the third sub-transistor T71 is electrically connected to the first electrode p721 of the fourth sub-transistor T72 through the second sub-connecting region p73.

Referring to the pixel circuit shown in FIGS. 18 and 21, the compensation transistor T7 has a third node F3 at which the third sub-transistor T71 and the fourth sub-transistor T72 are connected with each other. Correspondingly, as shown in FIGS. 15 and 17A, in the seventh transistor T7, the second electrode p712 of the third sub-transistor T71 is connected to the first electrode p721 of the fourth sub-transistor T72 through the second sub-connecting region p73, i.e., the second sub-connecting region p73 corresponds to the third node F3.

In one embodiment, as shown in FIGS. 15 and 17C, the pixel circuit 10 further includes a second shielding layer C21, and the second sub-connecting region p73 is at least partially overlapped with the second shielding layer C21 in the direction perpendicular to a plane in which the substrate sub is located, that is, the second shielding layer C21 at least partially obscure the third node F3.

That is, the third sub-connecting region p73 and the second shielding layer C21 form a shielding capacitor C2. The corresponding structure of the pixel circuit 10 is shown in FIG. 18 or 21, and in conjunction with FIGS. 15, 17A, and 17C, a first plate C21 of the shielding capacitor C2 is the second shielding layer C21 and is disposed in the metal layer MC, and a second plate C22 of the shielding capacitor C2 reuses the third sub-connecting region p73.

It should be noted that the seventh transistor T7 is a transistor of a double-gate structure, which facilitates reducing the leakage current from the seventh transistor T7 to the gate of the second transistor T2, and to maintain the stability of a gate potential of the second transistor T2.

Further, in the direction perpendicular to the plane where the substrate sub is located, the second shielding layer C21 is at least partially overlapped with the second sub-connecting region p73 (corresponding to the third node F3) to form the shielding capacitor C2, so that in the event of a change in the charge of the third node F3 caused by a change in the level on the third scanning line SN2, since the charge of the third node F3 is able to be stored in the shielding capacitor C2, the effect of the change in the charge of the third node F3 on the gate potential of the second transistor T2 can be avoided, to maintain the stability of the gate potential of the second transistor T2.

It should be noted that, as shown in FIGS. 15, 17C, and 17D, the second shielding layer C21 disposed in the metal layer MC is electrically connected to the first supply voltage line PVDD extending along the second direction Y through an internal connection point H4 and a connecting structure K10 disposed in the metal layer M2, to receive a constant voltage signal VPVDD. In one embodiment, in the direction perpendicular to a plane in which the substrate sub is located, the connecting structure K10 is electrically connected to the first supply voltage line PVDD in the same layer.

On the basis of any of the above embodiments, in an embodiment of the present disclosure, as shown in FIGS. 15 and 16, the multiple pixel circuits 10 are arranged in an array in the first direction X and the second direction Y, i.e., the multiple pixel circuits 10 form multiple columns of pixel circuits arranged in the first direction X, and multiple rows of pixel circuits arranged in the second direction Y.

As shown in FIGS. 15 and 16, the row of pixel circuits 10 are electrically connected to at least one first signal line N1, the first signal line N1 being a data line ND.

Figure 22:
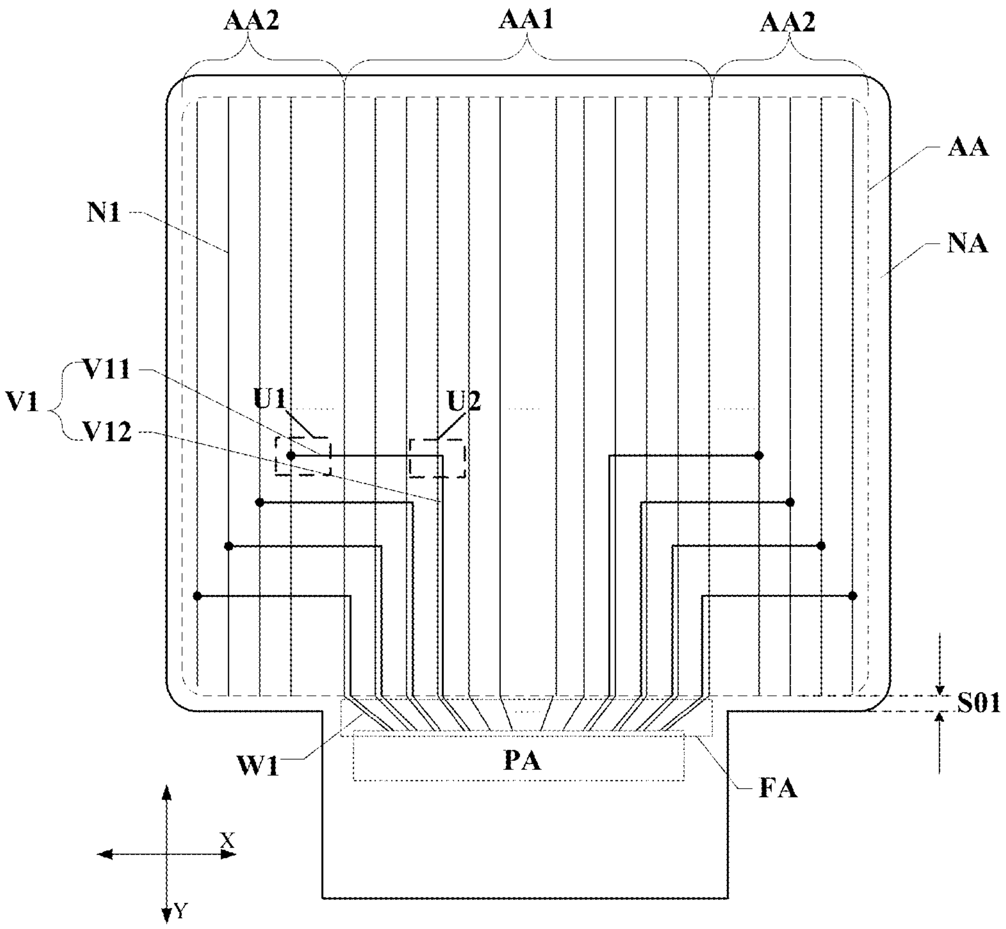
FIG. 22 is a schematic top view of a display panel according to an embodiment of the present disclosure.

FIG. 22 illustrates a schematic top view of a display panel according to an embodiment of the present disclosure. As shown in FIG. 22, the display panel further includes: a display region AA and a non-display region NA at least partially surrounding the display region AA, the non-display region NA includes a first fan-out region FA disposed on one side of the display region AA in the second direction Y, and the first fan-out region FA includes multiple fan-out wirings W1.

The display region AA includes a first display region AA1 and a second display region AA2, the second display region AA2 is disposed on at least one side of the first display region AA1 in the first direction X; the first display region AA1 and the second display region AA2 each includes multiple first signal lines N1, and the multiple first signal lines N1 are electrically connected to the fan-out wirings W1, where the multiple first signal lines N1 in the second display region AA2 are electrically connected to the fan-out wirings W1 through connecting wirings V1.

The connection wirings V1 are disposed in the display region AA and each includes a first connecting line segment V11 extending along the first direction X and a second connecting line segment V12 extending along the second direction Y The second connecting line segments V12 are electrically connected to the fan-out wirings W1, and the first connecting line segments V11 are electrically connected to the multiple first signal lines N1 in the second display region AA2.

As shown in FIG. 22, the first signal line N1 in the first display region AA1 extends directly to the position of the first fan-out region FA to be electrically connected with the fan-out wiring W1 in the first fan-out region FA, and the first signal line N1 in the second display region AA2 is electrically connected with the fan-out wiring W1 in the first fan-out region FA through the connecting wire segment V1 disposed in the display region AA. In one embodiment, the first signal line N1 in the second display region AA2 is electrically connected to the fan-out wiring W1 in the first fan-out region FA through the first connecting line segment V11 extending along the first direction X, and then through the second connecting line segment V12 extending along the second direction Y In this manner, it is achieved that a part of the fan-out wirings is laid out in the display region (Fanout in AA, FIAA) and not to require the fan-out wirings W1 to be laid out near a lower left border and/or a lower right border of the display panel, which facilitates realization of a narrow bezel of the display panel, and in particular, the width S01 of a lower bezel of the display panel can be significantly reduced.

It should be noted that in FIG. 22, the number of first signal lines N1 in the first display region AA1 and the second display region AA2 is only illustrative, and does not represent the actual number of first signal lines N1 included. Similarly, the number of fan-out wirings W1 in the first fan-out region FA is only schematic and does not represent the actual number of fan-out wirings W1 included.

As shown in FIG. 22, the first display region AA1 is disposed in the middle region of the display panel, and the second display region AA2 is disposed on at least one side of the first display region AA1 in the first direction X. That is, it is disposed on one or both sides of the first display region AA1 in the first direction X. FIG. 22 is illustrated only by way of example in which the second display region AA2 is provided on both sides of the first display region AA1.

As shown in FIG. 22, the display panel further includes a pin region PA, the pin region PA is bound and connected to a control chip. In practical application, the pin region PA will be reflexed to a non-glare surface of the display panel to reduce the width of the lower bezel of the display panel.

It also should be noted that, as shown in FIG. 22, the overlapping relationship between the first connecting line segment V11 and the first signal line N1 through which the first connecting line segment V11 passes in the first direction X does not mean that the two are electrically connected. In fact, the first connecting line segment V11 extending along the first direction X cannot be electrically connected to the first signal line N1 through which the first connecting line segment V11 passes, and thus the first connecting line segment V11 extending along the first direction X and the first signal line N1 extending along the second direction Y should be disposed in different metal layers.

Figure 23:
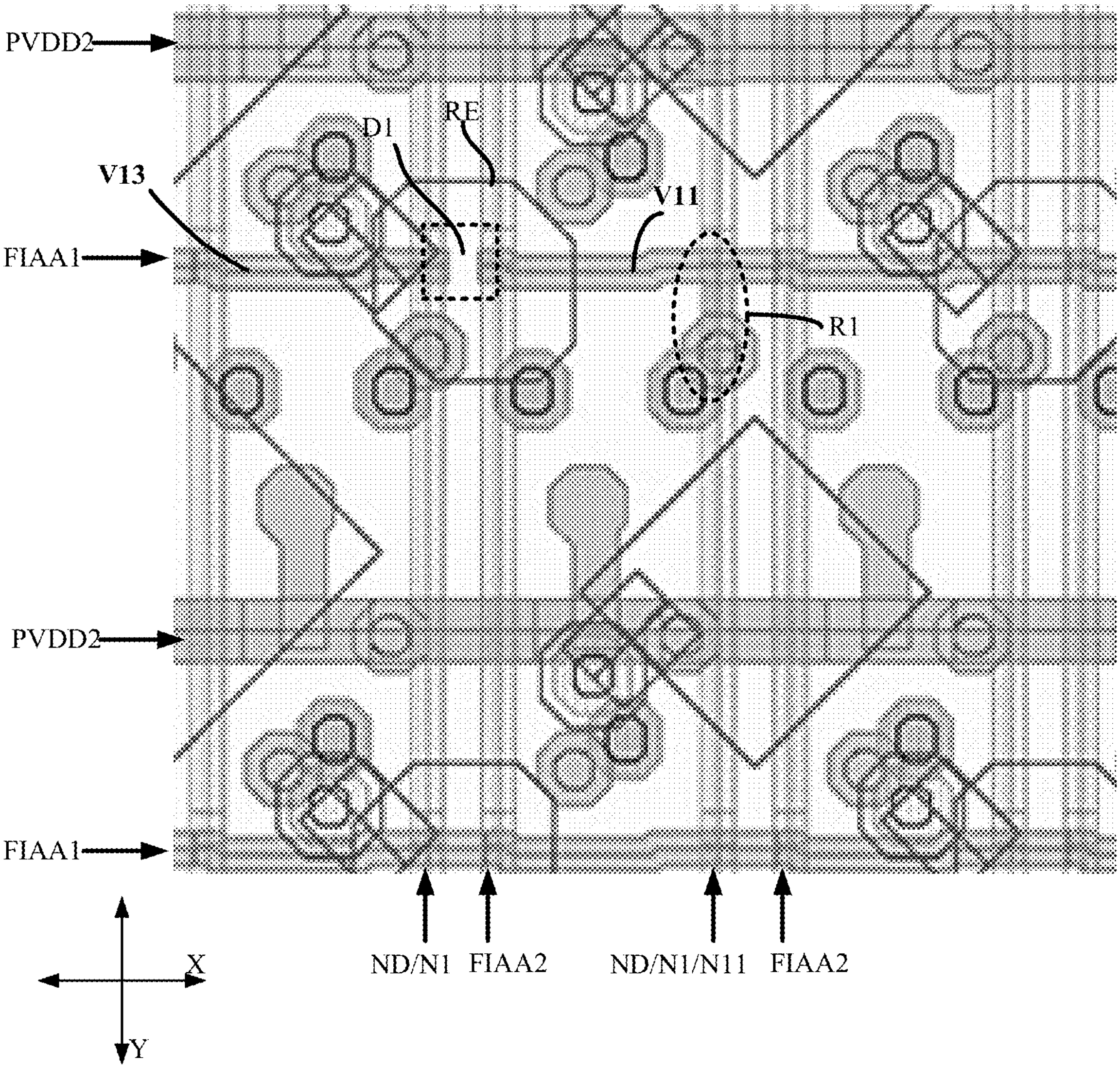
FIG. 23 is a schematic diagram showing a partial layout structure of a stack consisting of a metal layer M3, a metal layer M4, and a metal layer RE according to still yet another embodiment of the present disclosure.
Figure 24:
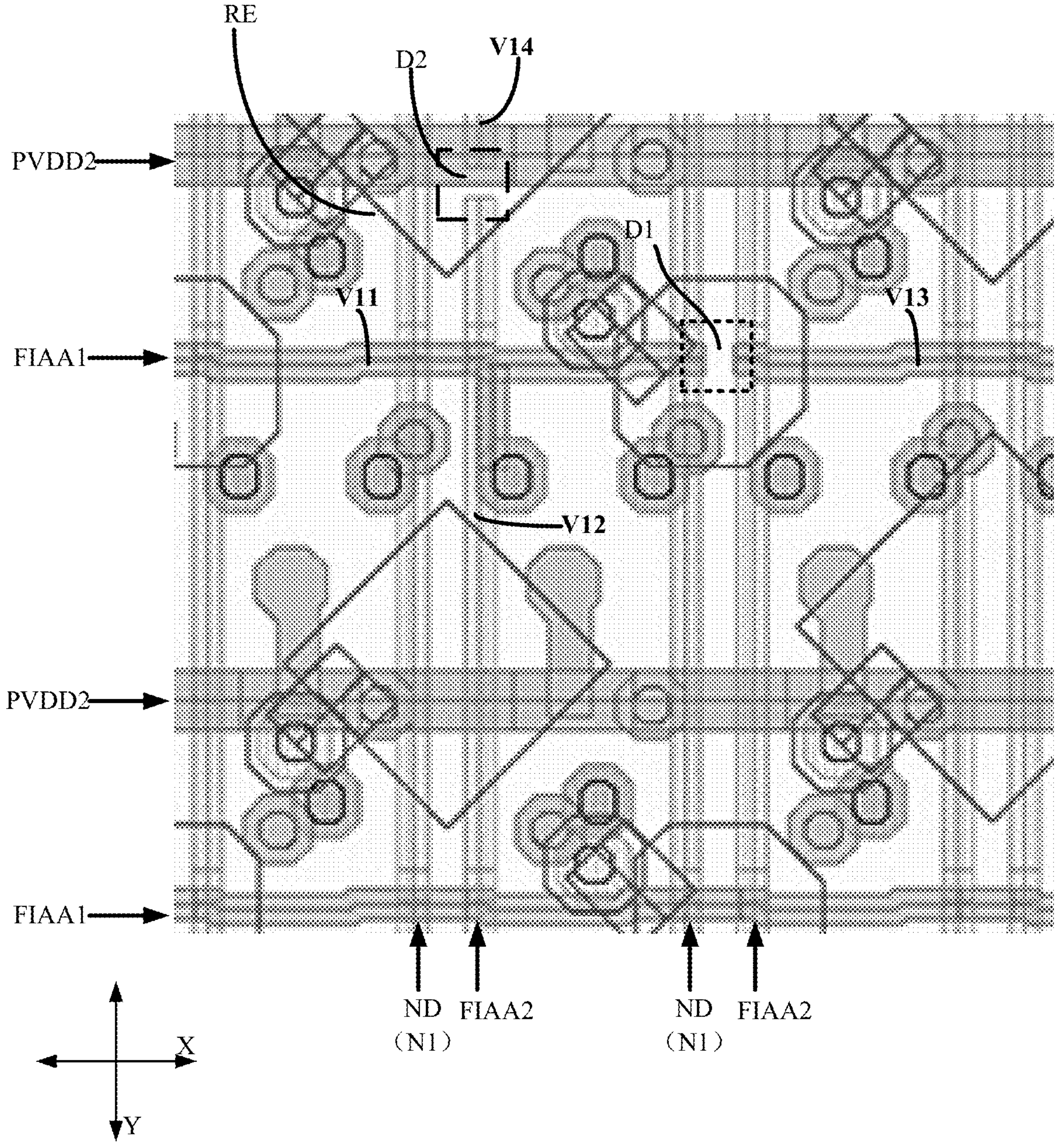
FIG. 24 is a schematic diagram showing a partial layout structure of a stack consisting of a metal layer M3, a metal layer M4 and a metal layer RE according to still yet another embodiment of the present disclosure.

In fact, in consideration of the uniformity of the etching and the uniformity of the reflection effect of the display panel, as shown in FIGS. 16 and 17E, the first connecting wing FIAA1 extending along the first direction X is provided between two adjacent rows of the pixel circuits 10 and, as shown in FIGS. 23 and 24, at least a part of the first connecting wiring FIAA1 includes the first connecting line segment V1, and the first connecting wiring FIAA1 is disposed in the metal layer M3.

In addition, as shown in FIGS. 16 and 17F, a second connecting wiring FIAA2 extending along the second direction Y is provided between two adjacent columns of pixel circuits 10, and as shown in FIGS. 23 and 24, at least a part of the second connecting wiring FIAA2 includes the second connecting wire segment V2, the second connecting wiring FIAA2 is disposed in the metal layer M4, and the first signal line N1 is also disposed in the metal layer M4.

In other embodiments of the present disclosure, In one embodiment, the first connecting wiring FIAA1 may be disposed in the metal layer M4, i.e. the first connecting line segment V1 may be disposed in the metal layer M4. In this case, the second connecting wiring FIAA2 and the first signal line N1 may be disposed in the metal layer M3, i.e. the second connecting line segment V2 may be disposed in the metal layer M3.

FIG. 23 illustrates a schematic diagram showing the layout structure of a dashed frame U1 in FIG. 22, specifically a schematic diagram showing the layout structure of a stack consisting of the metal layer M3, the metal layer M4 and the metal layer RE. It can be seen that, for one of the first signal lines N11 in the second display region AA2, the first signal line N11 is electrically connected to the first connecting wiring V11 that extends along the first direction X.

FIG. 24, illustrates a schematic diagram showing the layout structure of a dashed frame U2 in FIG. 22, specifically a schematic diagram showing the layout structure of a stack consisting of the metal layer M3, the metal layer M4, and the metal layer RE. It can be seen that the first connecting wiring V11 extending along the first direction X is electrically connected to the second connecting wiring V12 extending along the second direction Y, and is ultimately electrically connected to the fan-out wiring W1 in the first fan-out region FA.

In addition, as shown in FIG. 23, the first connecting line segment V11 includes, in addition to a main body portion extending along the first direction X, a protruding portion R1 extending along the second direction Y to be electrically connected through the protruding portion R1 to the first signal line N11 extending along the second direction Y In one embodiment, the protruding portion R1 is electrically connected to the first signal line N1 extending along the second direction Y through a via hole between the metal layer M3 and the metal layer M4.

As shown in FIG. 23, in the direction perpendicular to a plane in which the substrate sub is located, the first signal line N11 obscures the protruding portion R1, so that the display panel is uniform in appearance everywhere, and the reflection effect of the light is also more uniform, improving the display uniformity of the display panel.

It should be understood that the first connecting wiring FIAA1 extending along the first direction X is not used for transmitting data signals by the whole first connecting wiring FIAA1, but only the first connecting line segment V11 therein is used for transmitting data signals. Similarly, the second connecting wiring FIAA2 extending along the second direction Y is not used for transmitting data signals by the whole second connecting wiring FIAA2, but only the second connecting line segment V12 therein is used for transmitting data signals, and the second connecting line segment V12 is used for transmitting data signals. Therefore, as shown in FIGS. 22 and 23, the display panel further includes multiple first auxiliary line segments V13 extending along the first direction X and multiple second auxiliary line segments V14 extending along the second direction Y, the first auxiliary line segments V13 are disposed in the same layer as the first connecting line segments V11 and are insulated from the first connecting line segments V11 and the second connecting line segments V12, and the second auxiliary line segments V14 are disposed in the same layer as the second connecting line segments V12 and are insulated from the first connecting line segments V12 and the first connecting line segment V11.

That is, the first auxiliary line segment V13 in the first connecting wiring FIAA1 is not used for transmitting data signals, and the first auxiliary line segment V13 is disposed in the same layer as the first connecting line segment V11 and is insulated from the first connecting line segment V11 and the second connecting line segment V12.

Similarly, the second auxiliary line segment V14 in the second connecting wiring FIAA2 is not used for transmitting data signals, and the second auxiliary line segment V14 is disposed in the same layer as the second connecting line segment V12 and is insulated from the first connecting line segment V11 and the second connecting line segment V12.

As shown in FIGS. 22 and 23, a first gap D1 exists between the first auxiliary line segment V13 and the first connecting line segment V11, and a second gap D2 exists between the second auxiliary line segment V14 and the second connecting line segment V12.

In an embodiment of the present disclosure, as shown in FIG. 14, the light-emitting element 20 includes an anode RE, a light-emitting layer (not shown), and a cathode (not shown) arranged in a direction away from the substrate sub.

As shown in FIGS. 22 and 23, the anode RE covers the first gap D1 and the second gap D2 in the direction perpendicular to a plane where the substrate sub is located.

That is, the first gap D1 (i.e., the position of a broken line) in the first connecting wiring FIAA1 extending along the first direction X is obscured by the anode RE of the light-emitting element 20 in the direction perpendicular to a plane in which the substrate sub is located, and the second gap D2 (i.e., the position of a broken line) in the second connecting wiring FIAA2 extending along the second direction Y is also obscured by the anode RE of the light-emitting element 20 in the direction perpendicular to a plane in which the substrate sub is located. Since the metal can reflect light without transmitting light, the display panel is homogeneous in appearance and has a more uniform reflection effect on light, to avoid the phenomenon of uneven display of the visibility between the position of the broken line in the display panel and the other positions in the display panel in the dark state and in the display state, and improving the display uniformity of the display panel.

It should be noted that the anode RE covering the first gap D1 and the second gap D2 in a direction perpendicular to a plane in which the substrate sub is located means that the positive projection of the first gap D1 and the second gap D2 in the plane in which the substrate sub is located is located within the positive projection of the anode RE in the plane in which the substrate sub is located.

However, the first auxiliary line segment V13 in the first connecting wiring FIAA1 that is not used for transmitting data signals may further include the entire first connecting wiring FIAA1 that is not used for transmitting data signals, and similarly, the second auxiliary line segment V14 in the second connecting wiring FIAA2 that is not used for transmitting data signals may further include the entire second connecting wiring FIAA2 that is not used for transmitting data signals.

In an embodiment of the present disclosure, as shown in FIG. 15, the display panel further includes: multiple first supply voltage lines PVDD, disposed in the display region AA and extending along the second direction Y, and each of the first supply voltage lines PVDD is electrically connected to the light emitting element 20.

In one embodiment, the first supply voltage lines PVDD may be anode supply voltage lines, in the pixel circuit as shown in FIG. 18 or 21, the first supply voltage lines PVDD are electrically connected to an anode RE of the light-emitting element 20 to provide an anode supply voltage signal VPVDD.

Figure 25:
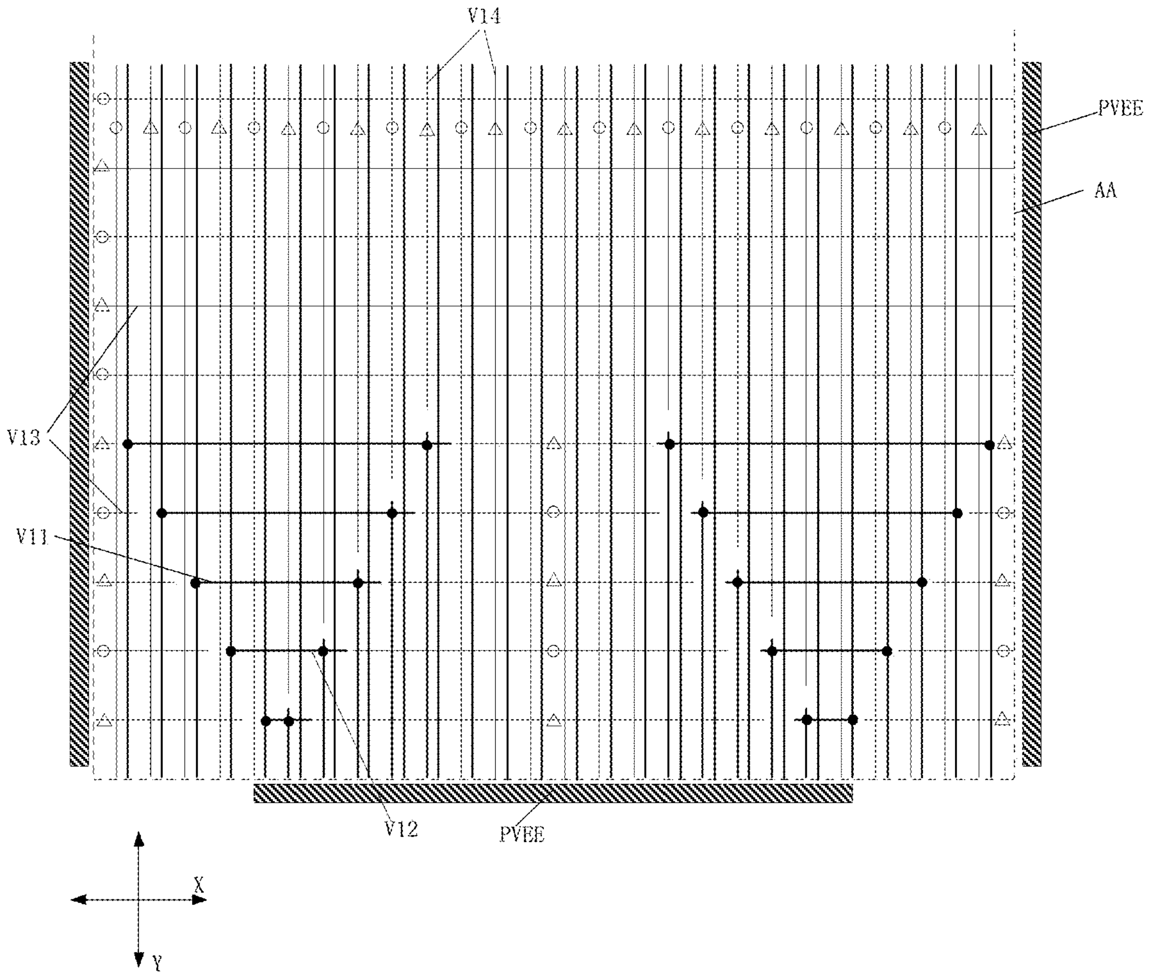
FIG. 25 is a schematic top view of a display panel according to yet another embodiment of the present disclosure.

As shown in FIG. 25, the display panel further includes: a second supply voltage line PVEE, which is disposed in the non-display region NA and at least partially surrounds the display region AA, and is electrically connected to the light emitting element 20.

In one embodiment, the second supply voltage line PVEE may be a cathode supply voltage line, in the pixel circuit as shown in FIG. 18 or 21, the second supply voltage line PVEE is electrically connected to a cathode of the light emitting element 20 to provide a cathode supply voltage signal VPVEE.

In an embodiment of the present disclosure, as shown in FIG. 25, in m first auxiliary line segments V13 arranged in the second direction Y, m1 first auxiliary line segments V13 are electrically connected to the first supply voltage line PVDD, and m2 first auxiliary line segments V13 are electrically connected to the second supply voltage line PVEE, where m, m1, and m2 are integers, $2 \leq m \leq 10$, $2 \leq m1+m2 \leq M$, and $1:95 \leq m1:m2 \leq 9:1$.

It should be noted that in FIG. 25, the line segments extending along the first direction X each is a first connecting wiring FIAA1, where the line segments not labelled with triangles and circles are the first connecting line segments V11, the line segments labelled with triangles are the first auxiliary line segments V13 and are represented as being electrically connected to the first supply voltage line PVDD, and the line segments labelled with circles are the first auxiliary line segments V13 and are represented as being electrically connected to the second supply voltage line PVEE.

In this case, the m first auxiliary line segments V13 arranged in the second direction Y may form a repeative unit that is repeatedly arranged in the second direction Y.

In one embodiment, m=10, then m1:m2 may be 1:9, 2:8, 3:7, 4:6, 5:5, 4:6, 3:7, 2:8, or 1:9, i.e., in the ten first auxiliary line segments V13 arranged in the second direction Y, there may be 1, 2, 3, 4, 5, 6, 7, 8, or 9 of the first auxiliary line segments V13 electrically connected to the first supply voltage line PVDD, and accordingly there may be 9, 8, 7, 6, 5, 4, 3, 2 or 1 of the first auxiliary line segments V13 electrically connected to the second supply voltage line PVEE.

In other embodiments of the present disclosure, In one embodiment, all of the first auxiliary line segments V13 arranged in the second direction Y may be electrically connected to the first supply voltage line PVDD, or electrically connected to the second supply voltage line PVEE, depending on the specific situations.

As can be seen, the multiple first auxiliary line segments V13 arranged in the second direction Y which are not used for transmitting data signals may be connected to the first supply voltage line PVDD and the second supply voltage line PVEE in a certain proportion (including all being connected to the first supply voltage line PVDD or all being connected to the second supply voltage line PVEE), so that the multiple first auxiliary line segments V13 are connected in parallel to the first supply voltage line PVDD and the second supply voltage line PVEE in a certain proportion, to form a first supply voltage line PVDD grid structure and a second supply voltage line PVEE grid structure, which facilitates reducing the voltage drop (IR Drop) on the first supply voltage line PVDD and the second supply voltage line PVEE, and achieving the object of improving the display uniformity of the display panel and reducing power consumption.

In an embodiment of the present disclosure, as shown in FIG. 25, in n second auxiliary line segments V14 arranged in the first direction X, n1 second auxiliary line segments V14 are electrically connected to the first supply voltage line PVDD, and n2 second auxiliary line segments V14 are electrically connected to the second supply voltage line PVEE, where n, n1, and n2 are positive integers, and 2≤n≤10, 2≤n1+n2≤N, and 1:9≤n1:n2≤9:1.

It should be noted that in FIG. 25, the line segments extending along the second direction Y are the data line ND and the second connecting wiring FIAA2 arranged In one embodiment, where the line segments not labelled with triangles and circles are the data line ND or the second connecting line segment V12; the line segments labelled with triangles are the second auxiliary line segment V14 and is represented as being electrically connected to the first supply voltage line PVDD; the line segments labelled with circles are the second auxiliary line segment V14 and is represented as being electrically connected to the second supply voltage line PVEE.

In addition, in FIG. 25, a black solid dot represents the point where the second connecting line segment V12 is electrically connected to the first connecting line segment V11 and the data line ND.

In this case, the n second auxiliary line segments V14 arranged in the first direction X may form a repeative unit that is repeatedly arranged in the first direction X.

In one embodiment, n=10, then n1:n2 may be 1:9, 2:8, 3:7, 4:6, 5:5, 4:6, 3:7, 2:8, or 1:9, i.e., in the ten first auxiliary line segments V13 arranged in the second direction Y, there may be 1, 2, 3, 4, 5, 6, 7, 8, or 9 of the first auxiliary line segments V13 electrically connected to the first supply voltage line PVDD, and accordingly there may be 9, 8, 7, 6, 5, 4, 3, 2 or 1 of the first auxiliary line segments V13 electrically connected to the second supply voltage line PVEE.

In other embodiments of the present disclosure, In one embodiment, all of the second auxiliary line segments V14 arranged in the first direction X may be all electrically connected to the first supply voltage line PVDD, or electrically connected to the second supply voltage line PVEE, depending on the specific situations.

As can be seen, the multiple second auxiliary line segments V14 arranged in the first direction X which are not used for transmitting data signals may be connected to the first supply voltage line PVDD and the second supply voltage line PVEE in a certain proportion (including all being connected to the first supply voltage line PVDD or all being connected to the second supply voltage line PVEE), so that the multiple second auxiliary line segments V14 are connected in parallel to the first supply voltage line PVDD and the second supply voltage line PVEE in a certain proportion, to form a first supply voltage line PVDD grid structure and a second supply voltage line PVEE grid structure, which facilitates reducing the voltage drop (IR Drop) on the first supply voltage line PVDD and the second supply voltage line PVEE and achieving the object of improving the display uniformity of the display panel and reducing power consumption.

In another embodiment of the present disclosure, as shown in FIG. 25, in m first auxiliary line segments V13 arranged in the second direction Y, m1 first auxiliary line segments V13 are electrically connected to the first supply voltage line PVDD, and m2 first auxiliary line segments V13 are electrically connected to the second supply voltage line PVEE, where m, m1, and m2 are integers, and 2≤m≤10, 2≤m1+m2≤M, and 1:9 m1:m2≤9:1.

In addition, in n second auxiliary line segments V14 arranged in the first direction X, n1 second auxiliary line segments V14 are electrically connected to the first supply voltage line PVDD, and n2 second auxiliary line segments V14 are electrically connected to the second supply voltage line PVEE, where n, n1, and n2 are positive integers, and 2≤n≤10, 2≤n1+n2≤N, 1:9≤n1:n2≤9:1.

In this case, the m first auxiliary line segments V13 arranged in the second direction Y may form a repeative unit arranged repeatedly in the second direction Y, and the n second auxiliary line segments V14 arranged in the first direction X may form a repeative unit arranged repeatedly in the first direction X.

In one embodiment, m=10, then m1:m2 may be 1:9, 2:8, 3:7, 4:6, 5:5, 4:6, 3:7, 2:8 or 1:9, i.e., in the ten first auxiliary line segments V13 arranged in the second direction Y, there may be 1, 2, 3, 4, 5, 6, 7, 8 or 9 first auxiliary line segments V13 electrically connected to the first supply voltage line PVDD, and accordingly there may be 9, 8, 7, 6, 5, 4, 3, 2 or 1 of the first auxiliary line segments V13 electrically connected to the second supply voltage line PVEE.

In one embodiment, n=10, then n1:n2 may be 1:9, 2:8, 3:7, 4:6, 5:5, 4:6, 3:7, 2:8 or 1:9, i.e., in the ten first auxiliary line segments V13 arranged in the second direction Y, there may be 1, 2, 3, 4, 5, 6, 7, 8 or 9 first auxiliary line segments V13 electrically connected to the first supply voltage line PVDD, and accordingly there may be 9, 8, 7, 6, 5, 4, 3, 2 or 1 of the first auxiliary line segments V13 electrically connected to the second supply voltage line PVEE.

In other embodiments of the present disclosure, all first auxiliary line segments V13 arranged in the second direction Y may be electrically connected to the first supply voltage line PVDD and all second auxiliary line segments V14 arranged in the first direction X may be electrically connected to the second supply voltage line PVEE. In one embodiment, all first auxiliary line segments V13 arranged in the second direction Y may be electrically connected to the second supply voltage line PVEE, and all second auxiliary line segments V14 arranged in the first direction X may be electrically connected to the first supply voltage line PVDD.

Of course, all of the first auxiliary line segments V13 and all of the second auxiliary line segments V14 may be electrically connected to the first supply voltage line PVDD, or may be electrically connected to the second supply voltage line PVEE, depending on the specific situations.

As can be seen, the multiple first auxiliary line segments V13 arranged in the second direction Y which are not used for transmitting the data signals and the multiple second auxiliary line segments V14 arranged in the first direction X which are not used for transmitting data signals may be connected to the first supply voltage line PVDD and the second supply voltage line PVEE in a certain proportion (including all being connected to the first supply voltage line PVDD or all being connected to the second supply voltage line PVEE), so that the multiple second auxiliary line segments V14 are connected in parallel to the first supply voltage line PVDD and the second supply voltage line PVEE in a certain proportion to form a first supply voltage line PVDD grid structure and a second supply voltage line PVEE grid structure, which facilitates reducing the voltage drop (IR) on the first supply voltage line PVDD and the second supply voltage line PVEE and achieving the object of improving the display uniformity of the display panel and reducing power consumption.

Figure 26:
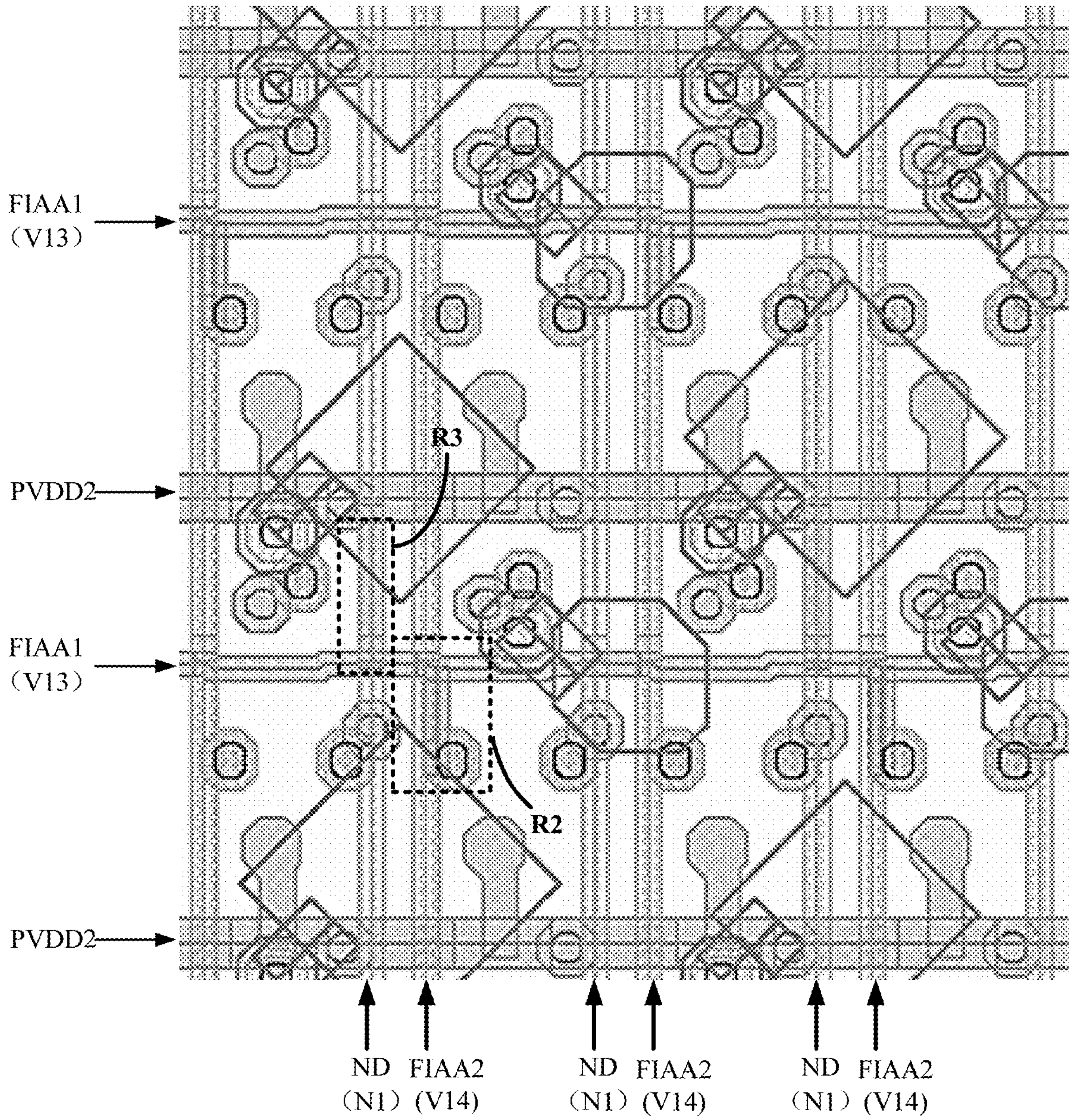
FIG. 26 is a schematic diagram showing a partial layout structure of a stack consisting of a metal layer M3, a metal layer M4 and a metal layer RE according to still yet another embodiment of the present disclosure.

It should be noted that, as shown in FIG. 26, the first auxiliary line segment V13 may further include, in addition to a main body portion extending along the first direction X, a protruding portion R2 extending along the second direction Y to be electrically connected through the protruding portion R2 to the second auxiliary line segment V14 extending along the second direction Y In one embodiment, the protruding portion R2 is electrically connected to the second auxiliary line segment V14 extending along the second direction Y through a via hole between the metal layer M3 and the metal layer M4.

As shown in FIG. 26, the second auxiliary line segment V14 obscures the protruding portion R2 in the direction perpendicular to a plane in which the substrate sub is located, so that the display panel is uniform in appearance everywhere, and the reflection effect of the light is also more uniform, and to improve the display uniformity of the display panel.

It should be noted that the first auxiliary line segment V13, the second auxiliary line segment V14 and the first supply voltage line PVDD are electrically connected in the display region AA, and the first auxiliary line segment V13, the second auxiliary line segment V14 and the second supply voltage line PVEE are electrically connected in the non-display region NA.

In an embodiment of the present disclosure, as shown in FIGS. 15, 16, 17*d* and 17*f*, the display panel further includes: multiple first supply voltage lines PVDD, each of which is disposed in the display region AA, extends along the second direction Y, and is electrically connected to the light emitting element 20; and multiple supply voltage auxiliary lines PVDD2 extending along the first direction X.

The multiple supply voltage auxiliary lines PVDD2 are disposed in the same layer as the first connecting line segments V11 and in a different layer from first supply voltage lines PVDD.

The multiple supply voltage auxiliary lines PVDD2 are electrically connected to the multiple first supply voltage lines PVDD.

The first supply voltage lines PVDD may be disposed in the metal layer M2, as shown in FIGS. 15 and 17D.

As shown in FIGS. 16 and 17E, the first connecting wiring FIAA1 may be disposed in the metal layer M3, i.e., the first connecting line segment V11 may be disposed in the metal layer M3, and the supply voltage auxiliary line PVDD2 is disposed in the same layer as the first connecting line segment V11, i.e., the supply voltage auxiliary line PVDD2 may be disposed in the metal layer M3.

In one embodiment, as shown in FIGS. 17D and 17E, the supply voltage auxiliary line PVDD2 is connected to the first supply voltage line PVDD in an electrical connection point manner through a connection point I1 in the metal layer M3 and a connection point 12 in the metal layer M2.

In this case, the first supply voltage line PVDD and the auxiliary supply voltage line PVDD2 disposed in different layers form a grid structure, to facilitate the reduction of the voltage drop (IR Drop) on the first supply voltage line PVDD, and achieving the object of improving the display uniformity of the display panel and reducing power consumption.

It should be noted that, as shown in FIG. 26, the first auxiliary line segment V13 may include, in addition to a main body portion extending along the first direction X, an extension portion R3 extending along the second direction Y, and to be electrically connected to the auxiliary supply voltage line PVDD2 disposed in the same layer in the display region AA, and thus be electrically connected to the first supply voltage line PVDD disposed in a different layer.

The second auxiliary line segment V14 may first be electrically connected to the first auxiliary line segment V13 through the protruding portion R2 extending along the second direction Y of the first auxiliary line segment V13, and then may be electrically connected to the auxiliary supply voltage line PVDD2 disposed in the same layer in the display region AA through the extension portion R3 extending along the second direction Y of the first auxiliary line segment V13, and thus is electrically connected to the first supply voltage line PVDD disposed in a different layer.

In an embodiment of the present disclosure, as shown in FIGS. 16 and 17*e*, the auxiliary supply voltage line PVDD2 includes a protruding portion R4 extending along the second direction Y.

As shown in FIGS. 15, 17A, 17B, and 17D, the second electrode p522 of the fifth transistor T5 is electrically connected to the gate g2 of the second transistor T2 through a second connecting portion (i.e., the aforementioned connecting structure K7).

The second connecting portion K7 is disposed on one side, away from the substrate sub, of the active layer poly, and the protruding portion R4 is disposed on one side, away from the substrate sub, of the second connecting portion K7.

The protruding portion R4 is at least partially overlapped with the second connecting portion K7 in a direction perpendicular to a plane in which the substrate sub is located.

In one embodiment, as shown in FIGS. 17D and 17E, the positive projection of the second connecting portion K7 in the plane in which the substrate sub is located is located within the positive projection of the protruding portion R3 in the plane in which the substrate sub is located.

As shown in FIGS. 17D and 17E, the second connecting portion K7 may be disposed in the metal layer M2, the protruding portion R3 may be disposed in the metal layer M3, and the protruding portion R3 is electrically connected to the auxiliary supply voltage line PVDD2 in the same layer, which in turn is electrically connected to the first supply voltage line PVDD disposed in the metal layer M2. That is, the protruding portion R3 is connected to a fixed potential signal VPVDD.

It should be noted that, as shown in FIG. 14, the light-emitting element 20 includes an anode RE, a light-emitting layer (not shown), and a cathode (not shown) disposed in a direction away from the substrate sub.

As shown in FIGS. 15, 16, 17B, and 17D, the second connecting portion K7 is electrically connected to the gate g2 of the second transistor T2, and as shown in the pixel circuit of FIG. 21, the gate of the second transistor T2 is the fourth node F4, i.e., the second connecting portion K7 is equipotential to the fourth node F4.

As shown in FIGS. 15, 16, 17D, 17E, and 17G, the protruding portion R4 is disposed between the second connecting portion K7 and the anode RE in the direction perpendicular to the plane where the substrate sub is located, and to avoid the interference of the change in the potential of the anode RE on the fourth node F4, to maintain the stability of the potential of the fourth node F4, i.e., to maintain the stability of the gate potential of the second transistor T2, and to improve the display effect.

Figure 27:
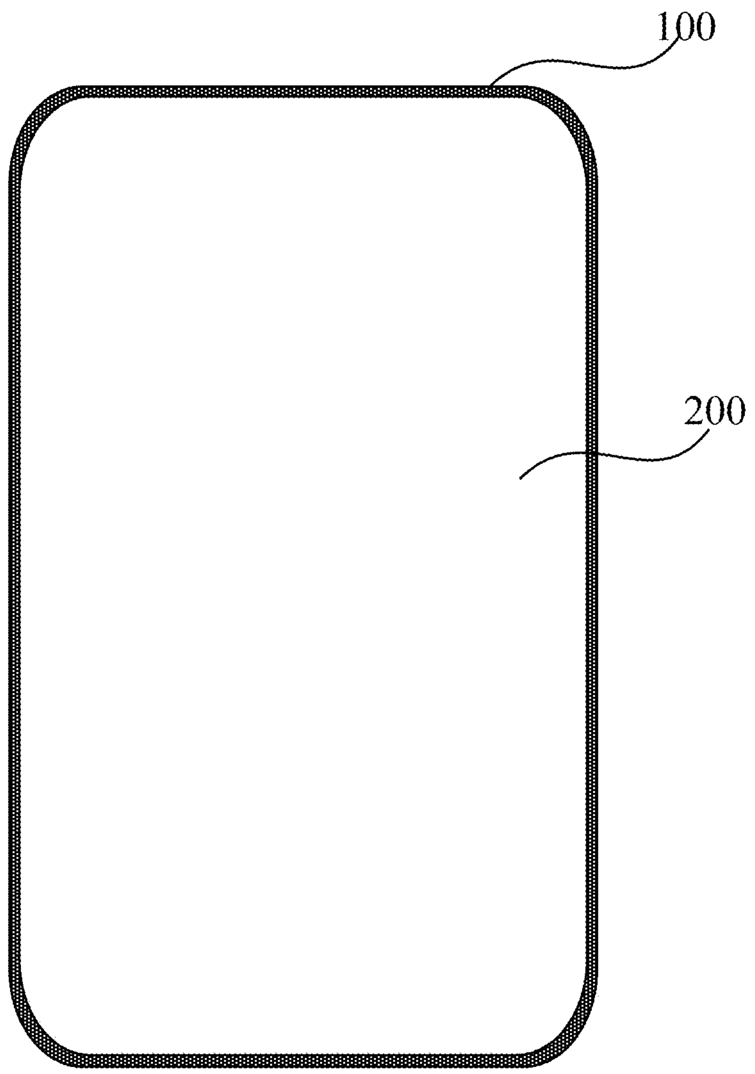
FIG. 27 is a schematic top view of a display device according to an embodiment of the present disclosure.

A display device is further provided according to an embodiment of the present disclosure, as shown in FIG. 27, the display device 100 includes the display panel 200 according to any one of the above embodiments. Since the display panel 200 has been described in detail in the foregoing embodiments, it will not be repeated herein.

The display device 100 may be, for example, any electronic device having a display function such as a touch screen, a mobile phone, a tablet computer, a laptop computer, an e-paper book or a television.

The various parts of this specification are described in a combination of juxtaposition and progression, with each part focusing on the differences from the other parts, and the same and similar parts of the various parts may be referred to each other.

The invention claimed is:

1. A display panel, comprising:

a substrate;

an active layer, disposed on one side of the substrate; and a plurality of sub-pixels, a plurality of first scanning lines and a plurality of first signal lines, each of the plurality of first scanning lines extending along a first direction, each of the plurality of first signal lines extending along a second direction, and the first direction and the second direction intersecting with each other;

wherein each of the plurality of sub-pixels comprises a pixel circuit and a light emitting element, the pixel circuit comprises a first transistor and a second transistor, a gate of the first transistor is electrically connected to a corresponding first scanning line, a first electrode of the first transistor is electrically connected to a corresponding first signal line, a second electrode of the first transistor is electrically connected to a first electrode of the second transistor through a first connecting portion, and a second electrode of the second transistor is electrically connected to the light emitting element; and wherein the first connecting portion is disposed on one side of the active layer away from the substrate;

wherein the display panel further comprises a plurality of second scanning lines, a plurality of first reference voltage lines, and a plurality of second reference voltage lines;

wherein the plurality of second scanning lines, the plurality of first reference voltage lines, and the plurality of second reference voltage lines each extends along the first direction;

wherein the pixel circuit further comprises a fifth transistor, a gate of the fifth transistor is electrically connected to a corresponding second scanning line, a first electrode of the fifth transistor is electrically connected to a corresponding first reference voltage line, and a second electrode of the fifth transistor is electrically connected to a gate of the second transistor;

wherein the pixel circuit further comprises a sixth transistor, a gate of the sixth transistor is electrically connected to a corresponding first scanning line, a first electrode of the sixth transistor is electrically connected to a corresponding second reference voltage line, and a second electrode of the sixth transistor is electrically connected to the light emitting element;

wherein the display panel further comprises a plurality of third reference voltage lines and a plurality of fourth reference voltage lines;

wherein the plurality of third reference voltage lines and the plurality of fourth reference voltage lines each extends along the second direction; and wherein each of the plurality of third reference voltage lines is electrically connected to a corresponding first reference voltage line, and each of the plurality of fourth reference voltage lines is electrically connected to a corresponding second reference voltage line (emphasis added).

2. The display panel according to claim 1, further comprising:

a plurality of light-emitting control lines extending along the first direction;

a plurality of first supply voltage lines extending along the second direction;

wherein the pixel circuit further comprises a third transistor and a fourth transistor, a first electrode of the third transistor is electrically connected to a corresponding first supply voltage line, a second electrode of the third transistor is electrically connected to the first electrode of the second transistor, a first electrode of the fourth transistor is electrically connected to the second electrode of the second transistor, a second electrode of the fourth transistor is electrically connected to the light emitting element, and a gate of the third transistor and a gate of the fourth transistor each is electrically connected to a corresponding light-emitting control line among the plurality of light-emitting control lines; and wherein the first connecting portion is at least partially overlapped with the plurality of light-emitting control lines in a direction perpendicular to a plane in which the substrate is located.

3. The display panel according to claim 2, wherein the plurality of light-emitting control lines are disposed in a first metal layer, the first connecting portion is disposed in a second metal layer, and the second metal layer is disposed on one side of the first metal layer away from the substrate.

4. The display panel according to claim 1, further comprising:

a plurality of second scanning lines and a plurality of reference voltage lines, wherein each of the plurality of second scanning lines extends along the first direction, and each of the plurality of reference voltage lines extends along the first direction;

wherein the pixel circuit further comprises a fifth transistor, a gate of the fifth transistor is electrically connected to a corresponding second scanning line, a first electrode of the fifth transistor is electrically connected to a corresponding reference voltage line, and a second electrode of the fifth transistor is electrically connected to a gate of the second transistor; and wherein the pixel circuit further comprises a sixth transistor, a gate of the sixth transistor is electrically connected to a corresponding first scanning line, a first electrode of the sixth transistor is electrically connected to a corresponding reference voltage line, and a second electrode of the sixth transistor is electrically connected to the light emitting element.

5. The display panel according to claim 4, wherein the fifth transistor comprises a first sub-transistor and a second sub-transistor;

wherein a first electrode of the first sub-transistor is the first electrode of the fifth transistor, a second electrode of the first sub-transistor is electrically connected to a first electrode of the second sub-transistor, and a second electrode of the second sub-transistor is the second electrode of the fifth transistor;

wherein the active layer comprises a first sub-channel region, a second sub-channel region and a first sub-connecting region, and the first sub-channel region and the second sub-channel region are connected by the first sub-connecting region; and wherein in a direction perpendicular to a plane in which the substrate is located, the first sub-channel region is at least partially overlapped with a gate of the first sub-transistor, the second sub-channel region is at least partially overlapped with a gate of the second sub-transistor, and the first sub-connecting region is at least partially overlapped with the plurality of reference voltage lines.

6. The display panel according to claim 1, wherein the fifth transistor comprises a first sub-transistor and a second sub-transistor;

wherein a first electrode of the first sub-transistor is the first electrode of the fifth transistor, a second electrode of the first sub-transistor is electrically connected to a first electrode of the second sub-transistor, and a second electrode of the second sub-transistor is the second electrode of the fifth transistor;

wherein the active layer comprises a first sub-channel region, a second sub-channel region and a first sub-connecting region, and the first sub-channel region and the second sub-channel region are connected through the first sub-connecting region; and wherein in a direction perpendicular to a plane in which the substrate is located, the first sub-channel region is at least partially overlapped with a gate of the first sub-transistor, the second sub-channel region is at least partially overlapped with a gate of the second sub-transistor, and the first sub-connecting region is at least partially overlapped with the plurality of second reference voltage lines.

7. The display panel according to claim 1, further comprising:

a plurality of second scanning lines and a plurality of reference voltage lines;

wherein each of the plurality of second scanning lines extends along the first direction, and each of the plurality of reference voltage lines extends along the second direction;

wherein the pixel circuit further comprises a fifth transistor, a gate of the fifth transistor is electrically connected to a corresponding second scanning line, a first electrode of the fifth transistor is electrically connected to a corresponding reference voltage line, and a second electrode of the fifth transistor is electrically connected to a gate of the second transistor; and wherein the pixel circuit further comprises a sixth transistor, a gate of the sixth transistor is electrically connected to a corresponding first scanning line, a first electrode of the sixth transistor is electrically connected to a corresponding reference voltage line, and a second electrode of the sixth transistor is electrically connected to the light emitting element.

8. The display panel according to claim 7, wherein the fifth transistor comprises a first sub-transistor and a second sub-transistor;

wherein a first electrode of the first sub-transistor is the first electrode of the fifth transistor, a second electrode of the first sub-transistor is electrically connected to a first electrode of the second sub-transistor, and a second electrode of the second sub-transistor is the second electrode of the fifth transistor;

wherein the active layer comprises a first sub-channel region, a second sub-channel region and a first sub-connecting region, and the first sub-channel region and the second sub-channel region are connected by the first sub-connecting region;

wherein the pixel circuit further comprises a first shielding layer; and wherein in a direction perpendicular to a plane in which the substrate is located, the first sub-channel region is at least partially overlapped with a gate of the first sub-transistor, the second sub-channel region is at least partially overlapped with a gate of the second sub-transistor, and the first sub-connecting region is at least partially overlapped with the first shielding layer.

9. The display panel according to claim 8, wherein the first shielding layer is electrically connected to a corresponding reference voltage line; or a plurality of first supply voltage lines extends along the second direction, and the first shielding layer is electrically connected to a corresponding first supply voltage line.

10. The display panel according to claim 1, wherein a plurality of pixel circuits are arranged in an array along the first direction and the second direction, and a column of pixel circuits is electrically connected to at least one of the plurality of first signal lines;

wherein the display panel further comprises a display region and a non-display region at least partially surrounding the display region;

wherein the non-display region comprises a first fan-out region disposed on one side of the display region in the second direction, and the first fan-out region comprises a plurality of fan-out wirings;

wherein the display region comprises a first display region and a second display region, the second display region is disposed on at least one side of the first display region in the first direction, the first display region and the second display region each comprises a plurality of first signal lines, the plurality of first signal lines are electrically connected to the plurality of fan-out wirings, and the plurality of first signal lines in the second display region are electrically connected to the plurality of fan-out wirings through connecting wirings;

wherein the connecting wirings are disposed in the display region and each comprises a first connecting line segment extending along the first direction and a second connecting line segment extending along the second direction, the second connecting line segment is electrically connected to a corresponding fan-out wiring, and the first connecting line segment is electrically connected to a corresponding first signal line in the second display region.

11. The display panel according to claim 10, further comprising:

a plurality of first auxiliary line segments extending along the first direction and a plurality of second auxiliary line segments extending along the second direction;

wherein the plurality of first auxiliary line segments are disposed in a same layer as the first connecting line segment and are insulated from the first connecting line segment and the second connecting line segment, and the plurality of second auxiliary line segments are disposed in a same layer as the second connecting line segment and are insulated from the second connecting line segment and the first connecting line segment.

12. The display panel according to claim 11, wherein the light emitting element comprises an anode, a light emitting layer and a cathode arranged in a direction away from the substrate;

wherein a first gap exists between a corresponding first auxiliary line segment and a corresponding first connecting line segment, and a second gap exists between a corresponding second auxiliary line segment and a corresponding second connecting line segment; and wherein the anode covers the first gap and the second gap in a direction perpendicular to a plane in which the substrate is located.

13. The display panel according to claim 11, further comprising:

a plurality of first supply voltage lines, each of the plurality of first supply voltage lines being disposed in the display region and extending along the second direction, and the plurality of first supply voltage lines being electrically connected to the light emitting element; and a second supply voltage line being disposed in the non-display region and at least partially surrounding the display region, and the second supply voltage line being electrically connected to a light-emitting element;

wherein in m first auxiliary line segments arranged in the second direction, m1 first auxiliary line segments are electrically connected to a corresponding first supply voltage line, m2 first auxiliary line segments are electrically connected to the second supply voltage line, wherein m, m1, and m2 are integers, $2 \le m \le 10$, $2 \le m1+m2 \le m$, and $1{:}9 \le m1{:}m2 \le 9{:}1$; and/or in n second auxiliary line segments arranged in the first direction, n1 second auxiliary line segments are electrically connected to a corresponding first supply voltage line, and n2 second auxiliary line segments are electrically connected to the second supply voltage line, wherein n, n1, and n2 are positive integers, $2 \le n \le 10$, $2 \le n1+n2 \le N$, and $1{:}9 \le n1{:}n2 \le 9{:}1$.

14. The display panel according to claim 10, further comprising:

a plurality of first supply voltage lines, each of the plurality of first supply voltage lines being disposed in the display region and extending along the second direction, and the plurality of first supply voltage lines being electrically connected to the light emitting element; and a plurality of supply voltage auxiliary lines extending along the first direction;

wherein the plurality of supply voltage auxiliary lines are disposed in a same layer as the first connecting line segment and in a different layer from the plurality of first supply voltage lines; and wherein the plurality of supply voltage auxiliary lines are electrically connected to the plurality of first supply voltage lines.

15. The display panel according to claim 14, wherein each of the supply voltage auxiliary lines comprises a protrusion portion extending along the second direction;

a second electrode of a fifth transistor is electrically connected to a gate of the second transistor through a second connecting portion;

the second connecting portion is disposed on one side of the active layer away from the substrate, and the protrusion portion is disposed on one side of the second connecting portion away from the substrate; and the protrusion portion is at least partially overlapped with the second connecting portion in a direction perpendicular to a plane in which the substrate is located.

16. The display panel according to claim 1, further comprising:

a plurality of third scanning lines extending along the first direction;

wherein the pixel circuit further comprises a seventh transistor, a gate of the seventh transistor is electrically connected to a corresponding third scanning line, a first electrode of the seventh transistor is electrically connected to the second electrode of the second transistor, and a second electrode of the seventh transistor is electrically connected to a gate of the second transistor.

17. The display panel according to claim 16, wherein the seventh transistor comprises a third sub-transistor and a fourth sub-transistor;

wherein a first electrode of the third sub-transistor is the first electrode of the seventh transistor, a second electrode of the third sub-transistor is electrically connected to a first electrode of the fourth sub-transistor, and a second electrode of the fourth sub-transistor is the second electrode of the seventh transistor;

wherein the active layer comprises a third sub-channel region, a fourth sub-channel region and a second sub-connecting region, and the third sub-channel region and the fourth sub-channel region are connected through the second sub-connecting region;

wherein the pixel circuit further comprising a second shielding layer;

wherein in a direction perpendicular to a plane in which the substrate is located, the third sub-channel region is at least partially overlapped with a gate of the third sub-transistor, the fourth sub-channel region is at least partially overlapped with a gate of the fourth sub-transistor, and the second sub-connecting region is at least partially overlapped with the second shielding layer.

18. A display device, comprising a display panel, wherein the display panel comprises:

a substrate;

an active layer, disposed on one side of the substrate; and a plurality of sub-pixels, a plurality of first scanning lines and a plurality of first signal lines, each of the plurality of first scanning lines extending along a first direction, each of the plurality of first signal lines extending along a second direction, and the first direction and the second direction intersecting with each other;

wherein each of the plurality of sub-pixels comprises a pixel circuit and a light emitting element, the pixel circuit comprises a first transistor and a second transistor, a gate of the first transistor is electrically connected to a corresponding first scanning line, a first electrode of the first transistor is electrically connected to a corresponding first signal line, a second electrode of the first transistor is electrically connected to a first electrode of the second transistor through a first connecting portion, and a second electrode of the second transistor is electrically connected to the light emitting element; and wherein the first connecting portion is disposed on one side of the active layer away from the substrate;

wherein the display panel further comprises a plurality of second scanning lines, a plurality of first reference voltage lines, and a plurality of second reference voltage lines;

wherein the plurality of second scanning lines, the plurality of first reference voltage lines, and the plurality of second reference voltage lines each extends along the first direction;

wherein the pixel circuit further comprises a fifth transistor, a gate of the fifth transistor is electrically connected to a corresponding second scanning line, a first electrode of the fifth transistor is electrically connected to a corresponding first reference voltage line, and a second electrode of the fifth transistor is electrically connected to a gate of the second transistor;

wherein the pixel circuit further comprises a sixth transistor, a gate of the sixth transistor is electrically connected to a corresponding first scanning line, a first electrode of the sixth transistor is electrically connected to a corresponding second reference voltage line, and a second electrode of the sixth transistor is electrically connected to the light emitting element;

wherein the display panel further comprises a plurality of third reference voltage lines and a plurality of fourth reference voltage lines;

wherein the plurality of third reference voltage lines and the plurality of fourth reference voltage lines each extends along the second direction; and wherein each of the plurality of third reference voltage lines is electrically connected to a corresponding first reference voltage line, and each of the plurality of fourth reference voltage lines is electrically connected to a corresponding second reference voltage line (emphasis added).

19. A display panel, comprising:

a substrate;

an active layer, disposed on one side of the substrate; and a plurality of sub-pixels, a plurality of first scanning lines and a plurality of first signal lines, each of the plurality of first scanning lines extending along a first direction, each of the plurality of first signal lines extending along a second direction, and the first direction and the second direction intersecting with each other;

wherein each of the plurality of sub-pixels comprises a pixel circuit and a light emitting element, the pixel circuit comprises a first transistor and a second transistor, a gate of the first transistor is electrically connected to a corresponding first scanning line, a first electrode of the first transistor is electrically connected to a corresponding first signal line, a second electrode of the first transistor is electrically connected to a first electrode of the second transistor through a first connecting portion, and a second electrode of the second transistor is electrically connected to the light emitting element; and wherein the first connecting portion is disposed on one side of the active layer away from the substrate;

wherein a plurality of pixel circuits are arranged in an array along the first direction and the second direction, and a column of pixel circuits is electrically connected to at least one of the plurality of first signal lines;

wherein the display panel further comprises a display region and a non-display region at least partially surrounding the display region;

wherein the non-display region comprises a first fan-out region disposed on one side of the display region in the second direction, and the first fan-out region comprises a plurality of fan-out wirings;

wherein the display region comprises a first display region and a second display region, the second display region is disposed on at least one side of the first display region in the first direction, the first display region and the second display region each comprises a plurality of first signal lines, the plurality of first signal lines are electrically connected to the plurality of fan-out wirings, and the plurality of first signal lines in the second display region are electrically connected to the plurality of fan-out wirings through connecting wirings;

wherein the connecting wirings are disposed in the display region and each comprises a first connecting line segment extending along the first direction and a second connecting line segment extending along the second direction, the second connecting line segment is electrically connected to a corresponding fan-out wiring, and the first connecting line segment is electrically connected to a corresponding first signal line in the second display region;

wherein the display panel further comprises a plurality of first auxiliary line segments extending along the first direction and a plurality of second auxiliary line segments extending along the second direction; and wherein the plurality of first auxiliary line segments are disposed in a same layer as the first connecting line segment and are insulated from the first connecting line segment and the second connecting line segment, and the plurality of second auxiliary line segments are disposed in a same layer as the second connecting line segment and are insulated from the second connecting line segment and the first connecting line segment.

* * * * *